United States Patent [19]
Norman et al.

[11] Patent Number: 5,974,499
[45] Date of Patent: Oct. 26, 1999

[54] MEMORY SYSTEM HAVING READ MODIFY WRITE FUNCTION AND METHOD

[75] Inventors: Robert D. Norman, San Jose; Vinod C. Lakhani, Milpitas, both of Calif.

[73] Assignee: Micron Technology, Inc., Boise, Id.

[21] Appl. No.: 08/844,980

[22] Filed: Apr. 23, 1997

[51] Int. Cl.⁶ .................................................. G11C 16/06
[52] U.S. Cl. ............................................................. 711/103
[58] Field of Search ........................ 365/185.22, 185.29, 365/185.3, 185.07, 185.33; 711/103; 712/37

[56] References Cited

U.S. PATENT DOCUMENTS

| | | | |
|---|---|---|---|
| 5,222,046 | 6/1993 | Kreifels et al. | 365/185.22 |
| 5,287,317 | 2/1994 | Kobayashi et al. | 365/218 |
| 5,361,343 | 11/1994 | Kosonocky et al. | 365/185.11 |
| 5,574,684 | 11/1996 | Tomoeda | 365/185.04 |
| 5,687,117 | 11/1997 | Chevallier et al. | 365/185.12 |
| 5,687,345 | 11/1997 | Matsubara et al. | 711/103 |
| 5,687,352 | 11/1997 | Beat | 711/154 |

*Primary Examiner*—Eddie P. Chan
*Assistant Examiner*—Gary J. Portka
*Attorney, Agent, or Firm*—Schwegman, Lundberg, Woessner & Kluth P.A.

[57] ABSTRACT

A non-volatile memory system having an array of memory cells, a memory controller and a memory operations manager, with the array and memory operations manager typically being implemented in a common integrated circuit separate from an integrated circuit containing the memory controller. The memory operation manager carries out memory read, erase, program and program verify operations in response to receipt of memory read, erase, program and program verify commands, respectively, issued by the memory controller. The program verify operation includes reading an address to be verified and programming the address to be verified with data in the event the address had not been properly programmed. The program verify command obviates the necessity of issuing multiple commands in order to carry out the verify function.

80 Claims, 38 Drawing Sheets

| SELECT LOGIC | | | | | | | | | | |
|---|---|---|---|---|---|---|---|---|---|---|
| INPUTS | | | | | | | OUTPUTS (LATCHES) | | | |
| TAG BUS (Hex) | DATA BUS | LOW VCC ($\overline{LVCC}$) | LOCK OUT (LOUT) | DEV SEL (DSEL) | SLEEP (SLP) | MATCH | LOCK OUT (LOUT) | DEV SEL (DSEL) | SLEEP (SLP) | ADD ID LATCH |
| 01H | D0 = 1 | 1 | X | X | X | X | RESET | RESET | RESET | RESET |
| 0FH | D0 = 1 | 1 | X | 1 | X | X | RESET | RESET | RESET | RESET |
| X | X | 0 | X | X | X | X | RESET | RESET | RESET | RESET |
| 08H | DEV ADD | 1 | 0 | X | X | X | SET | PREV | PREV | LOAD |
| 01H | D1 = 1 | 1 | 1 | X | X | X | PREV | PREV | SET | PREV |
| 0FH | D1 = 1 | 1 | 1 | 1 | X | X | PREV | PREV | SET | PREV |
| 01H | D3 = 1 | 1 | X | X | X | X | PREV | RESET | PREV | PREV |
| 01H | D2 = 1 | 1 | 1 | 1 | X | X | PREV | PREV | RESET | PREV |
| 0FH | D2 = 1 | 1 | 1 | 1 | X | X | PREV | PREV | RESET | PREV |
| 02H | D7 = 1 | 1 | 1 | 1 | 0 | 1 | PREV | SET | PREV | PREV |
| 02H | D7 = 0 | 1 | 1 | 1 | 0 | 1 | PREV | RESET | PREV | PREV |

FIG. 6

| ENABLE & SELECT OUT LOGIC | | | | | | | |
|---|---|---|---|---|---|---|---|
| INPUTS | | | | | OUTPUTS | | |
| LOW Vcc (LVCC) | Lock Out (LOUT) | Dev Sel (DSEL) | Sleep (SLP) | Input Enable (IEN) | Sel Out (SOUT) | Decoder Enable (DEN) | |
| 0 | x | x | x | Sel In | 0 | 0 | |
| 1 | 0 | x | x | Sel In | 0 | Sel In | |
| 1 | 1 | 0 | 0 | Sel In | Sel In | 0 | |
| 1 | 1 | 0 | 1 | Sel In | Sel In | 0 | |
| 1 | 1 | 1 | 0 | 1 | Sel In | 1 | |
| 1 | 1 | 1 | 1 | Sel In | Sel In | 0 | |

FIG. 7

| INPUTS | | | | DECODER OUTPUTS | | | | | | | | | | | | | COMMENTS |
|---|---|---|---|---|---|---|---|---|---|---|---|---|---|---|---|---|---|
| TAG BUS (Hex) | DATA BUS | LOCK OUT Sleep | DEV SEL Decoder Enable | BAI BAL | BLAL PAI | PAL SAL | CLRADD SREG | CCR RCR | WREG RDR | WDR SAL | Out/In $\overline{LVCC}$ | | | | | | |
| xxH | xxxxxxxx | 0 | x | 0 | 0 | 0 | 0 | 1 | 0 | 0 | 0 | 0 | | | | | Low power |
| xxH | xxxxxxxx | 1 | x | 0 | 0 | 0 | 0 | 1 | 0 | 0 | 0 | 0 | | | | | Low power |
| xxH | xxxxxxxx | 1 | 0 | 0 | 0 | 0 | 1 | 0 | 0 | 0 | 0 | 1 | | | | | Deselect mode |
| 03H | e/dxxaaaaa | x | x | 0 | 0 | 0 | 1 | 0 | 0 | 0 | 0 | 1 | | | | | Load packet addr. |
| 04H | xaaaaaaa | x | x | 0 | 0 | 1 | 1 | 0 | 0 | 0 | 0 | 1 | | | | | Load sector addr. |
| 05H | xaaaaaaa | x | x | 0 | 1 | 0 | 1 | 0 | 0 | 0 | 0 | 1 | | | | | Load block addr. |
| 07H | xxxxxxxx | x | x | 0 | 1 | 0 | 1 | 0 | 0 | 0 | 0 | 1 | | | | | Incr. packet addr. |
| 09H | e/dxxaaaaa | | x | 1 | 0 | 0 | 1 | 0 | 0 | 0 | 0 | 1 | | | | | Load Byte addr. Set Incr. on/off |
| 0AH | dddddddd | x | x | ? | 0 | 0 | 1 | 0 | 0 | 0 | 1 | 1 | | | | | Load pgm data registers |
| 0BH | xxxrrrrr | x | x | 0 | 0 | 0 | 1 | 0 | 0 | 1 | 0 | 1 | | | | | Select Control Reg. |
| 0CH | dddddddd | x | x | 0 | 0 | 0 | 1 | 0 | 1 | 0 | 0 | 1 | | | | | Load data to reg. |
| 0DH | xxxxxxxx | x | x | 1 | 0 | 0 | 0 | 0 | 0 | 0 | 0 | 1 | | | | | Increment byte reg. |
| 0EH | xxxxxxxx | x | x | ? | 0 | 0 | 1 | 0 | 0 | 0 | 1 | 1 | | | | | Latch SA data |
| 0FH | xx001000 | x | x | 0 | 0 | 0 | 1 | 1 | 0 | 0 | 0 | 1 | | | | | Clear control reg. |
| --- | xx010000 | x | x | 0 | 0 | 0 | 0 | 0 | 0 | 0 | 0 | 1 | | | | | Clear addr. reg. |
| 19H | zzzzzzzz | x | x | ? | 0 | 0 | 1 | 0 | 1 | 0 | 1 | 1 | | | | | Read Data |
| 1AH | zzzzzzzz | x | x | 0 | 0 | 0 | 1 | 1 | 0 | 0 | 1 | 1 | | | | | Read control reg. |

| REGISTER 00H | ID CODE | | | | | | |
|---|---|---|---|---|---|---|---|
| [7] | [6] | [5] | [4] | [3] | [2] | [1] | [0] |
| Bit 7 | Bit 6 | Bit 5 | Bit 4 | Bit 3 | Bit 2 | Bit 1 | Bit 0 |

FIG. 12B

| REGISTER 01H | BLOCK ADDRESS | | | | | | |
|---|---|---|---|---|---|---|---|
| | $A_{22}$ | $A_{21}$ | $A_{20}$ | $A_{19}$ | $A_{18}$ | $A_{17}$ | $A_{16}$ |
| Bit 7 | Bit 6 | Bit 5 | Bit 4 | Bit 3 | Bit 2 | Bit 1 | Bit 0 |

FIG. 12C

| REGISTER 02H | SECTOR ADDRESS REGISTER | | | | | | |
|---|---|---|---|---|---|---|---|
| | $A_{15}$ | $A_{14}$ | $A_{13}$ | $A_{12}$ | $A_{11}$ | $A_{10}$ | $A_9$ |
| Bit 7 | Bit 6 | Bit 5 | Bit 4 | Bit 3 | Bit 2 | Bit 1 | Bit 0 |

FIG. 12D

| REGISTER 03H | PACKET ADDRESS REGISTER | | | | | | |
|---|---|---|---|---|---|---|---|
| Packet Increment Enable/Disable | | | | $A_x$ | $A_8$ | $A_7$ | $A_6$ | $A_5$ |
| Bit 7 | Bit 6 | Bit 5 | Bit 4 | Bit 3 | Bit 2 | Bit 1 | Bit 0 |

FIG. 12E

| REGISTER 04H | BYTE ADDRESS REGISTER | | | | | | |
|---|---|---|---|---|---|---|---|
| Byte Increment Enable/Disable | | $A_4$ | $A_3$ | $A_2$ | $A_1$ | $A_0$ |
| Bit 7 | Bit 6 | Bit 5 | Bit 4 | Bit 3 | Bit 2 | Bit 1 | Bit 0 |

FIG. 12F

| REGISTER 05H | CONTROL A | | | | | | |
|---|---|---|---|---|---|---|---|
| | | | Ref Voltage Generator Enable | | | | |
| Bit 7 | Bit 6 | Bit 5 | Bit 4 | Bit 3 | Bit 2 | Bit 1 | Bit 0 |

FIG. 12G

| REGISTER 06H | | | | | | | CONTROL B |
|---|---|---|---|---|---|---|---|
| Word Line Trim [7] | Word Line Trim [6] | Word Line Trim [5] | Word Line Trim [4] | Word line Trim [3] | Word Line Trim [2] | Word Line Trim [1] | Word Line Trim [0] |
| Bit 7 | Bit 6 | Bit 5 | Bit 4 | Bit 3 | Bit 2 | Bit 1 | Bit 0 |

FIG. 12H

| REGISTER 07H | | | | | | | CONTROL C |
|---|---|---|---|---|---|---|---|
| Enable Low Current Pump | Connect Program Voltage to Bit Line (PGM) | Enable Word Line Switch | | | | | |
| Bit 7 | Bit 6 | Bit 5 | Bit 4 | Bit 3 | Bit 2 | Bit 1 | Bit 0 |

FIG. 12I

| REGISTER 08H | | | | | | | CONTROL D |
|---|---|---|---|---|---|---|---|
| Enable S.A. Reference Generator | Bit Line Trim (Read) [1] | Bit Line Trim (Read) [0] | | Sense Margin Trim (Read) [3] | Sense Margin Trim (Read) [2] | Sense Margin Trim (Read) [1] | Sense Margin Trim (Read) [0] |
| Bit 7 | Bit 6 | Bit 5 | Bit 4 | Bit 3 | Bit 2 | Bit 1 | Bit 0 |

FIG. 12J

| REGISTER 09H | CONTROL E | | | | | | |
|---|---|---|---|---|---|---|---|
| | | | Select All Word Lines | Deselect All Word Lines | Select All Main Blocks | Select All Erase Blocks | Deselect All Main Blocks |
| Bit 7 | Bit 6 | Bit 5 | Bit 4 | Bit 3 | Bit 2 | Bit 1 | Bit 0 |

FIG. 12K

| REGISTER 0AH | CONTROL F | | | | | | |
|---|---|---|---|---|---|---|---|
| Connect DL Bus to DZ Bus | | | | | | Discharge Bit Lines | Float Bit Lines |
| Bit 7 | Bit 6 | Bit 5 | Bit 4 | Bit 3 | Bit 2 | Bit 1 | Bit 0 |

FIG. 12L

| REGISTER 0BH | CONTROL G | | | | | | |
|---|---|---|---|---|---|---|---|
| | Bypass Program Latches | | Enable Sense Circuits | | | | |
| Bit 7 | Bit 6 | Bit 5 | Bit 4 | Bit 3 | Bit 2 | Bit 1 | Bit 0 |

FIG. 12M

| REGISTER 0CH | CONTROL H | | | | | | |
|---|---|---|---|---|---|---|---|
| Bit 7 | Bit 6 | Bit 5 | Bit 4 | Bit 3 | Bit 2 | Bit 1 | Bit 0 |
|  |  | Bit Line Trim (Program) [2] | Bit Line Trim (Program) [1] | Bit Line Trim (Program) [0] | Enable BL Switch | Enable High Current Pump |  |

FIG. 12N

| REGISTER 0DH | CONTROL I | | | | | | |
|---|---|---|---|---|---|---|---|
| Bit 7 | Bit 6 | Bit 5 | Bit 4 | Bit 3 | Bit 2 | Bit 1 | Bit 0 |
|  | Enable Negative Pumps | Source Line Trim (Erase) [2] | Source Line Trim (Erase) [1] | Source Line Trim (Erase) [0] | Enable Source Switch Circuit | Word Line Supply |  |

MEMORY SYSTEM HAVING READ MODIFY WRITE FUNCTION AND METHOD

BACKGROUND OF THE INVENTION

1. Field of the Invention

The present invention relates generally to memory systems and particularly to a non-volatile memory system having the capability of verifying programming operations using a reduced number of commands.

2. Description of Related Art

Non-volatile memory systems, including flash memory systems, have increased in popularity. Among other things, such memory systems have replaced hard disk drives as a primary memory resource in certain applications. Non-volatile memory systems of the flash variety contain memory cells that are initially erased to a "1" state, with the cells being selectively programmed to a "0"state during memory programming operations. As is well known, memory programming is carried out by application of appropriate voltages to the word and bit lines associated with the cell to be programmed. These programming voltages are effectively applied in the form of pulses, with the magnitude and duration of the pulses being such that multiple application of the pulses is required to complete the programming operation.

In a typical flash memory system, a programming operation includes a verification step to determine whether the cells to be programmed have been adequately programmed. This verification is similar to a read operation. In the event a cell has not been properly programmed, a further programming pulse is applied and the verification step repeated. In a typical programming operation, multiple cells are programmed. By way of example, assume that a byte of data is to be programmed with AAH (D0–D7=10101010). Since the cells are presumably in an initial erased state (11111111), only bits D1, D3, D5 and D7 will be programmed. Since all of the cells are not exactly the same, it is likely that at some point in the programming sequence one cell will be programmed before other cells are programmed. Continuing with the example, assume that a program verification indicates that bit D1 has been programmed but bits D3 D5 and D7 have not been programmed (10111111). In that event, at least one additional programming pulse will be needed. Such programming pulse will be applied only to the cells associated with bits D3, D5 and D7 and not cell associated with D0 since it is undesirable to over program cells.

It can be seen that several memory operations may be required in order to carry out a programming operation which includes program verification. This is especially true when a large segment, such as multiple bytes, of the memory is to be programmed. The present invention greatly simplifies such programming operations, particularly in those applications where a large segment of memory is to be programmed. This and other advantages of the present invention will be apparent to those skilled in the art upon a reading of the following Description of the Preferred Embodiment together with the drawings.

As previously noted, data systems incorporating memory systems having multiple memory devices are well known. By way of example, FIG. 1 depicts a simplified conventional memory system which includes a host device 20, an address decoder 22 and memory devices 24A and 24B. The host device 22 may be a microprocessor and the memory devices 24A and 24B may be separate memory integrated circuits. An address bus 26 is used to provide addresses to an address decoder 22 and to the memory devices 24A and 24B. The address decoder 22 has two outputs connected to enable inputs of the memory devices 24A and 24B. Typically, the most significant bit(s) of the address are provided on the bus 26 to the decoder 22, with the remaining address bits being provided to each of the memory devices.

When memory is to be accessed, the processor 20 causes the address decoder 22 to decode the most significant bit(s) of the memory address placed on an address bus 26. The decoder 22 will select one of the two memory devices 24A and 24B by generating either signal Sel 0 or Sel 1. The selected memory device will respond to the address presented to it on the address bus and the deselected memory device, which is disabled, will not respond. Although not shown, a data bus is used to transfer data between the memory devices and the processor 20, with only the selected device outputting data to the data bus during memory read operations.

The approach depicted in FIG. 1 is sometimes referred to as radial device selection where each memory device has a separate select input. This approach works well when relatively few memory devices are employed and where access speed, particularly random access speed, is important. However, if a large number of memory devices are used so that large amounts of data can be stored, the requirement of separate select lines for each memory device results in large memory boards and a relatively large pin count for the control logic circuitry. Thus, unless access speed is critical and a large number of memory devices are used, the radial device selection approach of FIG. 1 is not ideal.

FIG. 2 shows an alternative prior art device selection technique, sometimes referred to as serial selection. Again, a host device 28 is used which is connected to several memory devices 30A, 30B and 30C by way of a system bus 32. The memory devices 30A, 30B and 30C are usually implemented as separate integrated circuits. The system bus 32 includes memory address and memory data and various control signals so that each of the memory devices 30A, 30B 30C receives the same addresses, data and other signals. Each memory device is preassigned a unique address so that only one device will be accessed by the host device 28 during a memory operation. Typically, the memory devices 30A, 30B and 30C are assigned addresses by way of jumper or switch settings represented by elements 34A, 34B and 34C.

SUMMARY OF THE INVENTION

A non-volatile memory comprising an array of memory cells, a memory controller and memory operation manager, coupled to the memory controller by way of a system bus. The memory operation manager includes a program data register block and a command decoder. In one embodiment, the array of cells and the memory operations manager are implemented in a common integrated circuit and the memory controller is implemented in a separate integrated circuit, with the integrated circuits being in communication with one another by way of the system bus.

The memory controller is configured to initiate read operations on the array by issuing a read command set on the system bus, to initiate program operations on the array by issuing a program command set on the system bus and to initiate an erase operation on the array by issuing an erase command set on the system bus. The read command set, the program command set and the erase command set each can comprise a plurality of commands. By way of example, the program command set could include a load address command for transferring an address of the array to be programmed and a load program data command for transferring data to be programmed to the program data register block and various commands which control voltages for programming the array with the data in the program data register.

The memory program verification operations are carried out for the purpose of verifying that one or more addresses have been properly programmed during a previous program operation. Such program verify operations are carried out by issuance of a single program verify command by the memory controller over the system bus. As part of the program verify operation, the memory controller further comprises a data comparator configured to compare data received on the system bus with stored data, and to place verify data on the system bus based upon the comparison. The stored data typically will comprise the original data to be programmed into the array.

The memory operation manager is configured to carry out the memory read, memory program, memory erase and memory program verify operations in response to detection of the memory read, memory program, memory erase command sets and the memory program verify command, respectively, by the command decoder. The memory program verify operation includes a transfer of data read from the array at the address to be verified to the memory controller by way of the system bus. This is followed by a transfer of the verify data generated by the data comparator of the memory controller to the program data register block of the memory operation manager by way of the system bus. The verify data can then be programmed into the address of the array being verified. Thus, a program verify operation can be carried out with a minimum number of steps thereby reducing the amount of time required to complete the operation.

BRIEF DESCRIPTION OF THE DRAWINGS

FIG. 6 is a truth table relating to the select logic of the FIG. 4 and 5 diagrams.

FIG. 7 is a truth table relating to the command decoder circuitry of the FIG. 4 and 5 diagrams.

FIG. 11 is a truth table for the Command Decoder Logic block of the FIG. 4 interface circuitry.

FIGS. 12A–12N are diagrams representing exemplary interface registers used in carrying out various memory operations.

DETAILED DESCRIPTION OF THE PREFERRED EMBODIMENT

Figure 3A:
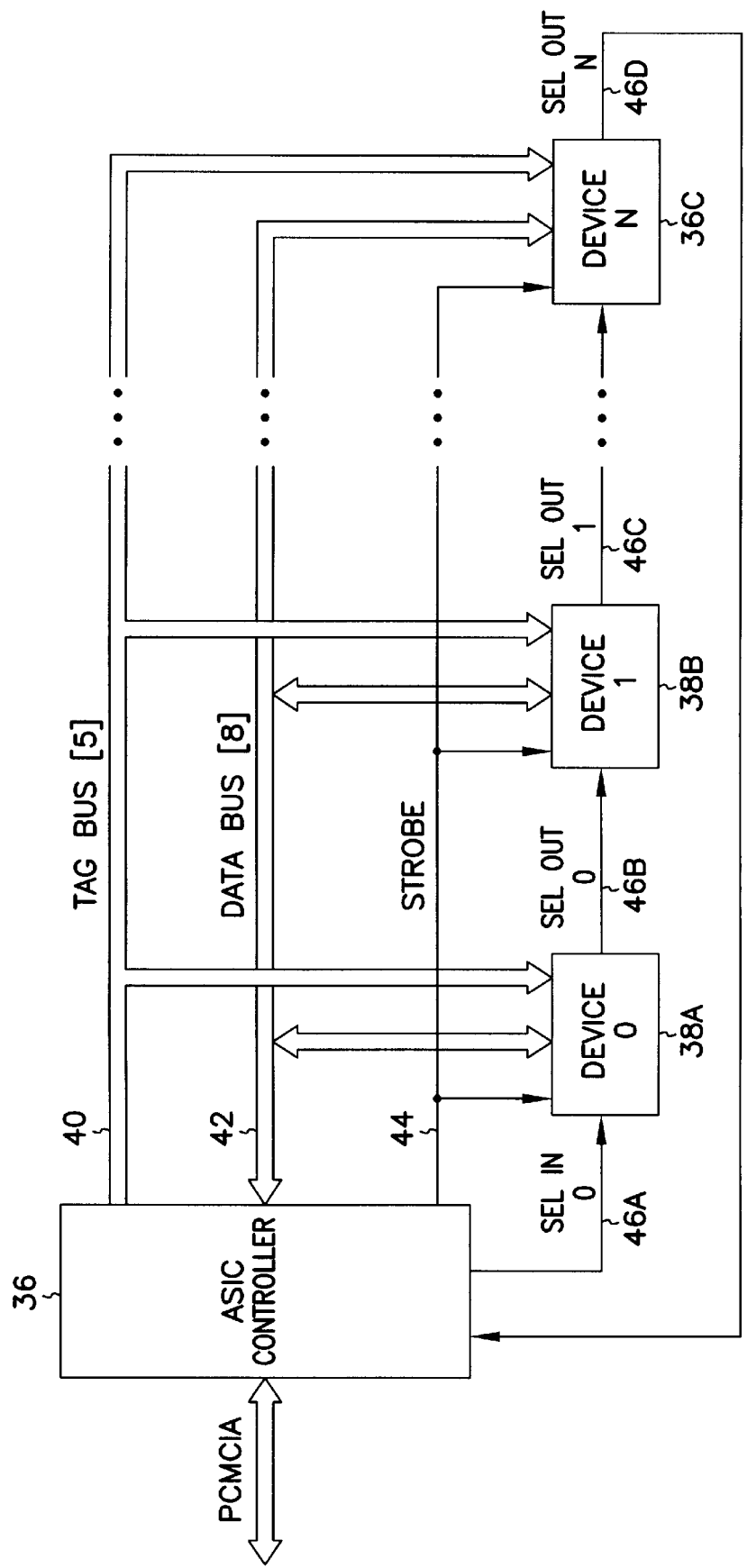
FIG. 3A is a simplified block diagram of a memory system showing multiple memory devices and a common controller.

Referring again to the drawings, FIG. 3A is a simplified block diagram of an embodiment of a memory system suitable for utilizing the present invention. The exemplary memory system to be described is a mass storage memory system used to emulate the operation of a hard disc drive. It should be noted, however, that the subject invention is suitable for use in a large variety of other applications.

The memory system includes a Controller 36 and a plurality of memory devices 38A, 38B and 38C. The Controller 36 can be implemented using a wide variety of techniques including ASIC (Application Specific Integrated Circuit) technology. The Controller 36 is best understood by describing its functionality and a portion of the implementation relating to carrying out the Read, Modify Write function. Since the Controller can be readily constructed by persons of ordinary skill in the art based upon the following description, most of the details regarding a particular implementation will not be provided so as to avoid obscuring the true nature of the present invention in unnecessary detail.

The memory devices 38A, 38B and 38C are preferably separate integrated circuits utilizing non-volatile memory technology. The exemplary embodiment will be described using flash memory technology, that being the preferred memory technology. Each Memory Device 38A, 38B, and 38C is capable of storing a substantial amount of data such as forty Megabits. Several memory devices can be added to the memory system to increase the storage capacity.

In order to reduce the cost of adding memory devices to the system, it is desirable to maximize the amount of memory control functions performed by the Controller 36 and to minimize the number of such functions performed by the Memory Devices 38. Among other things, this approach tends to minimize the use of duplicative control circuitry and further provides increased design flexibility, as will become apparent. Further, the number of pins on the Memory Devices 38 is minimized.

Controller 36 communicates with the memory devices 38A, 38B and 38C by way of a Tag Bus 40, a Data Bus 42, a Strobe Line 44 and a series of Select Lines 46A, 46B and 46C. As will be explained in greater detail, the Tag Bus 40 functions to transfer commands originating from Controller 36 to one or all of the Memory Devices 38. The Data Bus 42 functions to transfer memory data between the Controller 36 and the Memory Devices 38 and to transfer control information to the Memory Devices 38 which, together with commands on the Tag Bus 40, is used to perform several memory functions. For the disclosed exemplary implementation, the Tag Bus 40 is five bits wide and the Data Bus 42 is eight bits wide. The Strobe Line 44 generally functions to provide a strobe signal originating with the Controller 36 to the Memory Devices 38 so that the Devices can strobe (clock) data present on the Tag Bus 40 and Data Bus 42. The Strobe Signal acts as a master clock which allows data on the two buses to be transferred only when action is to be taken. This approach is preferred over the use of a free running clock interface which tends to consume power and generate noise. As will become apparent, this set of interface lines allows all memory functions to be carried out, with the interface lines being the same regardless of the number of Memory Devices 38 being used.

As will be explained in greater detail, the Memory Devices 38 are assigned unique addresses by Controller 36 each time the memory system is powered up or after the system has been reset. This must occur before the memory system is operational as a memory. However, as will be explained in greater detail, it is possible to access and use the Memory Device 38A, connected directly to Controller 36 by Select Line 46A, without having assigned addresses for any of the Memory Devices 38. The address assignments occur serially, with the Memory Device 38A, being assigned the first address, such as address 0001. This address is stored in Device 38A and will be used to decode addresses present on the Data Bus 42 during normal memory operations. Once Device 38A has been assigned an address, the next device, Device 38B is assigned an address, such as address 00010. This process will continue until each of the Memory Devices 38 is assigned a unique address. At that point, Controller 36 is capable of communicating with all or a selected one of the Memory Devices so that normal memory operations can take place such as memory reading and writing. The circuitry for carrying out the sequence for assigning addresses to the Memory Devices 38 will now be described.

Figure 4:
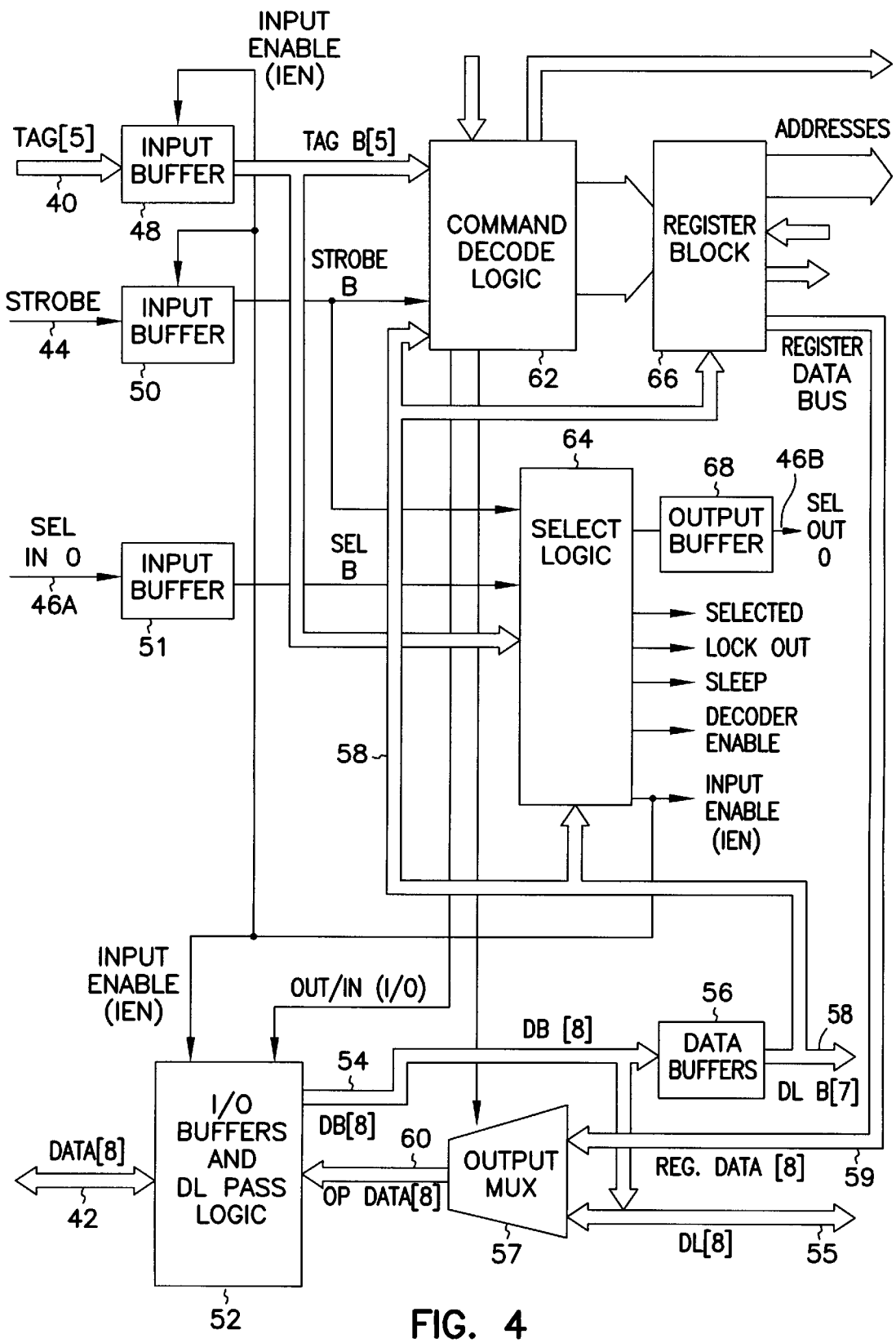
FIG. 4 is a block diagram of the interface circuitry used in the memory devices of the FIG. 3A and 3B memory systems.

FIG. 4 is a simplified diagram of the interface circuitry present in each of the Memory Devices 38. Although Device 38A connected to Select line 46A coming directly from Controller 36 is depicted, this being the first Memory Device 38 to be assigned an address, the interface circuitry is identical for all of the Devices 38. The Tag Bus 40 is connected to the Memory Device by way of five integrated circuit pads (not depicted) which are electrically connected to five separate Input Buffers represented by block 48. The Input Buffers can be enabled or disabled by a combination of Input Enable (IEN) and Out/In (O/I) signals generated within the Device 38 depending upon various conditions to be described. An Input Buffer 50 is also provided for receiving the Strobe Line 44 by way of an integrated circuit pad (not depicted), with Buffer 50 also being controlled by the internal Input Enable and Out/In signals. A further Input Buffer 51 is provided for receiving the Select signal on line 46A. Buffer 51 is permanently enabled.

The Data Bus 42 is connected to an I/O Buffer & DL Pass Logic block 52 which represents eight separate bi-directional buffer circuits connected to separate ones of the lines of the Data Bus 42. Block 52 further represents bypass circuitry which can be used to bypass the buffer circuits so that the bit lines of the memory array can be accessed directly for testing purposes.

Block 52 is controlled by a combination of signal Input Enable (IEN) and Out/In (O/I). As will be explained in greater detail, the Memory Devices 38 will be outputting data when a Tag 19H is present on the Tag Bus 40 thereby indicating that data is to be read out of the Device. That data will be provided on DL bus 55 containing data read from the memory array. When a Tag 1A is on the Tag Bus 40, the contents of a Control Register are to be read out of the Device. That data will be provided by way of Register Data bus 59. Generally speaking, signal Out/In (O/I) is active when either Tag 19 or Tag 1A are present. When Out/In is active and signal Input Enable (IEN) is active, Buffer 52 functions to output data from the Device (either memory data or control register data) to the Data Bus 42. When Out/In is inactive and signal Input Enable (IEN) is active, Buffer 52 functions to transfer data on the Data Bus 42 to Input Data bus 54 of the Memory Device 38. When signal Input Enable (IEN) is inactive, Buffer 52 is disabled and does not transfer data in either direction. Input buffers 48 and 50 are enabled when signal Input Enable (IEN) is active.

DL Bus 55 functions to forward data to be programmed to the memory array. In addition, data read from the memory array is placed in the DL Bus 55 and forwarded to the I/O Buffers & DL Pass Logic block 52 by way of Output Multiplexer 57. Multiplexer 57 also receives data from the various registers in Register Block 66 by way of a Register Data bus 59 so that the contents of these registers can be read out. Multiplexer 57 is controlled so as to select either the data on the DL Bus 55 or Register bus 59.

As will be explained in greater detail, the data placed on Data Bus 42 by Controller 36 and received by the I/O Buffer and DL Pass Logic block 52 is used in a wide variety of memory operations. Those include memory read, program and erase operations. The data received on Data Bus 42 is also used in conjunction with various commands present on the Tag Bus 40 for performing various memory operations, including the initial assignment of addresses to each of the Memory Devices 38. The circuitry associated with decoding commands on the Tag Bus 40 and associated data from the Data Bus 42 on lines 58 is represented by Command Decode Logic block 62.

Some of the circuitry used for the initial assignment of addresses is accomplished by circuitry represented by Select Logic block 64. Select Logic block 64 provides a large number of control signals to be subsequently described, including signal Sel Out 0 on line 46B, by way of a buffer 68. As noted in connection with FIG. 3A, the signal Sel Out are generated by each of the Memory Devices 38 and forwarded to the adjacent Memory Device 38 during the initial sequence of assigning addresses. In addition, the Select Logic block 64 generates signal Input Enable (IEN) used by Input Buffers 48 and 50.

Most of the memory functions are carried out utilizing an array of registers represented by Register Block 66. Among other things, Register Block 66 provides the addresses used by the memory in read and programming operations. In addition, Register Block 66 is used to control the various voltages used in memory operations, as will be explained in greater detail.

Figure 5A:
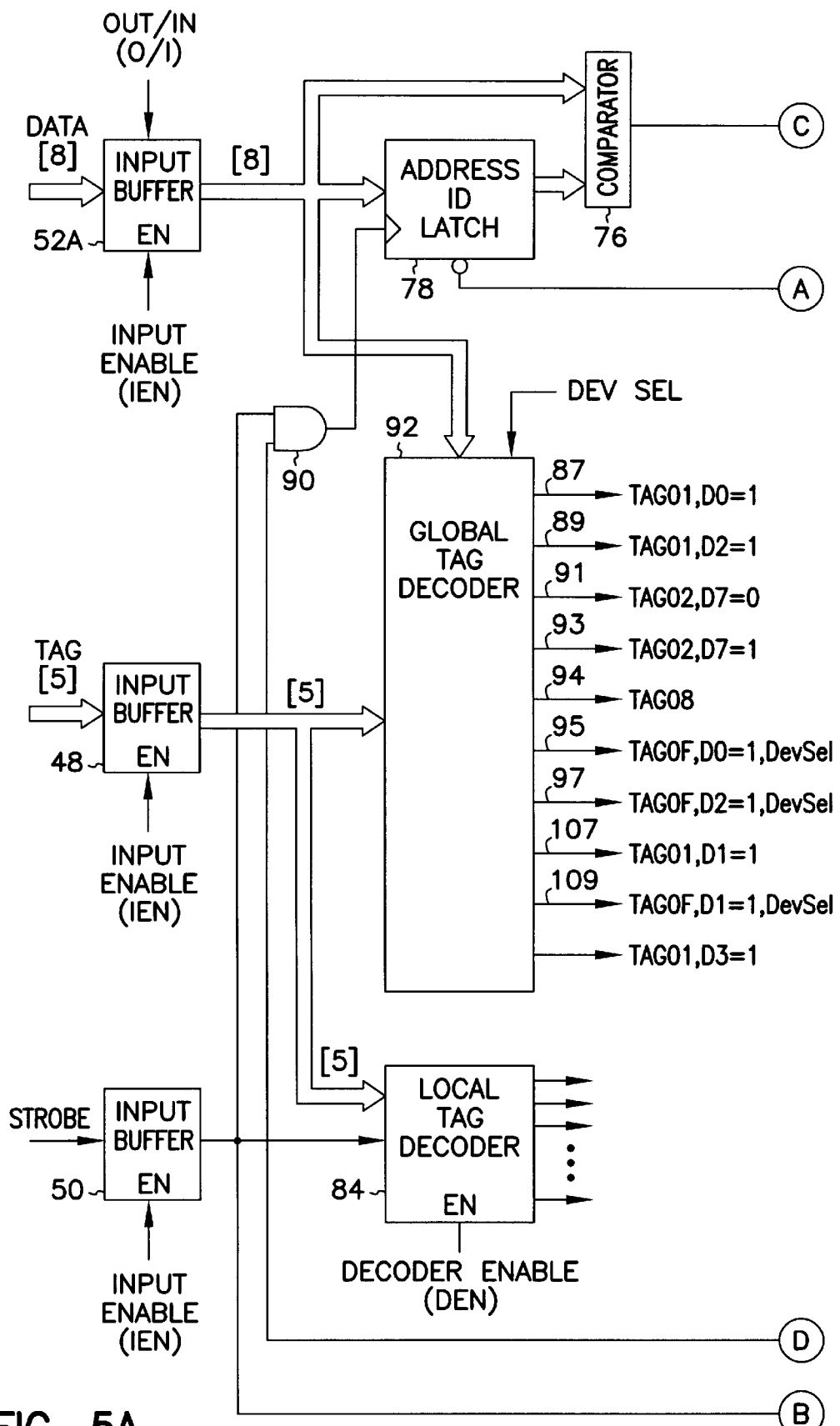
FIG. 5 is a schematic diagram showing details of the interface circuitry of FIG. 4.
Figure 5B:
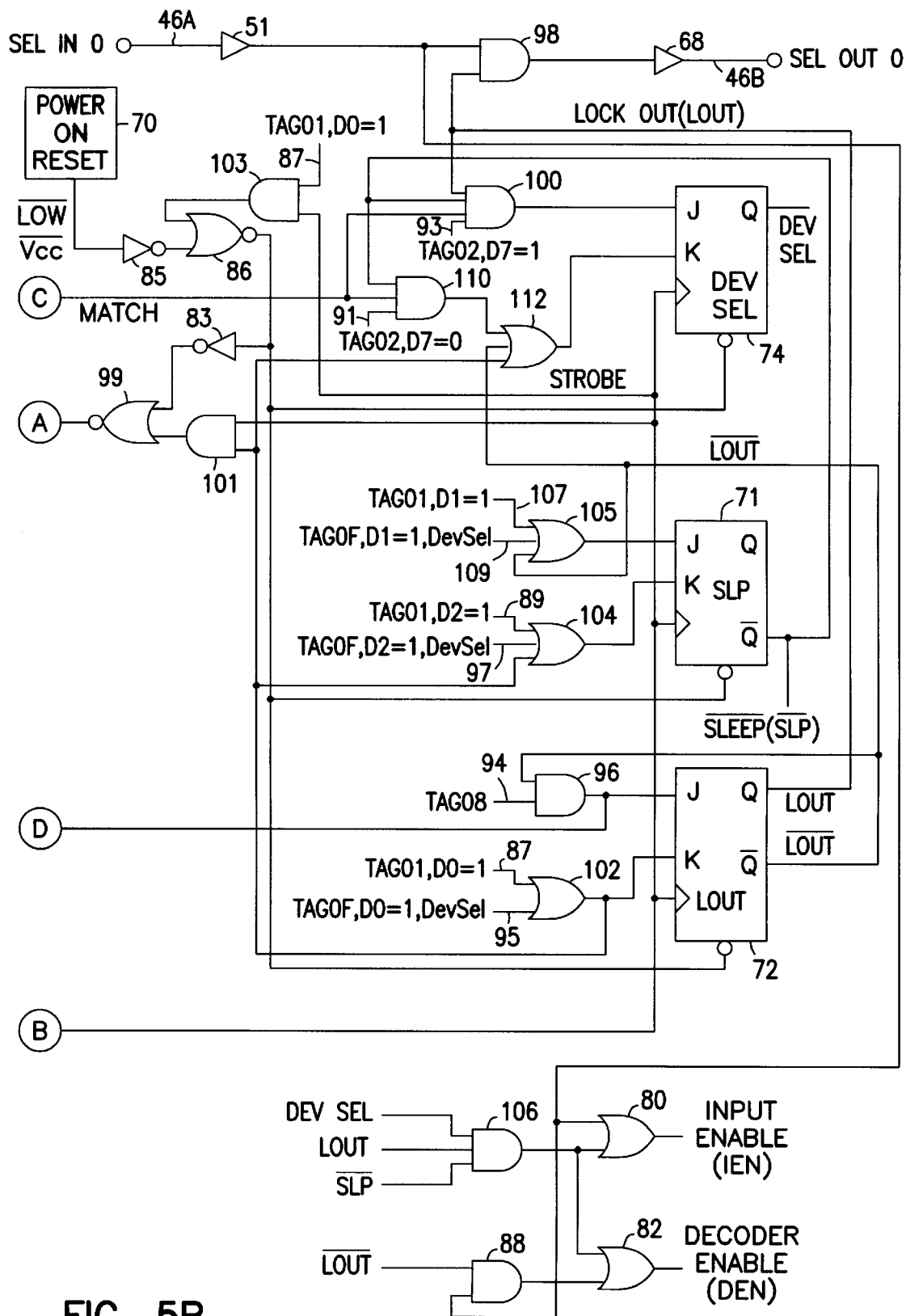

FIG. 5 is a more detailed diagram of the select logic circuitry from the interface diagram of FIG. 4 used for, among other things, the initial selection of Memory Device 38 addresses. FIG. 6 is a Select Logic Table, a form of truth table, which depicts the various inputs to the FIG. 5 circuitry and the corresponding state of various latches or flip-flops.

The Tag Bus column of the Select Logic Table shows certain selected Tag Bus 40 inputs that relate to the operation of the select logic circuitry. The Tag Bus inputs comprise five bits that are shown using Hexadecimal notation. The next column shows the state of the eight bits that are present on the Data Bus 42, namely bits D0–D7.

The next column of the Select Logic table shows the output $\overline{\text{Low}}$ $\overline{\text{Vcc}}$ produced by a Power On Reset circuit 70. Signal $\overline{\text{Low}}$ $\overline{\text{Vcc}}$ is at a low ("0") state when the primary memory supply voltage Vcc is below a predetermined operating level and is momentarily low when the primary supply Vcc is first turned on. The next column is signal Lock Out (LOUT) which is stored in a latch represented by JK flip-flop 72. As will be explained, signal Lock Out is used for many memory functions including the prevention of the alteration of the Memory Device 38 address stored in an Address ID Latch 78 once an address has been assigned. Flip-flop 72 can be said to be in a lockout state when signal Lock Out is active and in a non-lockout state when the signal is inactive. Continuing, signal Dev Sel, which is stored in a latch represented by JK flip-flop 74, functions to permit the associated Memory Device 38 to respond to memory read and write commands originating from the Controller 36. When signal Dev Sel is active, the flip-flop 74 is said to be in a device-selected state and when the signal is inactive, flip-flop 74 is said to be in a device-not-selected state.

The next column of the Select Logic table shows signal Sleep (or SLP) produced by flip-flop 71. As will be explained in greater detail, when signal Sleep is active, the Memory Device is in a low power state with essentially all circuitry, including the control registers that make up Register Block 66 (FIG. 4), being in a reset state except for the Address ID Latch 78. Since Latch 78 is not reset, it is possible to switch the Memory Device from this sleep mode to an operational mode without the necessity of reassigning addresses.

The Memory Device 38 is in a reset state when Lock Out latch 72, Device Select latch 74, Sleep latch 71 and Address ID latch 78 are reset. In addition, the various control registers which make up Register Block 66 are reset. Thus, the reset state is similar to the sleep state except that the Address ID latch 78 is reset so that the Memory Device must go through an initial address assignment after entry into the reset state if the memory is to be used in the serial selection configuration. As can be seen from the table of FIG. 6, the Memory Device can be caused to enter the reset state in various ways. By way of example, when the Memory Device is powered up, the Power On Reset circuit 70 will issue signal $\overline{\text{Low}}$ $\overline{\text{Vcc}}$ ("0") thereby causing the appropriate circuitry to be reset. Other techniques to cause entry into the reset state, such as the use of Tag Commands, will be described later.

As will also be explained in greater detail, the Memory Devices 38 are switchable between a device-enabled state and a device-disabled state. When in the device-enabled state, the Memory Device 38 is capable of carrying out memory operations, such as memory read, erase and program operations. Memory Device 38 is in the device-enabled state under two conditions: (1) signal Sel In is active and signal Lock Out is inactive, that is, flip-flop 72 is the non-lockout state and (2) signal Dev Sel is active, that is, flip-flop 74 is in the device-enabled state and signal Lock Out is active, that is, flip-flop 72 is in the lockout state and signal SLP is inactive, that is, flip-flop 71 is in a non-sleep state.

Figure 1:
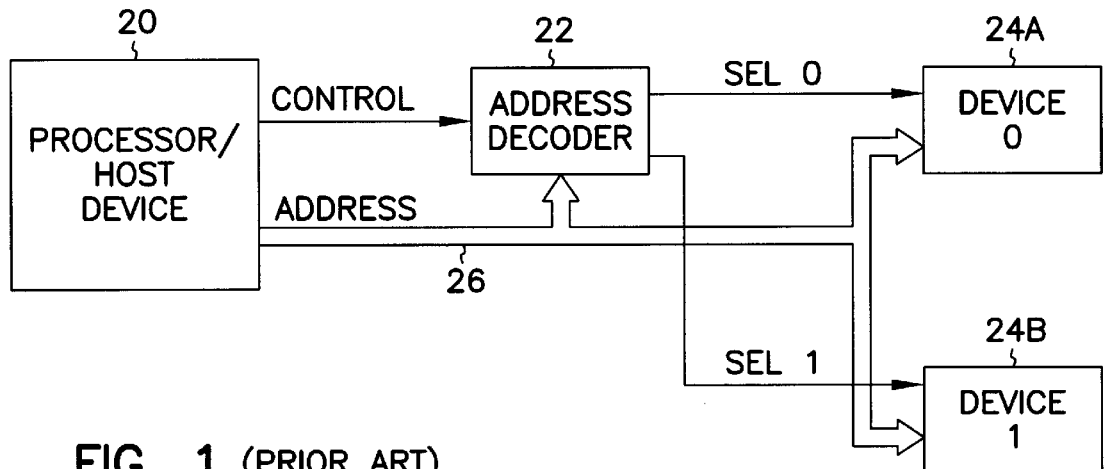
FIG. 1 is a simplified block diagram of a prior art memory system using radial selection techniques.
Figure 2:
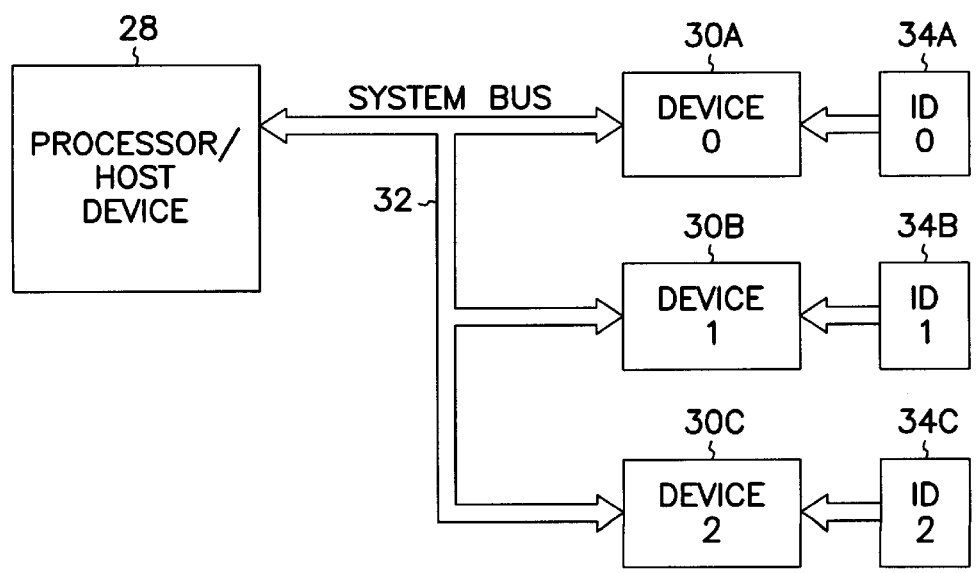
FIG. 2 is a simplified block diagram of a prior art memory system using a serial selection technique.

Condition (1) permits the Memory Device 38 to become operative at power on, when flip-flop 72 is reset, by simply making signal Sel In active. There is no need, for example, to provide the Memory Device with a local address stored in the Address ID Latch 78. Since Sel In is connected to an external pin, it is possible to fully test a large number of the Memory Devices with a simple test fixture. Further, condition (1) operation makes it possible to configure the Memory Devices 38 in a radial manner such as depicted in FIG. 1 in addition to the serial selection configuration of FIG. 3A. There is no need to make an initial address assignment.

In addition, when using the serial selection configuration of FIG. 3A, it is possible to use the Memory Device 38A connected directly to Controller 36 as a boot memory which can be accessed directly by Controller 36 at power on so that the Controller can read a boot code stored in Device 38A using the Sel In 0 signal. Among other things, that boot code could be used to carry out address assignment sequence upon completion of which permits the Memory Devices to enter Condition (2).

Condition 2 is entered, as will be explained, once a local address has been loaded into the Address ID Latch and the Memory Device has been addressed by the Memory Controller 36 by placement of the local address on the Data Bus. Thus, condition (2) is used primarily for normal operations, as opposed to testing operations.

Signal Match is generated by a comparator circuit 76 which compares seven bits of address stored in an Address ID Latch 78 with seven bits of address coming from the Input Buffer 52A connected to Data Bus (D0–D6). It should be noted that Input Buffer 52A of FIG. 5 is part of the I/O Buffer and DL Pass Logic 52 of FIG. 4 with 52A representing only the data input function of Buffer 52. As previously noted, Buffer 52 (52A) will function to input data only if signal Out/In is inactive (not [Tag 19 or Tag 1A]) and signal Input Enable (IEN) is active. When signal Out/In is active or signal Input Enable (IEN) is inactive, circuit 52 is disabled with respect to incoming signals on Data Bus 42. When signal Out/In is active and signal IEN active, circuit 52 is enabled to input signals on the Data Bus.

As will be explained in greater detail, the Address ID Latch 78 stores the unique address assigned by the Controller 36 to the associated Memory Device 38. This address is sometimes referred to as a local address.

FIG. 7 is an Enable & Select Out Logic truth table having input signals $\overline{\text{Low Vcc}}$ ($\overline{\text{LVCC}}$), Lock Out (LOUT), Dev Sel (DSEL) and Sleep (SLP) previously noted in connection with FIG. 6. The outputs include the previously noted signal Input Enable (IEN) which is produced by OR gate 80 of the FIG. 5 circuit diagram. Signal Input Enable functions, among other things, to enable the Input Buffers 48 and 50 so that signal Strobe can be received and so that the contents of the Tag bus 40 can be received. Buffer 52A (FIG. 5) associated with the Data Bus will also be enabled provided that signal Out/In is inactive (not [Tag 19 or Tag 1A]), the Strobe Input and the Data Bus, respectively.

Continuing, signal Sel Out is outputted by buffer 68 once the subject Memory Device 38 has completed the initial assignment of addresses. As will be explained, this permits the adjacent Memory Device 38 connected to receive signal Sel Out to be assigned an initial address. Signal Decoder Enable (DEN) is produced by logic gate 82 and functions, among other things, to enable a Local Tag Decoder 84 which is used to decode data on the Tag Bus when the subject Memory Device 38 is being addressed for memory read and program operations.

Figure 8A:
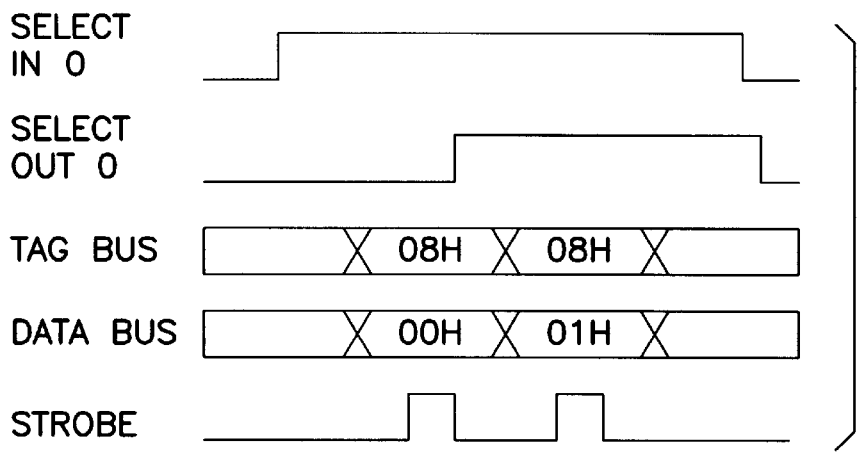
FIG. 8A is a timing diagram showing the relationship for the signals on the Tag Bus, Data Bus and the Strobe signal on the FIG. 3A and 3B block diagrams illustrating the manner in which addresses are assigned to two of the memory devices.
Figure 13:
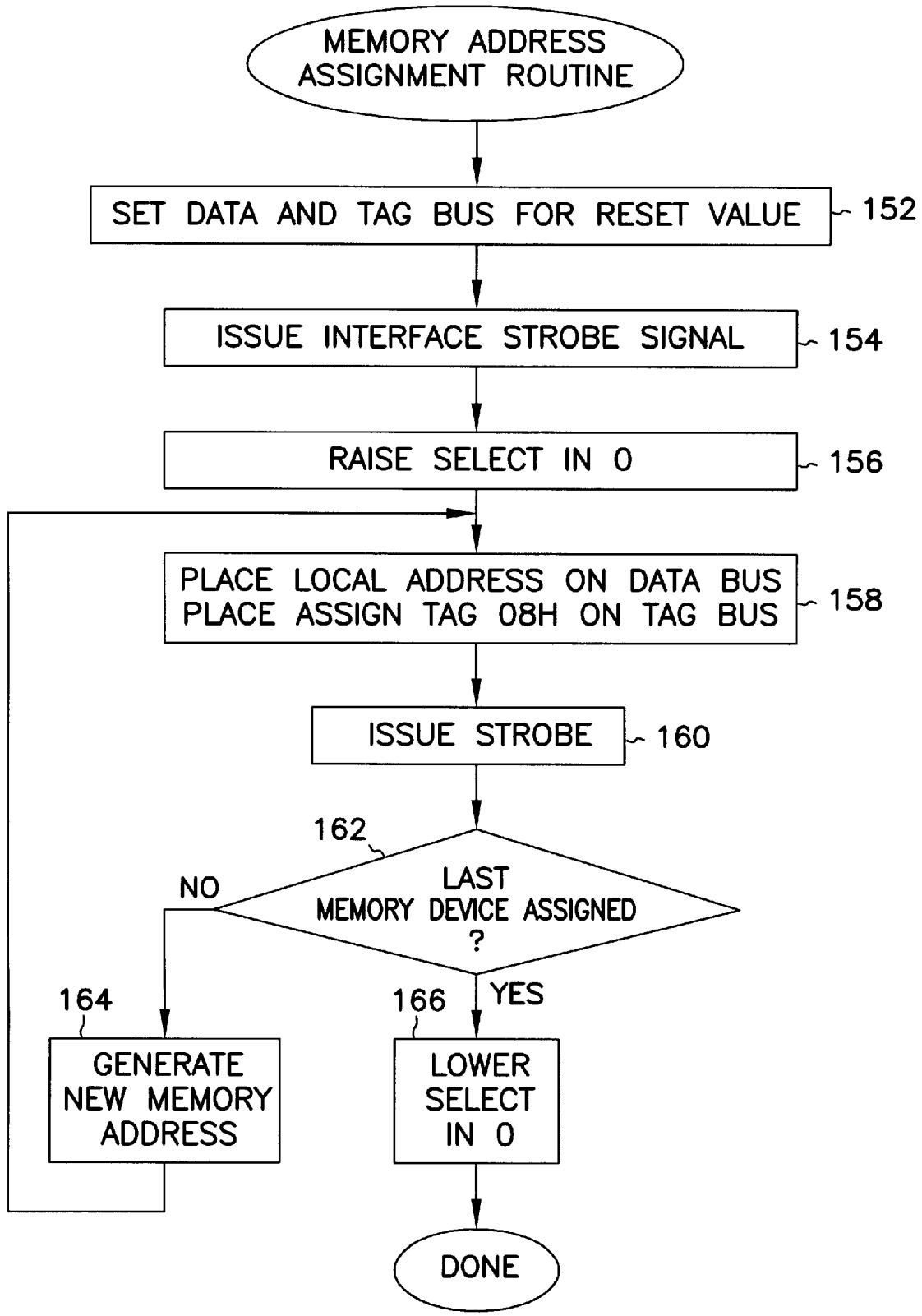
FIG. 13 is a flow chart illustrating the sequence for assigning addresses to the memory devices.

Further details regarding the manner in which the Controller 36 assigns addresses to the multiple Memory Devices 38 will now be described. FIG. 13 is a flow chart showing the address assignment sequence. In addition, FIG. 8A is a timing diagram illustrating a portion of the sequence for the first two Memory Devices 38A and 38B.

At initial power on, the Power On Reset circuit 70 will cause various elements of the interface circuitry to be initialized, as previously described. Signal $\overline{\text{Low Vcc}}$, which is inverted by an inverter 85, will be at a low level so that the Address ID Latch 78 for all of the Memory Devices 38 will be cleared by way of NOR gate 86, inverter 83 and NOR gate 99. In addition, NOR gate 86 will clear the latch 74 associated with signal Dev Sel and latch 72 associated with signal Lock Out. This is confirmed by the FIG. 6 table which shows that the four latches are in the reset state when signal $\overline{\text{Low Vcc}}$ is low ("0"), regardless of the state of the remaining input signals. Similarly, the table of FIG. 7 shows the state of signals Input Enable (IEN), Sel Out (SOUT) and Decoder Enable (DEN) when signal $\overline{\text{Low Vcc}}$ is active ("0").

As represented by blocks 152 and 154 of the FIG. 13 flow chart, it is preferable that the system be reset using a dedicated reset command. This step, which will be described in greater detail, ensures that the logic circuitry is in the desired initialized state at the beginning of the sequence.

Just prior to the initiation of the sequence to assign addresses by the Controller 36 (FIG. 3A), signal Sel In 0 on line 46A from the controller is inactive ("0"). This can also be seen in the FIG. 8A timing diagram. As indicated by the table of FIG. 7, the second row indicates the state of all of the Memory Devices 38A, 38B and 38C at this stage of the sequence. All of the Input Enable signals are the same state as Sel In, namely "0". Thus, as can be seen from FIGS. 4 and 5, the Strobe and Tag Bus Input Buffers 48 and 50 are disabled. As shown in FIG. 8A, when Controller 36 initiates the sequence to assign addresses, the Controller causes signal Sel In 0 on line 46A to go active ("1"). This step in the sequence is represented by element 156 of the FIG. 13 flow chart. Signal Sel In 0 will remain active until the address assignment sequence is completed. As can be seen in FIG. 3A, line 46A is connected only to Memory Device 38A and none of the other Memory Devices. Thus, as again indicated by the second row of the table of FIG. 7, signal Sel In to the Memory Devices 38A will cause signal Input Enable to go active ("1"). That is because buffered signal Sel In applied to one input of OR gate 80 which generates signal Input Enable. Thus, the Tag Bus, Strobe Input and I/O Data buffers 48, 52A and 50 of Memory Device 38A, and only that Memory Device, will be enabled. Memory Device 38A is thus in the above-noted device-enabled state.

Figure 3B:
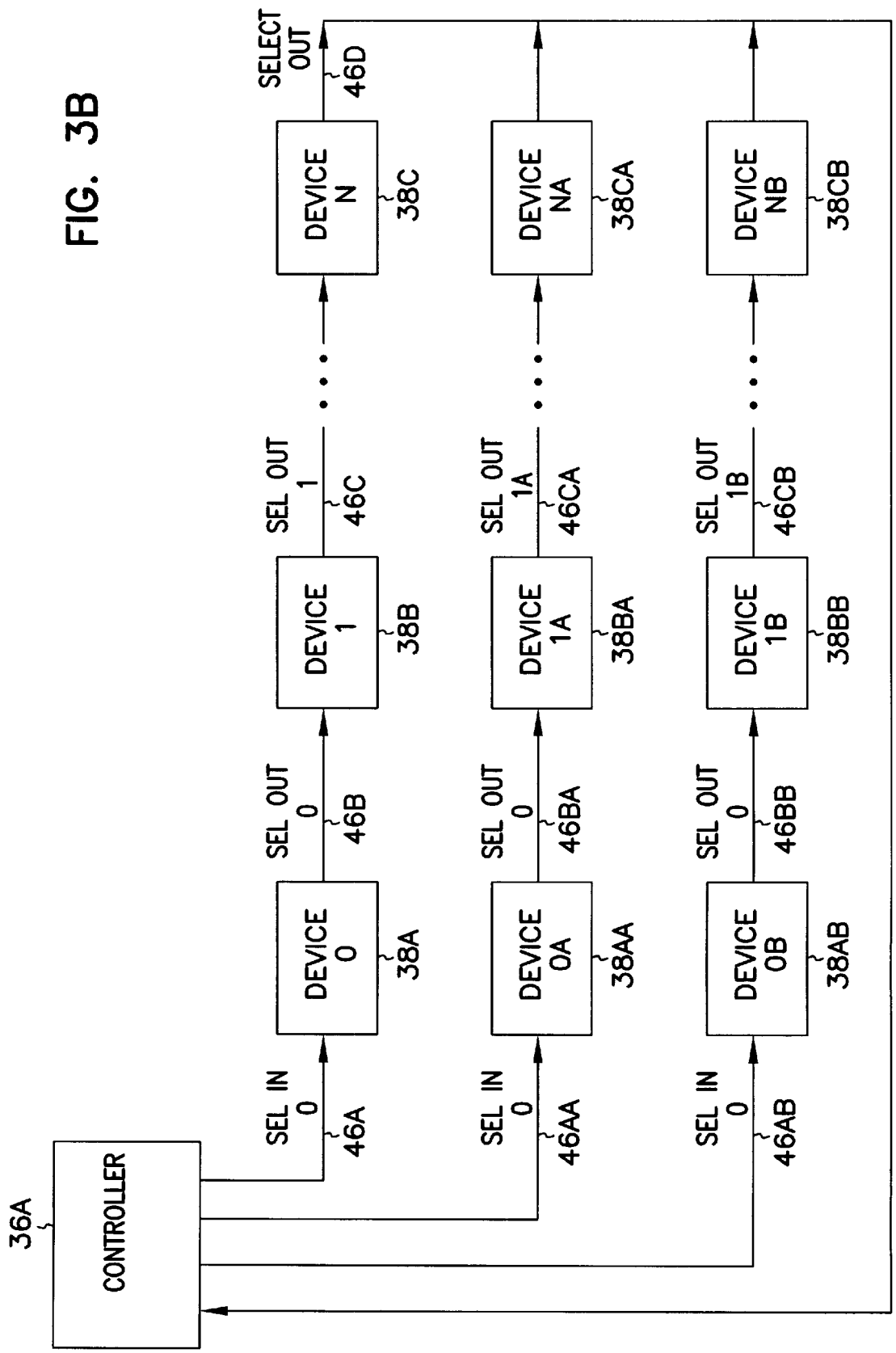
FIG. 3B is a simplified block diagram of a memory system in accordance with another embodiment showing multiple memory devices arranged in banks.

Although Controller 36 will continue with the local address assignment sequence, it should be noted that the Memory Device 38A is now capable of carrying out memory operations, including memory read, program and erase operations. This important feature permits the Memory Devices 38 to be connected radially as shown in FIG. 1 and without the necessity of assigning addresses to any of the Devices. As previously noted, testing of the Memory Devices 38 is also facilitated by this feature since a large number of Devices 38 can be easily placed in the device-enabled state by simply making the Sel In pin of all of the Devices active. In addition, this feature permits first Memory Device 38A connected directly to the Select In 0 signal generated by Controller 36 to be used as a boot memory which contains the code to be used by Controller 36. Such boot memory may be used for, among other things, carrying out the remainder of the address assignment sequence. As will be explained later in greater detail, it is possible to arrange the Memory Devices into a plurality of banks as shown in FIG. 3B, with each bank having a first Memory Device 38A, 38AA and 38AB connected to a separate Sel In line provided by a Controller 36A.

Continuing with the description of the sequence for assigning local addresses, as indicated by element 158 of the FIG. 13 flow chart, once signal Sel In is made active, Controller 36 then places a seven bit address on Data Bus 42 which will be the address (local address) used by the Controller in the future to access Memory Device 38A. Typically, the first Memory Device 38A address is 00H, as can be seen in the timing diagram of FIG. 8A. The Controller will also place a unique set of five bits of data on the Tag Bus 40, such data being referred as the ID Select Tag. In the present example, the ID Select Tag is 08H. The table of FIG. 6, in the fourth row, sets forth some of the features of the ID Select Tag (or simply Tag 08H).

Once the address has been loaded onto the Data Bus 42 and the ID Select Tag 08H has been loaded onto the Tag Bus 40, element 160 of the FIG. 13 timing diagram indicates that Controller 36 generates a Strobe pulse on line 44 connected to all of the Memory Devices. The timing relationship between the data in the Data Bus and Tag Bus and the Strobe signal is depicted in the FIG. 8A timing diagram.

As previously noted, only Memory Device 38A is capable of responding to the Tag Bus, Data Bus and Strobe signal since only Memory Device 38A has an active signal Input Enable. The seven bits of address data on the Data Bus are loaded into the Address ID Latch 78 (FIG. 5) in parallel. This is accomplished by clocking the Latch 78 with the Strobe signal by way of AND gate 90 which is enabled by the output of an AND gate 96 to be described. In addition, the ID Select Tag on the Tag Bus, Tag 08H, is presented to a Global Tag Decoder 92 which is also clocked by signal Strobe.

Global Tag Decoder 92 is implemented to decode certain Memory Device select commands including the Tag 08H. The function performed by some of the commands is modified by data present on the Data Bus, with such data being coupled to the Global Tag Decoder 92 as can be seen by the connection between Input Buffer 52A of FIG. 5. Some of these modifier bits can be seen in the FIG. 6 table. In the case of Tag 08H, data on the data bus does not operate to modify the function performed by the tag. Rather, the data on the bus represents the address to be assigned to the Memory Device 38, as previously noted.

The Global Tag Decoder 92 decodes the Tag 08H and provides an output on line 94 indicating the ID Select Tag (Tag 08H) has been detected on the Tag Bus 40. As will be described later, a Local Tag Decoder 84 is also provided which is used to decode the other commands associated with memory read and program operations. Unlike the Global Tag Decoder 92, the Local Tag Decoder 84 is disabled until signal Decoder Enable is active.

The Tag 08H decode on line 94 is connected to one input of AND gate 96 having an output connected to the J input of Lock Out latch 72. The second input of AND gate 96 receives signal $\overline{\text{LOUT}}$ which is active ("1") at this point. Thus, Tag 08H functions to set the Lock Out Latch (flip-flop 72) so that signal Lock Out (LOUT) goes active. This occurs on the falling edge of the Strobe signal generated in conjunction with Tag 08H. In addition, the output of AND gate 96 is further connected to AND gate 90 so that the Strobe signal will further function to clock the Address ID Latch 78 so that the address on the Data Bus will be loaded into Latch 78. When Lock Out goes active, the output of AND gate 96 goes inactive so that the Strobe signal can no longer clock Address ID Latch 78. Thus, the Latch 78 will not be altered by subsequent Strobe signals so that the ID (local address) stored in the latch is retained. In this state, the contents of the Address ID Latch cannot be altered except by a certain commands to be described later and except by the Power On Reset circuit 70.

In addition, the active signal Lock Out will enable AND gate 98 so that the signal Sel Out 0 on line 46B will go active (FIG. 8A). As can be seen in FIG. 3A, Sel Out 0 is forwarded to adjacent Memory Device 38B and functions as the Sel In signal for that device. As indicated by element 162 of the FIG. 8A timing diagram, a determination is then made as to whether all of the Memory Devices 38 in the system have been assigned an address. This is accomplished by monitoring the state of signal Sel Out N on line 46D (FIG. 3A). At this stage of the sequence, signal Sel Out N will be inactive thereby indicating that the last Memory Device 38C has not yet been assigned an address.

The assignment sequence will then proceed to element 164 (FIG. 8A) which indicates that Controller 36 will generate a new local address for the next Memory Device 38B. In the present example, the address is 01H. The sequence will then return to element 158 (FIG. 13). The local address is placed on the Data Bus 42 and Tag 08H is placed on the Tag Bus 40. Note that only Memory Device 38B will respond. Memory Device 38A will not respond, as previously described, because signal Lock Out will be active thereby disabling AND gate 90 so that the Address ID Latch 78 will not be clocked by signal Strobe. The other Memory Devices 38C will not have an active signal Sel In so that the Input Buffers 48, 50 and 52A will be disabled.

Thus, local address 01H will be loaded into Address ID Latch 78 of Device 38B in the same manner as a previously described in connection with Memory Device 38A. As can be seen in the FIG. 8A timing diagram, this is accomplished by placing Tag 08H on the Tag Bus 40 and the next address to be assigned, address 01H, on the Data Bus 42. This sequence will continue until all of the Memory Devices have been assigned a unique local address which is stored in the Address ID Latch 78 associated with the Memory Device 38. Once the last Memory Device, represented by Device 38C has been assigned an address, Controller 36 will sense signal Sel Out N on line 46D going active thereby ending the assignment sequence. Controller 36 will then end the sequence by causing signal Sel In 0 to go inactive (element 166 of FIG. 13).

Once all of the Memory Devices 38A, 38B and 38C have been assigned addresses, the memory system is ready to be accessed in a serial select methodology. By way of example, if Controller 36 is to read or write to a particular Memory Device 38, a serial select sequence is carried out to enable to particular Memory Device to respond to a series of interface commands. It is no longer possible to access the Memory Devices by way of the Sel In signals due to the active Lock Out condition of all of the Devices.

Figure 8B:
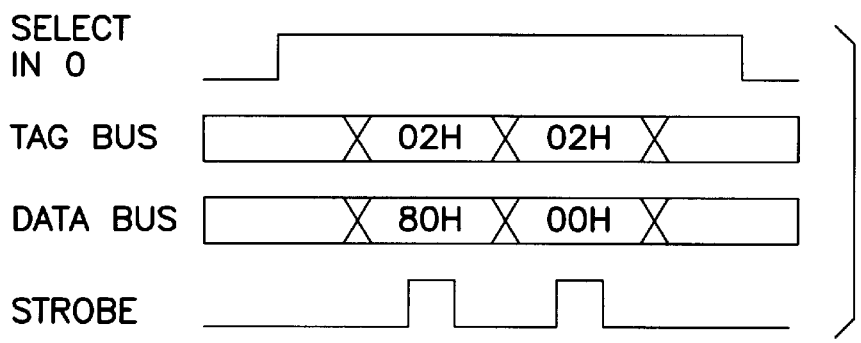
FIG. 8B is a timing diagram showing the relationship for the signals on the Tag Bus, Data Bus and the Strobe signal on the FIG. 3A and 3B block diagrams illustrating the manner in which the memory devices are selected and deselected.

The manner in which one of the Memory Devices 38 is selected will be described in connection with the FIG. 14 flow chart and the timing diagram of FIG. 8B. It should be noted that multiple Memory Devices 38 can be selected. In that event, the same memory operation will be performed on each selected Memory Device. It should be further noted that once a Memory Device has been selected, the Device will remain selected until the Device is deselected or until the Device is reset, either at power on or by a reset Tag command to be described.

Figure 14:
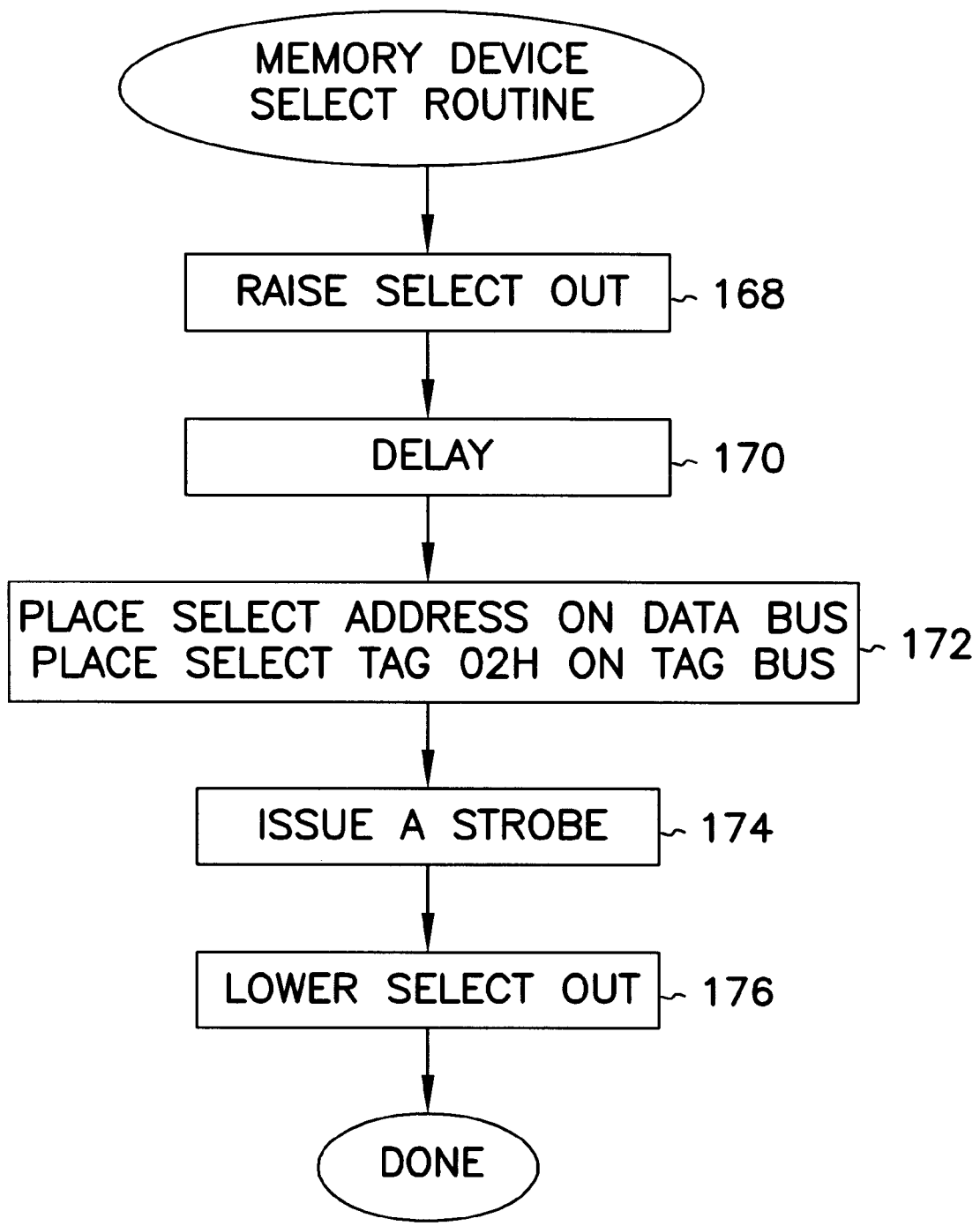
FIG. 14 is a flow chart depicting the sequence for selecting one of the memory devices.

In order to select a particular Memory Device 38, Controller 36 will cause the Sel In 0 signal on line 46A to go active as represented by element 168 of the FIG. 14 flow chart. This signal will propagate through all of the Memory Devices 38 of the system since signal Lock Out is active in all of the Devices. As indicated by element 170, Controller 36 will enter a wait state in order to permit the signal to propagate through the system. An active Sel In signal at each of the Memory Devices 38 will cause signal Input Enable produced by gate 80 to go active so that all of the Input Buffers 48, 50 and 52 in all of the Memory Devices 38 will be enabled.

Controller 36 will then, as indicated by element 172 of the FIG. 14 flow chart, place the address of the Memory Device 38 with which the Controller is to communicate on the Data Bus 42. In addition, Controller 36 will place Tag 02H on the Tag Bus 40. As indicated by the last two rows of the table of FIG. 6, Tag 02H performs two functions, one of which is to perform a select function by causing signal Dev Sel (DSEL) to be active and the other of which is to perform a deselect function by causing signal Dev Sel (DSEL) to become inactive. The particular function performed is defined by a modifier bit placed, D7, on the Data Bus 42 as shown in the second column of the FIG. 6 table. Since the select function is to be performed, D7 is set to "1".

The address of the Memory Device 38 to be selected comprises seven bits D0–D6. The bits represent the local address of the Memory Device stored in the Address ID Latch 78 (FIG. 5). Thus, if Memory Device 38A is to be selected having address 00H, the value 80H is placed on the Data Bus, as indicated by the FIG. 8B timing diagram together with Tag 02H on the Tag Bus 40. Controller 36 will also produce a Strobe signal when the appropriate data are present on the Data and Tag buses, as indicated by element 174.

The address on the Data Bus 38 will be received by all of the Memory Devices 38 of the system. The address on the Data Bus will then be compared with the local address stored in the Address ID Latch 78 by way of Comparator 76. Only one of the Memory Devices 38, Device 38A, should have a stored local address 00H which compares with the address on the Data Bus. The Comparator 76 of the Memory Device 38A will then generate an active signal Match.

Global Tag Decoder 92 for each of the Memory Devices 38 will detect the presence of Tag 02H on the Tag Bus together with the modifier bit D7 on the Data Bus. This combination will cause one of the outputs of Decoder 92 on line 93 of each Memory Device 38 to go active. The Decoder 92 output, together with signals Match, $\overline{SLP}$ and signal Lock Out, are connected to respective inputs of four input AND gate 100. Signals $\overline{SLP}$ and Lockout will typically be active for all of the Devices. However, since signal Match is active only for Memory Device 38A, only gate 100 of Device 38A will cause the J input of Device Select flip-flop 74 of Memory Device 38A to be high. The falling edge of the Strobe Signal will then cause the Device Select flip-flop 74 of Device 38A to be set, thereby causing Device 38A to be selected. Device 38A is then in the device-enabled state and will remain in that state until changed by one of the sequences to be subsequently described. This state is depicted in the fifth row of the FIG. 7 table.

The active signal Device Sel will cause signal Decoder Enable at the output of gate 82 of selected Device 38A to be active. Thus, the Local Tag Decoder 84 of Device 38A, and only Device 38A, is enabled. As previously noted, Local Tag Decoder 84 functions to decode signals on the Tag Bus for carrying out memory operation, including Read, Program and Erase operations.

Once signal Dev Sel is active, Controller 36 will cause signal Sel In 0 on line 46A to go low or inactive as indicated by element 176 of FIG. 14. This step, which is optional, will cause the input buffers for all of the Memory Devices 38 other than Device 38A to be disabled. The deselected Memory Devices 38 will thus not respond to data present on the Data and Tag buses thereby preventing circuitry on the deselected devices from toggling in response to the inputs so as to minimize power consumption.

As previously noted, it is possible to select more than one Memory Device 38 of the system. This is accomplished by repeating the above-described sequence for each Device to be selected, using the address of the target Device in each sequence. Each selected Memory Device 38 will then respond to memory commands, such as write commands, erase commands and read commands in the same manner so that multiple operations will be performed simultaneously on the selected Devices.

Figure 15:
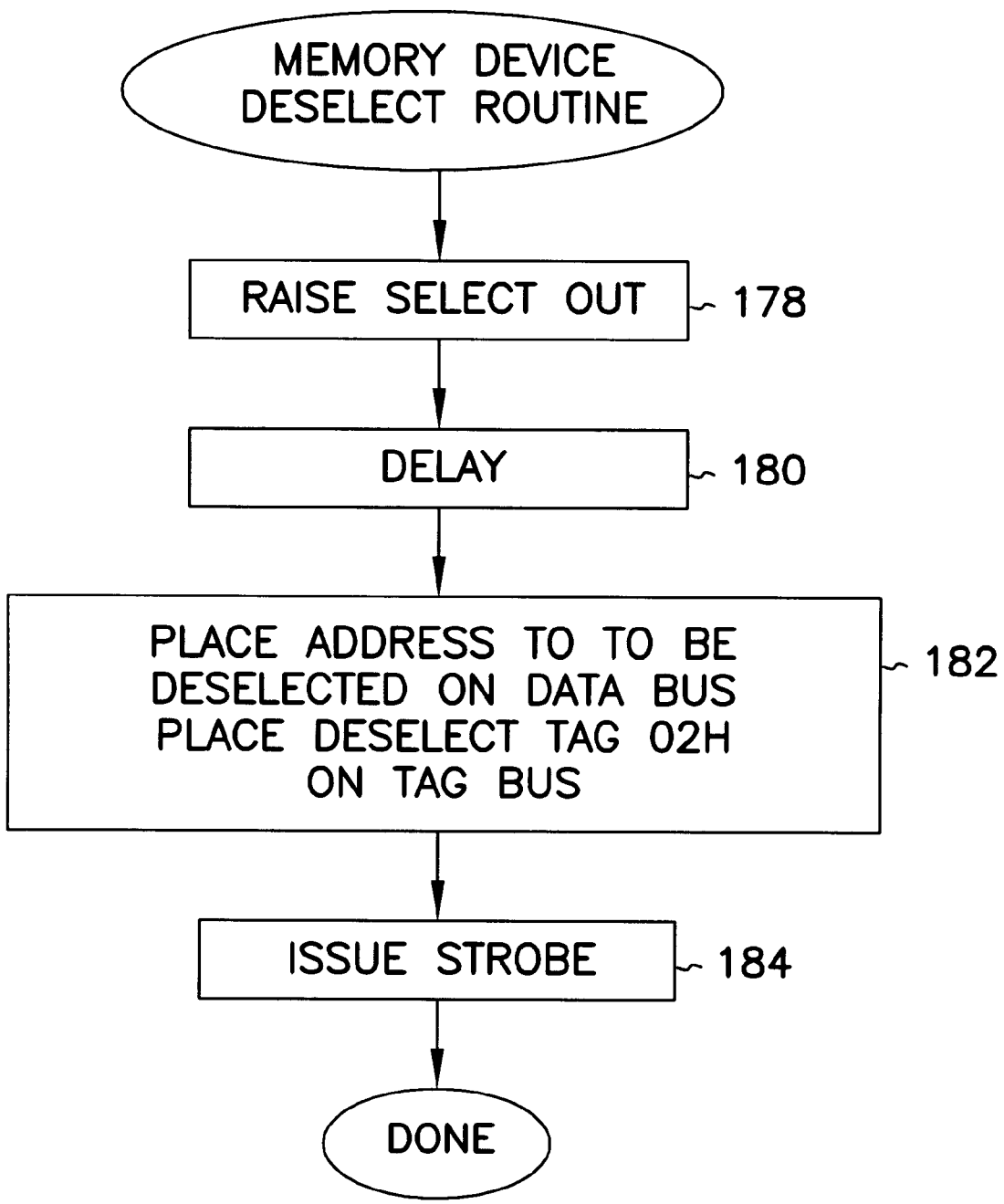
FIG. 15 is a flow chart depicting the sequence for deselecting one of the memory devices.

The timing diagram of FIG. 8A further illustrates the manner in which a selected Memory Device 38 can be deselected using Tag 02H. FIG. 15 is a flow chart illustrating the sequence for deselecting a Memory Device 38. As indicated by the last row of the table of FIG. 6, Tag 02H with modifier D7 set to "0" will cause a device to be deselected. Thus, assuming that Device 38A is to be deselected, Tag 02H will be placed on the Tag Bus and 00H will be placed on the Data Bus.

As indicted by element 178 of the FIG. 15 flow chart, Controller 36 first causes signal Sel In 0 to go active in the event it was not already active. This will propagate to each of the Memory Devices 38, with Controller 36 waiting a predetermined amount of time as indicated by element 180 of the flow chart. This will cause signal Input Enable (IEN) of the Memory Devices 38 to go active. Note that this step can be skipped since signal Input Enable (IEN) will usually be active on all Devices that are in a selected state by virtue of gate 106. Controller 36 will then place Tag 02H on the Tag Bus and 00H on the Data Bus as shown in the FIG. 8A timing diagram and as indicated by element 182 of the FIG. 15 flow chart. Comparator 76 of Memory Device 38A will then generate signal Match. In addition, Global Tag Decoder 92 will detect the presence of Tag 02H on the Tag Bus and will also detect that D7 on the Data Bus is set to a "0" and thereby produce an active signal on line 91. Signal Match and line 91 (Tag 02, D7=0), along with signal SLP are connected to respective inputs of an AND gate 110, the output of which is connected to the K input of Dev Sel flip-flop 74 by way of an OR gate 112. Controller 36 will then issue a Strobe signal thereby clocking flip-flop 74 on the falling edge so that signal Dev Sel becomes inactive thereby causing Device 38A to be deselected. Note that signal Lock Out is still active so that, among other things, the Address ID Latch 78 containing the assigned address for the Memory Device 38A cannot be altered.

As indicated by the third row of the FIG. 6 table, the Memory Devices 38 are all set to a reset state by the Power On Reset circuit 70 which generates signal $\overline{Low}$ $\overline{Vcc}$. When the Device 38 is in the reset state, Lock Out flip-flop 72, Dev Sel flip-flop 74, Sleep flip-flop 71 of all of the Memory Devices 38 are reset by the output of NOR gate 86 so that the corresponding signals are inactive. In addition, the Address ID Latches 78 are all reset to zeros by signal $\overline{Low}$ $\overline{Vcc}$ by way of NOR gate 86, inverter 83 and NOR gate 99. Assuming that signal Sel In is inactive, Signal Input Enable (IEN) is inactive so that the Input Buffers 48, 50 and 52A are in a low power, disabled state. In addition, the Control Registers are all reset in this mode thereby causing the memory circuitry associated with each Register to assume a disabled state so as to consume no power, as previously noted.

Tag commands can also be used to reset the Memory Devices 38. A Global Reset command, Tag 01H with modifier bit D0 set to "1" will reset all Memory Devices 38 irrespective of whether the Device is in a selected state (Dev Sel active). This command is depicted in the first row of the FIG. 6 table. When the Global Reset command is detected by the Global Tag Decoder 92 of a Memory Device, the signal on line 87 out of Decoder 92 becomes active. This signal is connected to one input of AND gate 103, with the second input being connected to receive signal Strobe (buffered). Thus, when Tag 01H, D0=1 is active and signal Strobe changes state to active high, the output of OR gate 86 will go low. This will cause flip-flops 71 (Sleep), 72 (Lock Out) and 74 (Dev Sel) to be reset by gate 86 and will cause the Address ID Latch 78 to be reset by way of inverter 83 and NOR gate 99. In addition, the output on line 87 of the Global Tag Decoder 92 is connected to one input of a NOR gate 102, with the output of gate 102 being connected to one input of an AND gate 101. The second input of gate 101 receives signal Strobe (buffered), with the output of gate 101 being connected to a second input of NOR gate 99. Thus, when line 87 at the output of Global Tag Decoder 92 becomes active when Tag 01, D0=1, and signal Strobe changes state to active high, the Address ID Latch 78 is cleared by the output of NOR gate 99.

It is also possible to reset only those Memory Devices 38 that are in a selected state (Dev Sel active). Row 2 of the FIG. 6 depicts a Local Reset Command which resets only those Memory Devices where Dev Sel is active. As can be seen in FIG. 5, the Global Tag Decoder 92 receives signal Dev Sel from flip-flop 74. When Controller 36 places Tag 0FH on the Tag Bus and 01H on the Data Bus (D0=1), the Global Tag Decoder 92 output on line 95 will go active for those Memory Devices where Dev Sel is active. The K input of Dev Sel flip-flop 74 will go high when the Tag Decoder output on line 95 is active by virtue of the connection of line 95 to an input of an OR gate 102 and the connection between the output of OR gate 102 to an input of OR gate 112. Thus, when signal Strobe (buffered) changes state to active high, Dev Sel flip-flop 74 will be reset so that signal Dev Sel goes inactive.

Continuing, the active signal on line 95 of the 25 Global Tag Decoder 92 is active, the K input of the Sleep flip-flop 71 will be high since the output of OR gate 102 is connected to one input of OR gate 104. Thus, when signal Strobe (buffered) changes state to active high, Sleep flip-flop 71 will be reset so that 30 signal Sleep (SLP) goes inactive.

Finally, the OR gate 102 is connected to the K input of Lock Out flip-flop 72. Flip-flop 71 will therefore be reset when signal Strobe (buffered) changes state thereby making signal Lock Out (LOUT) go inactive. The output of OR gate 102 is also connected to one input of AND gate 101, with the second input of gate 101 receiving signal Strobe (buffered). The output of gate 101 is connected to the reset input of Address ID Latch 78 so that Latch 78 will be cleared of any local address.

As previously noted, it is possible to command one or more of the Memory Devices 38 to a Sleep mode which is similar to the reset mode except that the Address ID Latch 78 is not cleared. As shown in row five of the FIG. 6 table, Tag 01H, D=1, functions to set all Memory Devices 38 which have previously been assigned an address which is stored in Address ID Latch 78 into the Sleep mode. As shown in row six of the table, Tag 0FH, D=1, Dev Sel, is used to place Memory Devices 38 which are in the selected state (Dev Sel "1") in the Sleep mode. When the Control Registers are reset when in the Sleep mode and other reset modes, the register contents are all zeros. The CMOS memory control circuits controlled by these registers are implemented so that they will entered a disabled state under these conditions so that they will consume essentially no power.

Assuming that Tag 01H, D1=1, are placed on the Tag and Data buses, respectively, the Global Tag Decoder 92 output on line 107 will go active. Line 107 is connected to one input of OR gate 105 so that the Sleep flip-flop 71 will be set when signal Strobe (buffered) changes state to active high. Among other things, when in the Sleep state ($\overline{\text{SLP}}$ is a "0"), AND gate 106 is disabled to that signal Input Enable can be made active only by way of the Sel In signal. Further, signal $\overline{\text{SLP}}$ will disable AND gates 100 and 110 so that an active signal Match cannot be used to change the state of the Dev Sel flip-flop 74.

When Controller 36 issues Tag 0FH, D1=1, the Global Tag Decoder 92 output on line 109 becomes active for every Memory Device 38 which is selected (Dev Sel active). Line 109 is connected to one of the inputs of NOR gate 105 so that the K input of the Sleep flip-flop 71 will be high. Thus, when signal Strobe (buffered) changes state to active high, signal Sleep (SLP) will become active and the Memory Device will enter the Sleep mode.

As can be seen from the table of FIG. 6, Sleep flip-flop 71 can be reset in various ways, including by way of Tag 01H, D0=1 which causes the flip-flop to be reset through the clear input and Tag 01H, D2=1; Tag 0FH, D0=1; Tag 01H, D0=1 and Tag 0FH, D2=1, any of which will cause the output of OR gate 104, the output of which is connected to the K input of flip-flop 71, to be active when signal Strobe (buffered) changes state to active high. This will cause signal Sleep to become inactive so that the Memory Device is no longer in the Sleep mode.

The FIG. 3A memory system is organized in a serial select configuration. As previously described, FIG. 3B is a block diagram of a memory system arranged in a combination serial and radial select configuration. Three banks of Memory Devices 38 are shown, with each bank having N number of Devices. Although not shown in FIG. 3B, each Memory Device 38 of the system is connected to common Tag Bus 40 and Data Bus 42 and Strobe line 44. Controller 36A is configured to provide a separate signal Sel In to each of the banks of Memory Devices 38. The number of banks of Memory Devices 38 can be increased by configuring Controller 36A to produce additional independently controlled signal Sel In.

The sequence for assigning addresses to the Memory Devices 38 for the memory system of FIG. 3B is similar to the sequence described in connection with FIG. 3A. Controller 36A carries out the assignment sequence one bank at a time, starting for example, with the first bank connected to line 46A carrying signal Sel In 0. The signals Sel In connected to the remaining two banks are left inactive when addresses are assigned to the first bank. Once the first bank addresses are assigned, signal Sel In 0 is made inactive and signal Sel In 0A is made active so that the second bank addresses can be assigned. This process is continued until all of the banks have been assigned addresses. Additional banks of Memory Devices 38 can be accommodated by configuring Controller 36A to provide additional signals Sel In.

As previously noted, Memory Device 38 is placed in the device-enabled state, the Controller 36 has the ability to perform various memory functions on the Memory Device 38, including memory read and memory program operations. The device-enabled state is entered whenever both signals Input Enable, produced by gate 80 (FIG. 5), and Decoder Enable, produced by gate 82, are active. The Command Decoder Logic block 62 (FIG. 4), which includes the Logic Tag Decoder 84 (FIG. 5) functions primarily to decode certain commands that are placed on the Tag Bus 40 by the Controller 36. As will become further apparent, the subject system provides a very high degree of flexibility so that a wide variety of memory operations can be controlled by Controller 36 so as to, among other things, accommodate different types or versions of Memory Devices 38. This is accomplished, in part, by utilizing Controller 36 to control the various detailed steps necessary to carry such memory operations as programming, reading and erasing. The exemplary system will be described, as previously noted, as a system which emulates the operation of a conventional hard disk drive, with the PCMCIA signals provided to Controller 36 (FIG. 3A).

Figure 9:
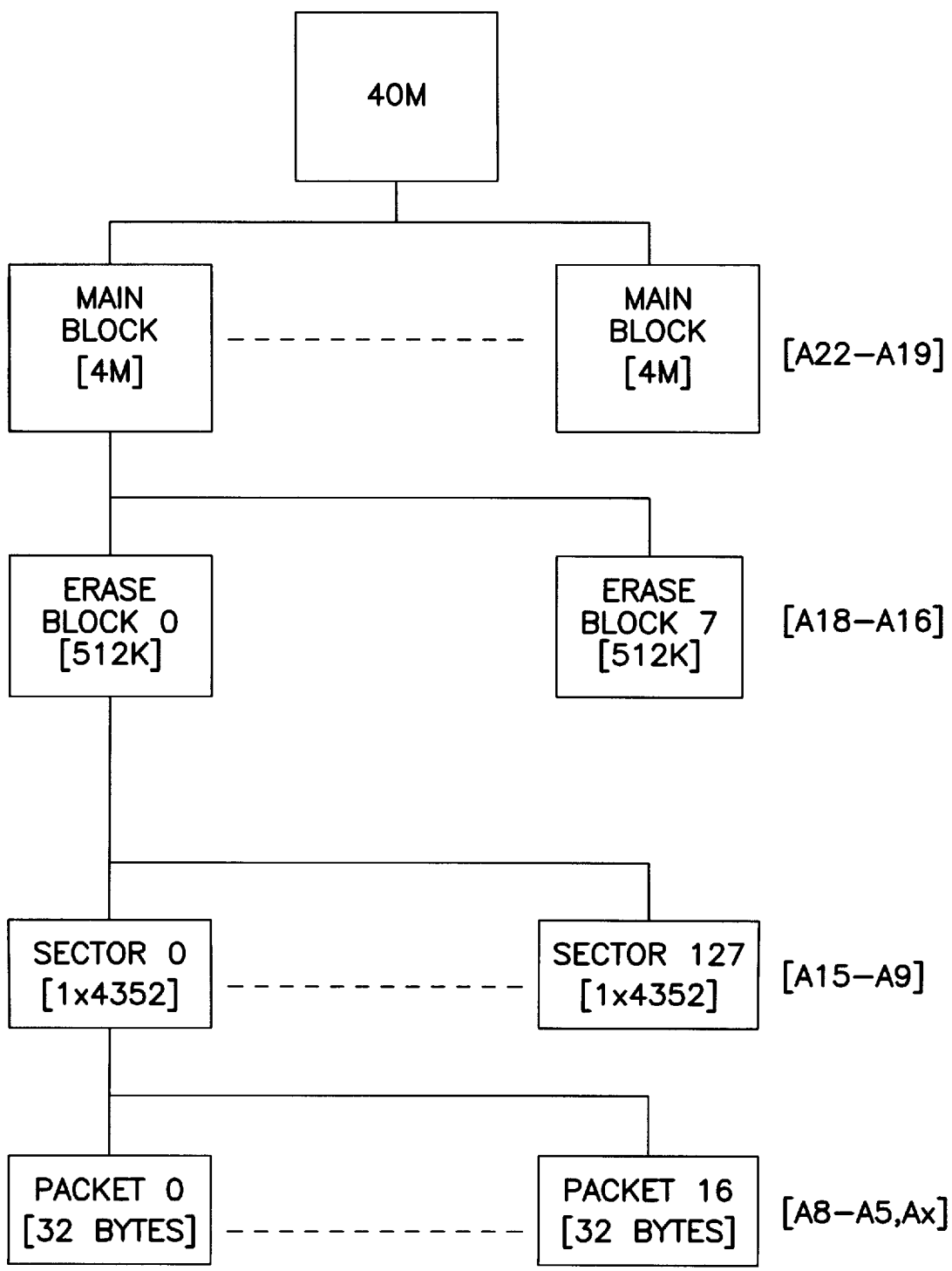
FIG. 9 is block diagram showing the organization of the memory flash cell array for each of the FIG. 3A and FIG. 3B Memory Devices 38.

FIG. 9 is a simplified diagram of the organization of an exemplary flash memory array for use on a single one of the Memory Devices 38. The total capacity of the array is 40 Megabits. The array has a total of ten Main Blocks, each having a capacity of four Megabits, which are addressed using addresses $A_{22}$–$A_{19}$. Each four Megabit Main Block is made up of eight 512 k bit Erase Blocks which are addressed using addresses $A_{18}$–$A_{16}$. The Erase Blocks have separate common source line which permit the Erase Blocks to be separately erased. Continuing, each Erase Block consists of 128 Sectors, with each Sector storing 4352 bits. The Sectors are addressed using addresses $A_{15}$–$A_9$. Finally, each Sector consists of 17 Packets, with the Packets being addressed by $A_8$–$A_5$, $A_x$. Address $A_x$ is used to decode the 17th packet, with the 17th packet typically containing certain overhead bits such as error correction codes and the like.

Figure 10:
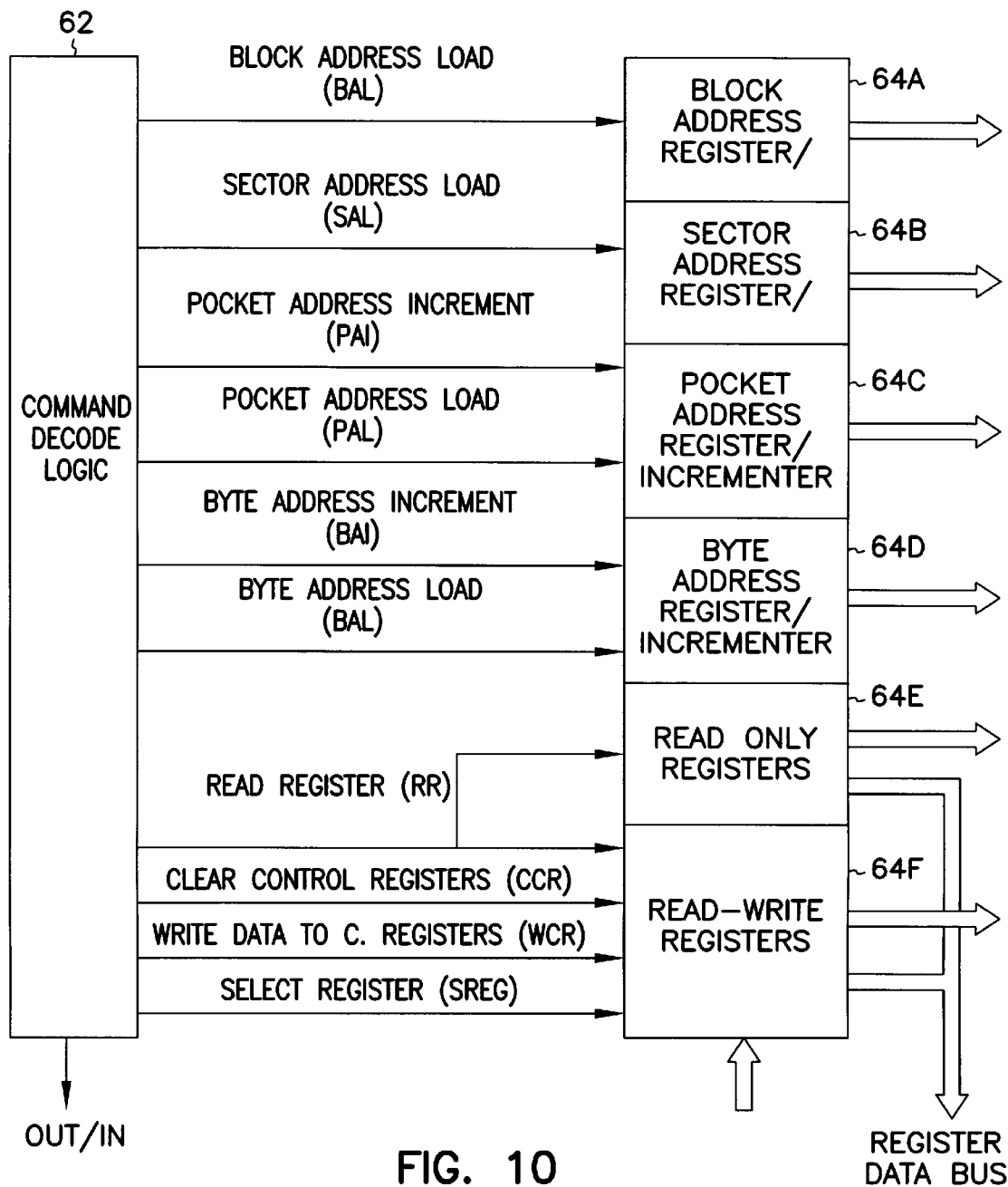
FIG. 10 is a more detailed diagram of the Command Decoder Logic block and of the Register block of the FIG. 4 interface circuitry.

FIG. 10 is a more detailed diagram of the Command Decoder Logic block 62 and the Register block 64 of FIG. 4. The various signals originating from the Command Decoder Logic block 62 that are provided to the various registers than make up the Register block 66 are briefly described in the following Table 1.

TABLE 1

| | |
|---|---|
| Byte Address Increment (BAI) | Increments the Byte Address Register (FIG. 12E). |
| Byte Address Load (BAL) | Loads the Byte Address Register (FIG. 12E) with the byte address present on the Data Bus [D0–D4] |
| Block Address Load (BLAL) | Loads the Block Address Register (FIG. 12B) with the block address present on the Data Bus [D0–D6] |
| Packet Address Increment (PAI) | Increments the Packet Address Register (FIG. 12D). |
| Packet Address Load (PAL) | Loads the Packet Address Register (FIG. 12D) with the packet address present on the Data Bus [D0–D4] |
| Sector Address Load (SAL) | Load the Sector Address Register (FIG. 12C) with the sector address present on the Data Bus [D0–D7] |
| Select Control Register (SCR) | Selects a Control Register based upon data on the Data Bus [D0–D4] |
| Read Control Register (RCR) | Causes the contents of a selected Control Register to be outputted to the Register Data Bus 59 (FIG. 4) |
| Clear Control Registers (CCR) | Clears all Control Registers. |
| Write Control Registers (WCR) | Loads data from the Data Bus [D0–D7] to the selected Control Register by way of bus 58 (FIG. 4). |
| Read Data Register (RDR) | Transfers contents of the selected Data Register to the Register Data Bus 55 (FIG. 4). |
| Write Data Register (WDR) | Transfers contents of the Data Bus 58 (FIG. 4) onto the selected Data Register for programming using the Byte Address. |
| Load Sense Amp Data (LSAD) | Load Sense Amplifier Data into Sense Amp latch 132 (FIG. 17). |

TABLE 1-continued

| | |
|---|---|
| Out/In (O/I) | Controls direction of I/O Data Buffers 52 when signal Input Enable (IEN) is active. When O/I is a "1", the Data Bus 42 is driven and when "0" the Data Bus inputs data. |
| Low Power (LPWR) | Indicates the low power state and is active when in the Sleep Mode (Sleep = "1") and when the Lock Out not active (L OUT = "0") provided Sel In inactive. |

FIG. 11 is a truth table for the Command Decoder Logic showing various selected inputs and selected Decoder Logic outputs. The inputs include data placed on the Tag Bus 40 and on the Data Bus 42, signal Lock Out (latch 72 of FIG. 5), signal Sleep (latch 71 of FIG. 5), signal Dev Sel (latch 74 of FIG. 5) and Decoder Enable (gate 82 of FIG. 5).

The various registers represented by block 64 are used to carry out a broad array of memory operations. The number of such registers used depends upon the number of memory functions that are to be controlled, as will be explained. In a typical system, there may be up to and exceeding a dozen different registers, with each register being capable of storing eight bits of data. In order to maximize the flexibility of the system, it is possible to address each of the registers, to write to the registers and to read back the contents of the registers. In addition, there is the capability of clearing the registers either locally or globally, although some registers do not require this capability. There are some registers that are read only registers that can be used in test modes to read out internal signals.

In order to carry out the four register operations (address, write, read and clear), there are four commands that are placed on the Tag Bus 40. These commands are sometimes referred to herein as Tag Commands. A first Tag Command (0BH) is used to select a register, with the address of the register being placed on the Data Bus 42. A second Tag Command (0CH), functions to write to a selected register, with the Data Bus 42 containing the data to be written into the register. A third Tag Command (1AH) is used to read the contents of a selected register. Finally, a fourth Tag Command (0FH), which was previously described in connection with the Select Logic circuitry, is used to clear all of the registers that are clearable when the associated modifier bits D2–D7 are set to 001000. As can be seen in the table of FIG. 10, there are several Tag Commands in addition to the four commands just described.

Registers

As previously noted, a memory system in accordance with the present invention preferably utilizes an array of registers that are used to control memory functions. As will be explained, memory operations such as read operations are carried out by performing one or more individual suboperations. It is desirable to maximize the number of memory functions that can be controlled by Controller 36 so as to provide as much flexibility as possible.

Figure 21:
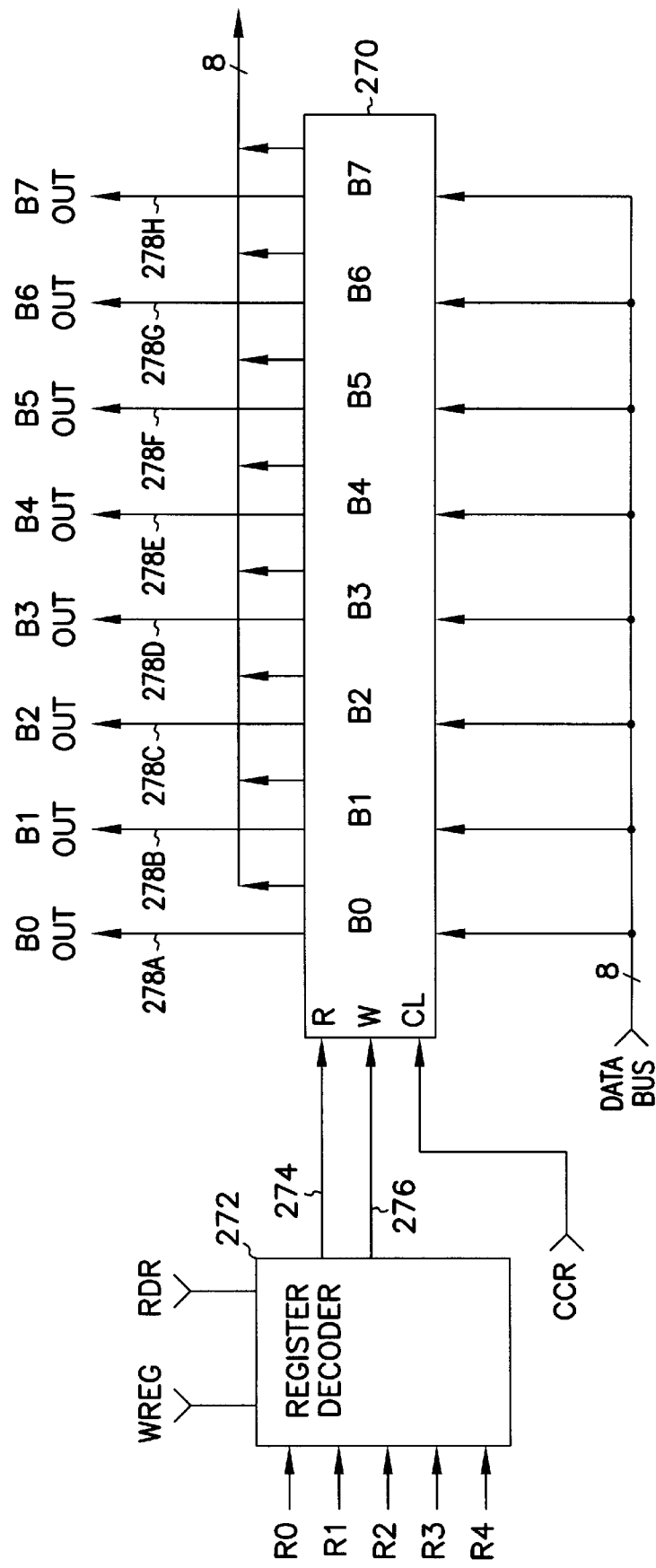
FIG. 21 is a schematic diagram of one of the control registers used to control operation of the memory device together with associated decoder circuitry.

An exemplary Control Register 270 and some of the associated circuitry, including a Register Decoder 272, is shown in FIG. 21. A typical Memory Device 38 may utilize ten or more such registers. Each of the registers has a unique five bit address, R0–R4, which is also sometimes referred to as the name of the register when expressed in Hexadecimal format.

With certain exceptions, the registers must be accessed prior to performing operations on the registers. This is accomplished by the issuance of a Tag Command 0BH on the Tag Bus along with the address of the register on the Data Bus (Table 1). Tag Command 0BH causes the address R0–R4 present on the Data Bus to be presented to the Register Decoder 272. Only the Decoder 272 having the corresponding address will respond by becoming enabled.

Once a register has been selected in this manner, data can be loaded into or out of the register, as will be explained. In addition, certain registers may be accessed directly without the use of Tag Command 0BH, as will be explained.

Referring to the drawings, FIG. 12A is a diagram representing Register 00H, sometimes referred to as the ID Code register. Register 00H has an address 00H (00000000) which is used to select the register. Register 00H, the ID Code Register, contains eight bits which identify the memory type which can be read out by the user. Register 00H is hard wired and thus cannot be modified.

Register 01H is the Block Address Register (FIG. 12B) which holds the seven most significant bits of the address ($A_{22}$ to $A_{16}$) to be used in connection with a Memory Device 38 during memory read, program and erase operations. As previously noted in connection with FIG. 9, the addresses stored in Register 01H are used to address separate ones of the Erase Blocks. The Sector Address Register, Register 02H (FIG. 12C), contains the intermediate addresses ($A_{15}$ to $A_9$) to be used in connection with a Memory Device 38. These addresses identify one of the Sectors of the memory array. Register 03H, the Packet Address Register (FIG. 12D), contains further intermediate addresses ($A_8$ to $A_5$ and $A_x$) which identify one of the Packets of the array. Finally, Register 04H, the Byte Address Register (FIG. 12E), contains the least significant addresses ($A_4$ to $A_0$) which identify one of the bytes of the array.

Note that the four address registers can be accessed directly, without the use of Tag Command 0BH, by using special dedicated Tag Commands. As can be seen by the table of FIG. 11, dedicated Tag Commands 05H, 04H, 03H, and 09H can be used to load addresses into the Erase Block Register (01H), the Sector Address Register (02H), the Packet Address Register (03H) and the Byte Address Register (04H), respectively, without the necessity of first selecting the address registers.

The Packet Address Register (FIG. 12D) is designed so that an address loaded into the register can be sequentially incremented so that group of Packets can be sequentially addressed. Controller 36 need only provide an initial address, if the initial address is other than zero. The Packet Address Register includes a Bit 7 that enables and disables an increment function, with a "1" enabling the function. When the increment function is enabled, the Packet Address is incremented under circumstances to be described. The Packet Address Register can also be incremented independent of the state of Bit 7 using Tag Command 07H as shown in the table of FIG. 11. As noted in Table 1, when Tag Command 07H is decoded by Local Tag Decoder 84, the Command Decoder Logic 62 (FIG. 10) will issue signal Packet Address Increment (PAI) which will cause the packet address in the Packet Address Register to increment, provided the increment function is enabled as indicated by Bit 7 of the Packet Address Register.

The Byte Address Register (FIG. 12E) is also capable of being incremented using Tag Command 09H depending upon the state of Bit 7 of the Byte Address Register. As can be seen in the table of FIG. 11, this increment function is controlled by the state of modifier bit D7 on the Data Bus when Tag 09H is issued. When the increment function is enabled, issuance of Tag Command 0DH (FIG. 11) will cause the Command Decode Logic 62 to generate signal Byte Address Increment (BAI) which will increment the address in the Byte Address Register.

Figure 22:
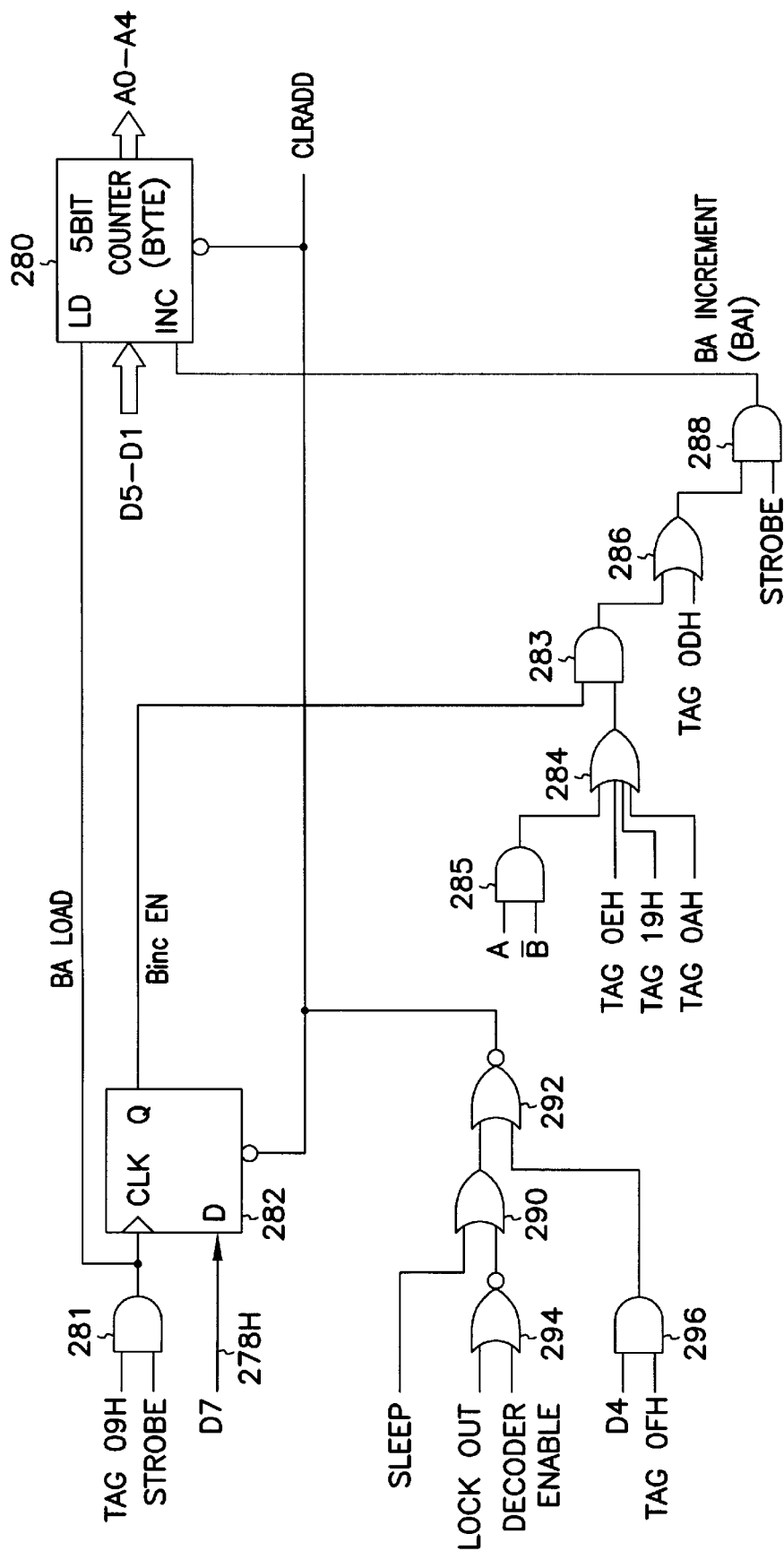
FIG. 22 is a schematic diagram of the Byte Address Counter and associated circuitry.

FIG. 22 is a simplified diagram of the circuitry used for carrying out the Byte address increment function previously noted. Controller 36 will issue Tag Command 09H used for loading the Byte Address and for controlling the increment function. As can be seen from the table of FIG. 11, Controller 36 will also place bits D4–D0 on the Data Bus 42 which represent memory addresses $A_4$ to $A_0$ together with bit D7 set to control the byte increment function. Data bits D5–D6 are don't cares.

The FIG. 12E Byte Address Register is implemented in the form of a flip-flop 282 and a five bit ripple counter 280. The output of flip-flop 282 is represented by Bit 7 of the Byte Address Counter and the five bit output of counter 280 is represented by Bits 1–5 of the Byte Address counter 280. As previously noted, the Byte Address Register (flip-flop 282 and counter 280) does not need to be selected by Tag Command 0BH in order to be loaded. As can be seen in the table of FIG. 11, Tag Command 09H is used to load a five bit Byte Address into counter 280 and is used to control the enable function of the Byte Address Counter. The address bits and enable bit is placed on the Data Bus together with the Tag Command 09H.

Bits D4–D0 from the Data Bus are provided to the inputs of the five bit ripple counter 280 (FIG. 22), with the output of counter 280 (Byte Address Counter) being addresses $A_0$–$A_4$ which define a Byte to be read out of the memory. An AND gate 281 is provided which will generate a signal Byte Address Load (BA Load) when Tag 09H is detected along with signal Strobe. Counter 280 is transparent so that the Byte address D4–D0 loaded into the counter will be used to read a single Byte if the increment function is disabled.

Bit D7 on the Data Bus is set to a "1" in the event the Byte increment function is to be enabled. This bit is connected to the D input of flip-flop 282 which is initially in a reset state so that the Q output of the flip-flop will be set when gate 281 generates BA Load. The Q output, signal Binc En, is connected to an input of an AND gate 283 with the other inputs being connected to receive three outputs of Local Tag Decoder 84 (FIG. 5) by way of an OR gate 284. Those outputs are Tag 0EH, 19H and 0AH. The output of gate 283 is, in turn, connected to one input of an OR gate 286, with the other input connected to receive a further output of the Local Tag Decoder, Tag 0DH. Finally, the output of gate 286 is connected to an input of an AND gate 288, with the remaining output of gate 288 receiving signal Strobe. The output of gate 288 generates signal BA Increment (BAI) which is connected to the increment input of counter 280 and will cause the counter to increment.

Assuming that signal Binc En is active, counter 280 will increment when any one of Tags 0EH, 19H and 0AH are received. As can be seen in the Table of FIG. 11, Tag 0E causes signal Load Sense Amp Data (LSAD) to be generated so that data read out of the memory will be stored in the Sense Amplifier latches, as will be described. Once the data is latched, a subsequent Byte can then be read when the Byte Address Counter 280 is incremented. Tag 19H is used to read data and will operate to increment Byte Address Counter 280 when the increment function of the counter is enabled. Finally, Tag 0AH is used to load the data to be programmed, and will also cause the Byte Address Counter 280 to increment when the increment function is enabled.

As can be seen from the inputs to OR gate 286, when Tag 0DH is detected, the Byte Address counter 280 will be incremented independent of the state of the increment enable signal Binc En. The table of FIG. 11 shows Tag 0DH is a special tag used exclusively to increment the Byte address counter 280. Signal CLRADD is a reset signal used to reset the various components that make up the Byte Address Register (FIG. 12E) and the Packet Address Register (FIG. 12D). Flip-flop 282 is reset by signal CLRADD under various conditions as can be seen from FIG. 22. By way of example, when signal Sleep is produced, flip-flop 282 will be reset by way of OR gate 290 and NOR gate 292. Similarly, when signals Lockout (LOUT) and Decoder Enable (DEN) are both active, flip-flop 282 will be reset by way of an NOR gate 294, OR gate 290 and NOR gate 292. In addition, when Tag 0FH is detected and D4=1 is placed on the Data Bus, flip-flop 282 will be reset by way of AND gate 296 and NOR gate 292.

Figure 23:
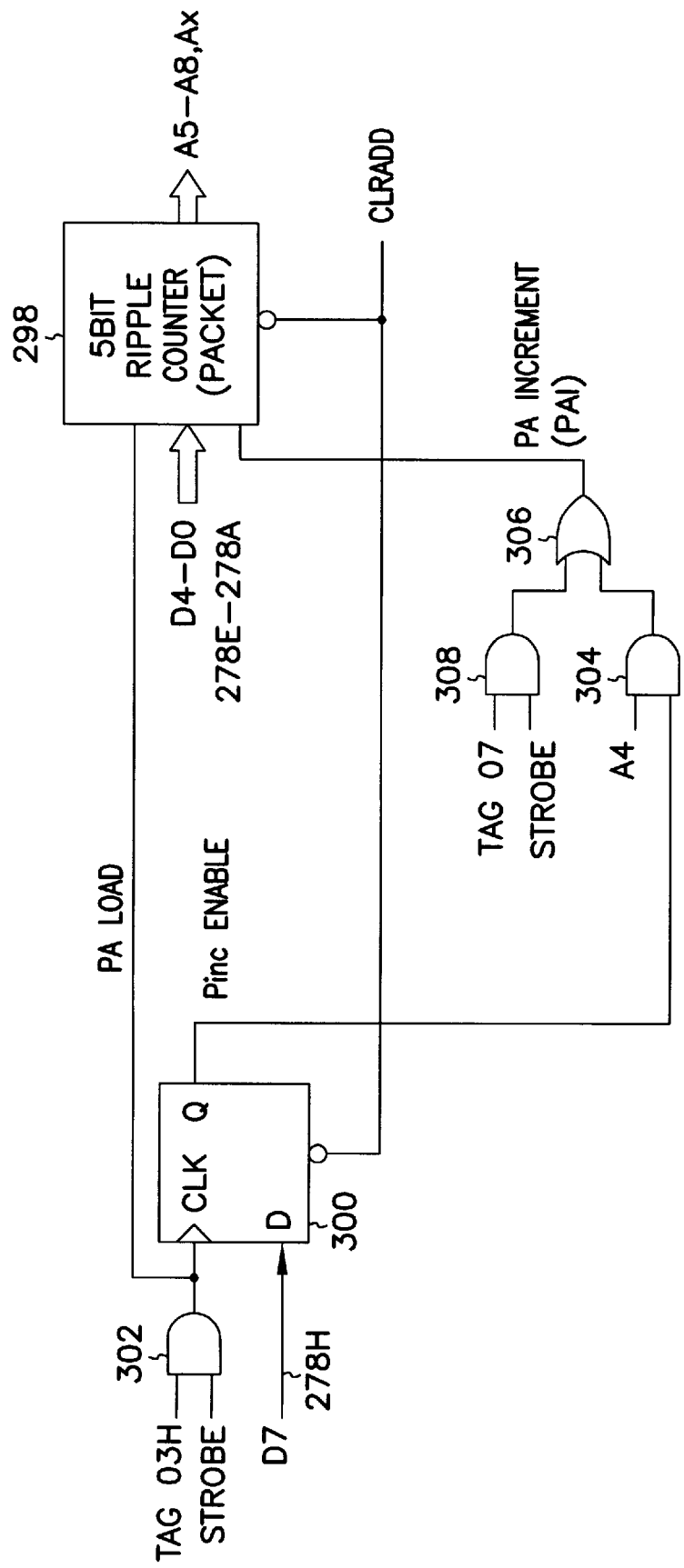
FIG. 23 is a schematic diagram of the Packet Address Counter and associated circuitry.

FIG. 23 shows circuitry which comprises the Packet Address Register (FIG. 12D). The register includes a Packet Address Counter 298 having inputs connected receive bits D4–D0 from the Data Bus and a flip-flop 300. As shown in the table of FIG. 11, Tag 03H is used to load the five bits of data which correspond to Packet Address ($A_5$–$A_8$, $A_x$) into Counter 298. In addition bit D7 on the Data Bus is used to control the increment function of Counter 298. Signal Packet Address Load (PA Load), which is used to load Counter 298, is generated by an AND gate 302 when Tag 03H is detected and signal Strobe is generated.

Flip-flop 300 is used to generate a signal Pinc En which is connected to the increment input of the Packet Address Counter 298. If bit D7 on the Data Bus is set to a "1" so that the increment function is to be enabled, flip-flop 300 will be set so that signal Packet Address Increment Enable (Pinc En) is active. Signal Pinc En is connected to one input of an AND gate 304, with signal $A_4$ being connected to the other input. Signal $A_4$ is generated by the Byte Address Counter 280 of FIG. 22. As will be explained, the Packet Address Counter will be incremented when both signal Pinc En is active and when the Byte Address Counter $A_4$ switches from a "1" to a "0".

As can also be seen from the table of FIG. 11, Tag 07H can be used to cause the Packet Address Counter 298 to increment independent of signal Pinc En. When Tag 07H is detected and signal Strobe is produced, it can be seen that Counter 298 will be incremented once by way of AND gate 308 and OR gate 306. Note also that flip-flop 300 and Counter 298 are reset by signal CLRADD, the same signal used to reset the Byte Address Counter 280 (FIG. 22) and associated flip-flop 282.

Figure 24A:
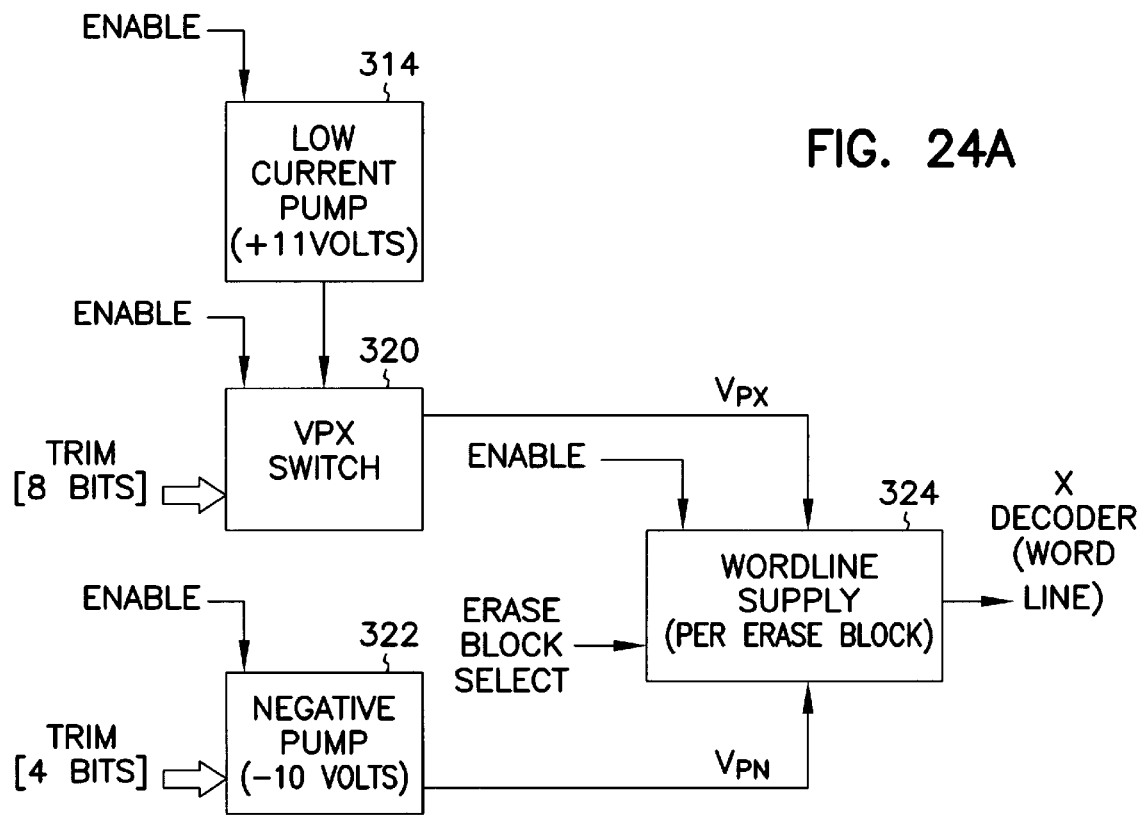
FIGS. 24A and 24B are block diagrams of the charge pump circuits used to provide the various voltages used in carrying out memory read, program, erase and other operations.
Figure 24B:
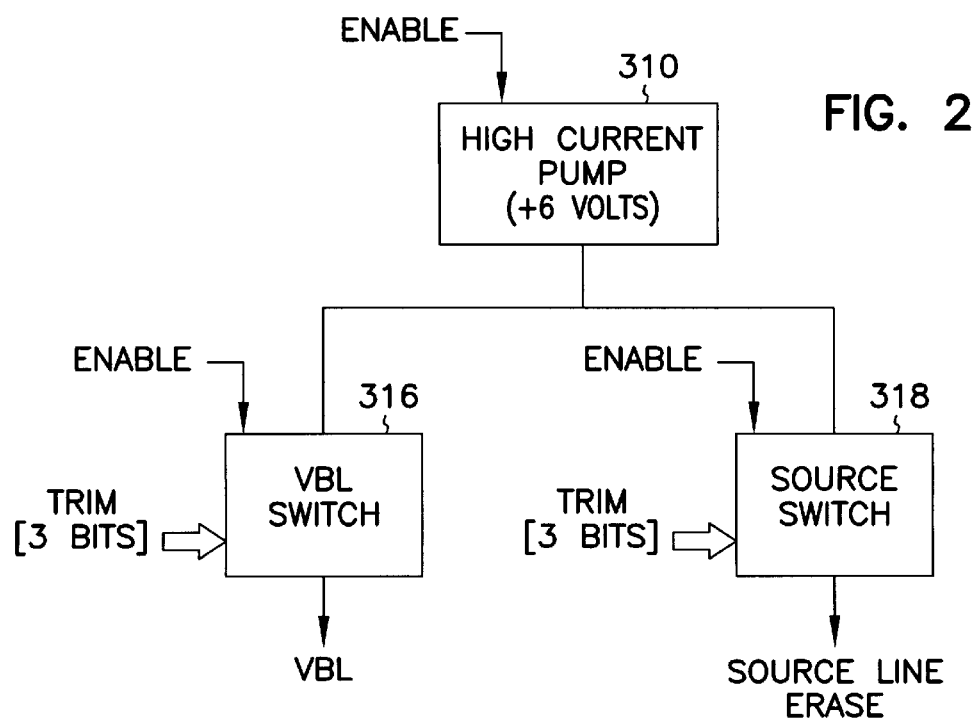

Additional Control Registers and the functions performed by the Registers will be described as part of the following description of basic memory operations, including memory read, program and erase operations. It should be noted that each Memory Device 38 includes various sources of voltages used for carrying out these memory operations, as can be seen in FIGS. 24A and 24B. In the present example, a High Current Charge Pump circuit 310 (FIG. 24B) is provided that is capable of generating a positive output voltage in the range of +6 volts. A VBL Switch circuit 316 is used to control the magnitude of the Charge Pump Circuit 310 output voltage and to forward the voltage VBL to the Y Decoder circuitry to be applied to the Bit Lines during memory operations. Three trim bits are used to control the magnitude of voltage VBL, with these bits being set by one of the Control Registers to be described. The output of the High Current Charge Pump 310 is also connected to a Source Switch circuit 318 having an output to be connected to the Source Line of a selected one of the Erase Blocks during an erase operation. Circuit 318 has three trim bits that are used to control the magnitude of the Source Line Erase voltage.

A Low Current Charge Pump circuit 314 is also provided (FIG. 24C) which is capable of generating a positive voltage in the range of +11 volts. A VPX Switch circuit 320 is included having eight trim bits that are used to adjust the magnitude of the voltage VPX derived from charge pump circuit 314 output. As is well known, voltage VPX is forwarded to the X Decoder circuitry and is applied to selected Word Lines depending upon the memory address during memory operations. A Negative Charge Pump circuit 322 generates a negative voltage having a range of approximately −10 volts. Four trim bits are provided for controlling the magnitude of the negative voltage VN produced by circuit 322. Negative voltage VN is applied to the Word Lines by way of the X Decoder circuit during memory operations erase operations.

A Word Line Supply circuit 324 is also included for applying the Word Line voltage to the Word Lines by way of the X Decoder circuitry. Unlike the other circuitry depicted in FIGS. 24A and 24B which is common to the entire Memory Device 38, the Word Line Supply circuitry 324 is repeated for each of the eighty Erase Blocks of the Memory Device. When the Erase input of the Word Line Supply circuit 324 is active an Erase Block is to be erased, with such Erase Block associated with the Supply circuitry 324 being the selected Erase Block or a deselected Erase Block. If the Erase Block is the selected Block, signal Erase Block will be active, otherwise the signal is inactive.

When signals Erase and Erase Block Select are both active, the associated Erase Block is the selected Block. In that event, Word Line Supply circuit 324 will function to connect negative voltage VPN to the X Decoder circuit for application to all of the Word Lines of the selected Erase Block. When signal Erase is active, but signal Erase Block is inactive, an Erase Block other than the Block associated with the Supply circuit 324 is to be erased. In the event, primary supply voltage VCC is provided to the X Decoder circuit of the deselected Block. VCC is also provided to the Decoder when neither the Erase signal nor the Erase Block select are active. Finally, when Erase Block is active, but Erase is inactive, an operation other than an erase operation is to be carried out on the associated Erase Block. In that event, Word Line Supply circuit 324 applies positive voltage VPX to the Word Lines by way of the X Decoder.

Read Operations

As is well known, flash memory cells have threshold voltages which vary depending upon whether the cell is in an erased state or a programmed state. The threshold voltage is typically defined as the control gate to source voltage across the cell necessary for the cell to conduct one microampere of current for a drain voltage of +1 volt. An erased cell has a relatively low threshold voltage ($V_{THE}$), +3 volts for example, and a programmed cell has a relatively high threshold voltage ($V_{THP}$), +5 volts, for example. In a read operation, the memory system will operate to ground the source of the cell being read and will apply an appropriate voltage to the control gate by way of the associated Word Line. The drain of the cell, which is connected to the associated Bit Line, is typically set to a small positive voltage such as +1 volt. If the cell has been programmed, the current through the cell will be relatively small and if the cell is in an erased state the current will be relatively high.

Figure 17:
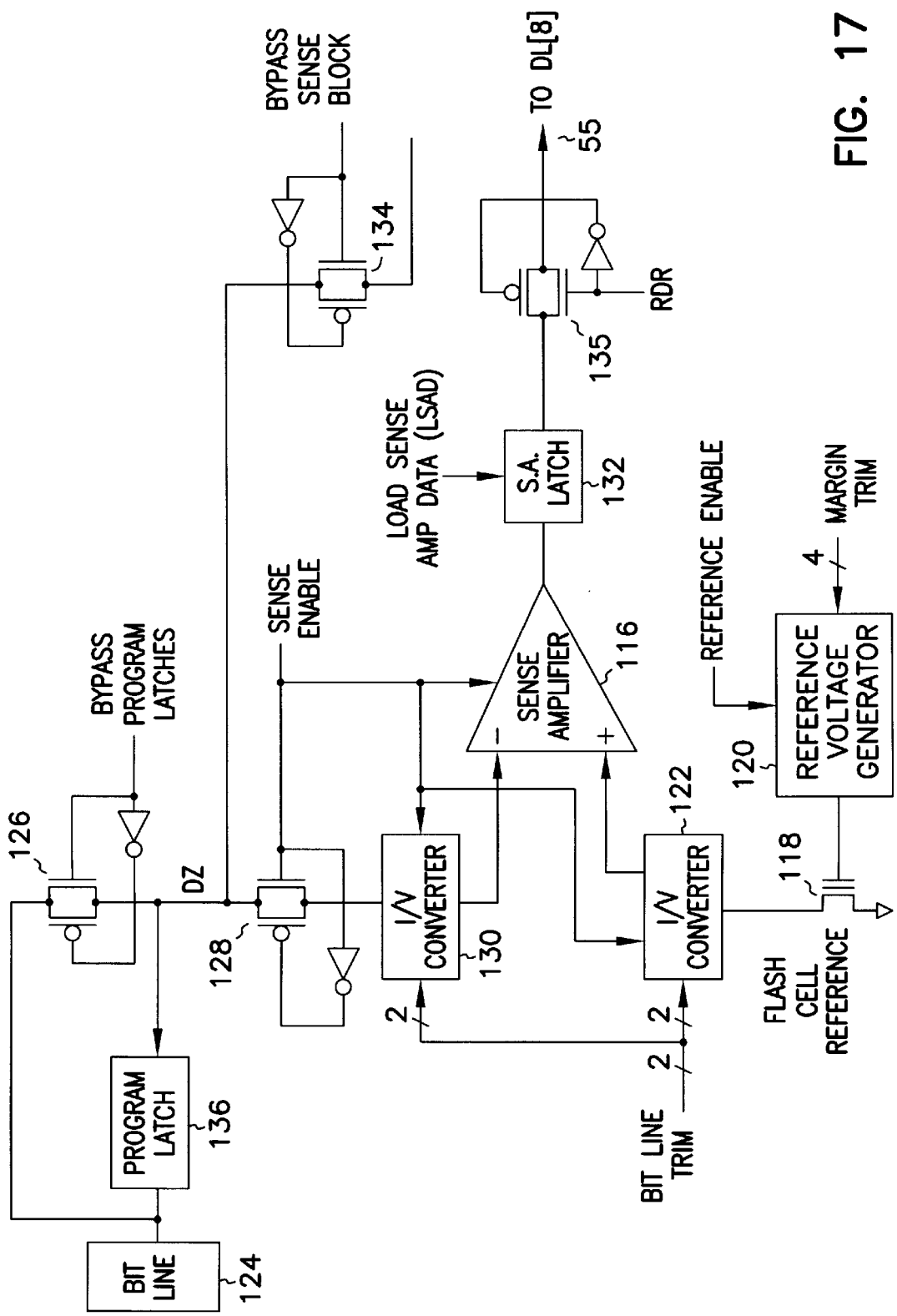
FIG. 17 is a schematic diagram of the sense amplifier and associated circuitry of the individual Memory Devices 38 of FIGS. 3A and 3B.

In a Read Operation, the cell current is measured using a Sense Amplifier. The same Sense Amplifier is also used in other operations related to Read Operations, such as Erase Verify and Program Verify operations. In the present example, a single word is read out consisting of eight bits of data. In order to read an entire word in a single operation, a total of eight Sense Amplifiers are provided. FIG. 17 shows a single Sense Amplifier 116 having a pair of differential inputs. One input is connected to a reference voltage which is related to the current flow through a Flash Cell Reference 118. The other input is connected to a read voltage which is related to the current flow through the associated Bit Line 124.

The circuitry associated with Flash Cell Reference 118 is shared by all eight of the Sense Amplifiers 116. Reference 118 has a control gate-source voltage which is determined by a Reference voltage Generator 120. Generator 120 produces a voltage which is nominally set to the voltage applied to the control gate (Word Line) of the cell being read. Thus, the Flash Reference Cell will produce a current which will tend to track current of the cells in the memory array with variations in temperature, processing and the like. The voltage applied to the Flash Reference Cell can be adjusted by way of four digital trim inputs which provide over sixteen different voltages depending upon the state of the trim bits in a manner similar to Digital-To-Analog Converter. The Reference Voltage Generator can thus be used to adjust the margins used in Read Operations and other similar operations such as Program Verify.

The current flow through the Flash Reference Cell 118 is converted to a voltage by a current to voltage (I/V) converter 122. I/V Converter 122 has two trim inputs that can be used to adjust the magnitude of the voltage applied to the drain of Flash Reference Cell 118. Block 124 represents a selected one of the Bit Lines of the memory array. The particular Bit Line is selected based upon a portion of the address provided to the memory system using decoding circuitry which is not depicted. In Read Operations, the Bit Line 124 is connected to the Sense Amplifier 116 by way of a pair of pass gates or switches 126 and 128. The switches each include a P and an N channel transistor, with the state of the switches being controlled by complementary switching signals. Switch 126 is controlled by a signal Bypass Program Latches and switch 128 is controlled by signal Sense Enable.

The current flow through the selected Bit Line 124, the cell current, is converted to a voltage by I/V Converter 130, with the voltage being applied to the non-inverting input of Sense Amplifier 116. I/V Converter 130 also functions to apply a voltage to the selected Bit Line 124 during the read operation. This voltage, which is applied to the drains of the cells in the array connected to the selected Bit Line can be adjusted using the same two trim bits used by I/V converter 122. Thus, the voltages applied to the drain of the cell being read and to the drain of the Flash Reference Cell 118, both typically nominally +1 volt, can be precisely adjusted together.

In a Read Operation, the voltage indicative of the current of the cell being read, and which is applied to the inverting input of Sense Amplifier 116, will be less than the reference voltage applied to the non-inverting input if the cell is in an erased state. This will cause the output of Sense Amplifier 116 to go high thereby indicating that the cell is a logical "1". If the cell being read has been programmed, the Sense Amplifier output will remain low indicating that the cell is a logical "0". The output of the Sense Amplifier 116 is held in a Sense Amplifier Latch 132 for eventual read out through switch 135 controlled by the Read Data Register (RDR) signal (Table 1). The read data from switch 135 are transferred to the Data Bus 42 by way of lines DL[8] (55) of FIG. 4. As noted in Table 1, the Command Decode Logic causes signal Load Sense Amplifier Data (LSAD) to be generated so that the Sense Amplifier Latch 132 will latch the output of the Sense Amplifier 116.

In program operations, switches 126 and 128 are turned off. In addition a switch 134 is turned on by a signal Sense Block Bypass thereby bypassing the Sense Amplifier circuitry. This will enable data present on the Data Bus to be applied to the input of a Program Latch 136. If the data to be programmed is a logical "0", the target cell in the array is to be programmed. In that event, Program Latch 136 will output +6 volts to the Bit Line 124, which, together with the voltages applied to the associated Word and Source Lines, will cause the cell to be programmed. In the event the data is a logical "1", the cell should not be programmed but should be left in the original erase state. Thus, the Program Latch output will be set to near ground potential.

Figure 16:
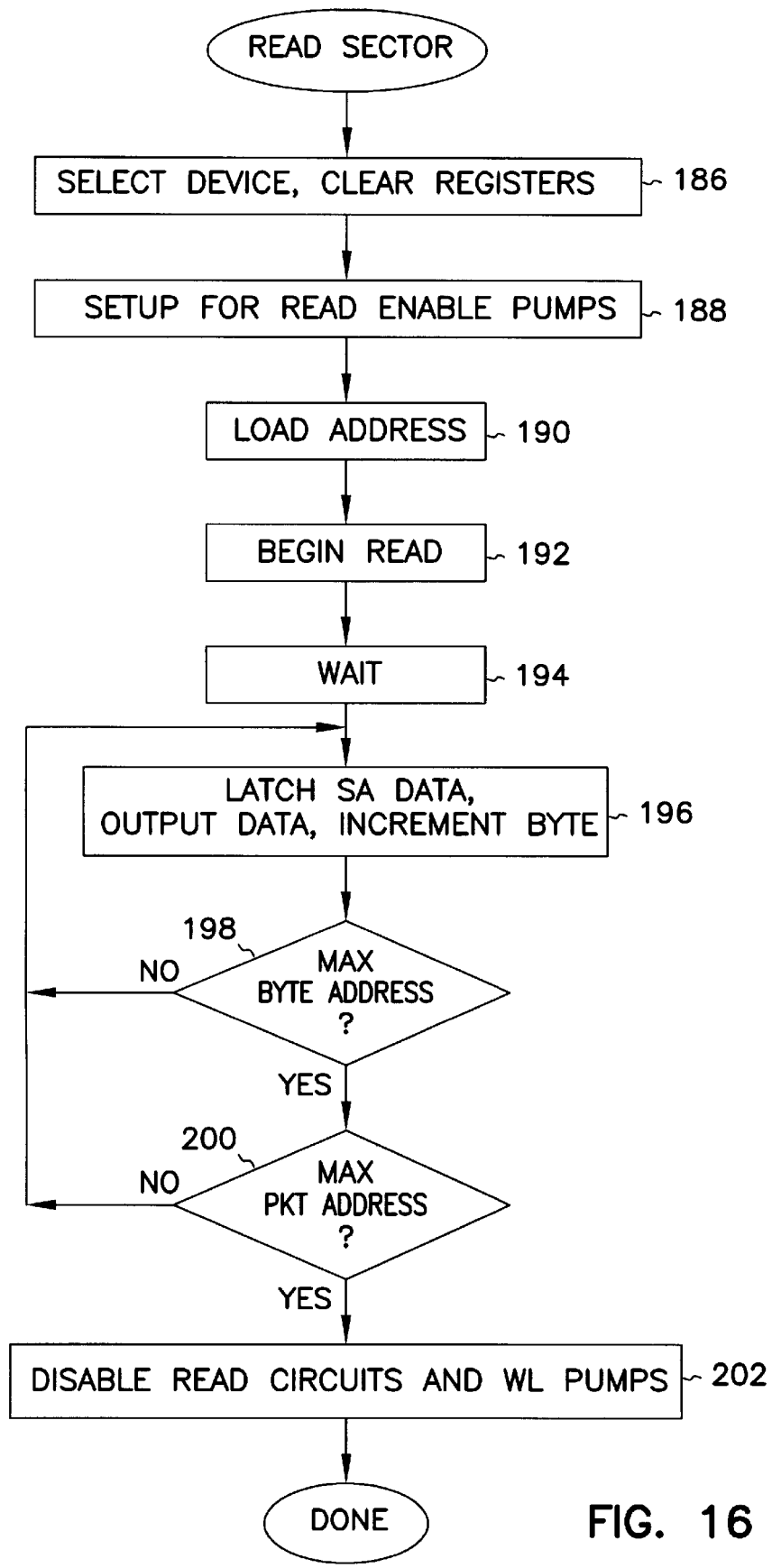
FIG. 16 is a flow chart illustrating the manner in which an exemplary memory read operation is carried out.

FIG. 16 is a flow chart depicting an exemplary Read Operation. In this operation, a Sector of the memory will be read out. As can be seen from FIG. 9, each Sector contains 544 Bytes of data. It is assumed the Controller 36 has already assigned each of the Memory Devices 38 a unique address (effectively $A_{29}$ to $A_{23}$) which is stored in each of the associated Address ID Latches 78 (FIG. 5). The first step of the Read Operation, as indicated by element 186 of FIG. 16, is the selection of the Memory Device 38 to be read. As previously described, this is accomplished by Controller 36 placing Tag Command 02H of the Tag Bus 40 and certain data on Data Bus 42 (FIG. 6). Bit D7 of the data, the modifier bit, is set to "1" so that a Memory Device is selected rather than deselected. Bits D6 to D0 are set to correspond to address bits $A_{29}$ to $A_{23}$ of the target Memory Device. As can be seen from FIG. 6, this will cause the single selected one of the Memory Devices 38 to be selected (Dev Sel is Set).

Once a Memory Device 38 is selected, Tag Command 0FH is issued and placed on Tag Bus 40 for the purpose of resetting those Registers of the selected Device that are capable of being reset. Data is placed the Data Bus at the same time Tag 0FH is issued. The data act as modifier bits to define the function that Tag 0FH will perform. The data is 08H (00001000), which means that only bit D3 is set to a "1". As can be seen in FIG. 11 table, when only bit D3 is set, Tag 0FH will function to reset the resettable Registers of the selected Memory Device. This is accomplished by issuance of signal Clear Control Register (CCR) by Command Decode Logic 62 (FIG. 10), with signal CCR being connected to the clear input of the Control Registers (FIG. 21).

In addition, Register Control A (FIG. 12F) is selected and bit 4 is set so as to enable a memory reference voltage generator which is normally deselected to minimize power consumption. The register is first selected by placing Tag 0BH on the Tag Bus, with 05H being placed on the Data Bus so that the Register Control A (05H) is selected. Next, Bit 4 of the register is set to a "1" by using Tag Command 0CH which, as indicated by table of FIG. 11, function to load data present on the Data Bus into the selected register. In this case the data on the Data Bus is 10H so that only Bit 4 of Register Control A is set.

Next, as indicated by element 188 of FIG. 16, various memory circuits used to control memory read operations are set to a proper state by selecting the appropriate ones of the Control Registers using Tag Command 0BH and by loading appropriate data into the registers for controlling the state of such circuitry in the same manner that the reference voltage generator was enabled earlier in the read sequence. By way of example, Control Register B (FIG. 12G) is selected using Tag Command 0BH and placing 06H on the Data Bus. Control Register B (06H) contains eight trim bits that are applied to VPX Switch 320 used to control the magnitude of the voltage VPX applied to the Word Lines during the memory operation.

Typically, three different Word Line voltage magnitudes are used for memory read, memory program and memory program verify operations. The applied voltage is typically in the range of +6 volts. Thus, once Control Register B has been selected, Tag Command 0CH is used to load the eight bits of voltage trim data placed on the Data Bus 40 into Control Register B.

Continuing, Control Register C (FIG. 12H) is then selected using Tag Command 0BH. This register contains a Bit 7 which is used to enable the Low Current Charge Pump circuit 314 which produces the voltage which, after being trimmed by the VPX Switch circuit 320, is applied to a selected Word Line during a memory programming and read operations. Control Register further contains a Bit 6 which functions to connect high voltage program data to a selected Bit Line during a program operation. Bit 5 of Control Register C enables and disables the VPX Switch circuit 322 which produces voltage VPX.

In order to carry out a memory read operation, Tag Command 0CH is used to set Bit 7 to a "1" so as to enable the Low Current Charge Pump 314. Next, Control Register D (FIG. 12I) is selected and Bits 0–3 are set to a selected trim value in order to control the read margin in read operations. These four bits are used to control the magnitude of the output voltage of the Reference Voltage Generator 120 (FIG. 17). In addition, Bit 1 of Control Register D is set to a "1" to enable the Reference Voltage Generator 120.

Continuing, the address of the first Byte of the first Packet of the Sector be read out of the selected Memory Device is provided to the Device by the Controller 36 as indicated by element 190 of FIG. 16. This is accomplished in two steps. First, Tag Command 05H is placed on the Tag Bus and the seven address bits $A_{22}$ to $A_{16}$ identifying the particular Erase Block containing the Sector to be read are placed on the Data Bus. As previously noted, Tag Command 05H functions to automatically select the Block Address Register (FIG. 12B) so that the Tag Command 0BH is not needed. Tag Command 05H will also cause signal BAL to be generated (Table 1) by the Command Decode Logic 62. Signal BAL will cause the data present on the Data Bus to be loaded into the Block Address Register (FIG. 12B). Note that it would also be possible to access the Erase Block Address Register for testing purposes and the like by issuing Tag Command 0BH and placing the address of the register (01H) on the Data Bus.

Next, Controller 36 will issue a Tag Command 04H for loading the Sector Address Register (FIG. 12C) with addresses $A_{15}$ to $A_9$. The address bits are placed on the Data Bus at the same time Tag 04H is placed on the Tag Bus. The Tag Command will cause the Command Decoder Logic 62 to issue signal Sector Address Load (SAL) which will cause the Sector Address Register (FIG. 12C) to be loaded with the address bits on the Data Bus. The contents of the Packet Address Register (FIG. 12D) and the Byte Address Register (FIG. 12E) will both be initialized by using Tag Commands 03H and 09H, respectively. Data 80H will be placed on the Data Bus so that the increment feature (Bit 7) will be enabled for both register and so that the initial address bits $A_8$ to $A_0$ and $A_x$ will be set to all zeros at this stage of the sequence.

Next, Register Control E is selected. As can be seen in FIG. 12J, when Bit 4 is a "1", all of the Word Lines of a selected Erase Block are selected. The selected Erase Block is determined by the address just loaded into the address registers. However, all of the Word Lines of the Erase Block will be forced to the same state by Bit 4, independent of the loaded address. Bit 3 causes all of the Word Lines of the selected Erase Block to be deselected when Bit 3 is a "0". Bit 2, when set to a "1", causes all eight main blocks of the Memory Device to be selected. Bit 1, when set to a "1", causes all eight Erase Blocks of the selected Main Block to be selected. Finally, Bit 0, when set to a "0", causes all of the Main Blocks to be deselected.

In this stage of the Read operation, Register Control E is loaded with 09H so that Bit 3 is set to a "1" thereby enabling all of the Word Lines of the selected Erase Block and so that Bit 0 is set to a "1" so that all Main Blocks are enabled.

Continuing, Controller 36 will then issue a Tag Command 0BH to select Register Control F (FIG. 12K). Bit 7 of this register is used to connect and disconnect the DL bus to and from the DZ bus. Referring to FIG. 17, signal Sense Block Bypass is controlled by this bit. When the signal is active, switch 134 is conductive bypassing the sense amplifier circuitry so that the DL bus is connected directly to the DZ bus in programming operations. In addition, Bit 1 of Register Control F is used to discharge the Bit Lines of the selected Erase Block when set to a "0" together with the DZ bus. Bit 0 of the register is used to float all Bit Lines of the selected Erase Block when set to a "0". In the present example, 03H is loaded into selected Register Control F using Tag Command 0CH so that Bits 0 and 1 are set to a "1" so that the Bit Lines and DZ bus will be discharged and so that the float function performed by Bit 0 is disabled. Once the Bit Lines and DZ bus have discharged, a second Tag Command 0CH is issued to set Bit 1 to a "0" thereby terminating the discharge function. Note that since Register Control F was already selected, it is not necessary to repeat the select operation using Tag Command 0BH.

Controller 36 will then select Register Control G (FIG. 12L). Bit 6 of this register is used to generate signal Bypass Program Latches (FIG. 17) which is used to control switch 126 which functions to bypass the program latches 136 so that the sense amplifier circuitry is connected to the Bit Lines 124 so that a read operation can be carried out. Bit 4 of the register is used to generate signal Sense Enable which functions to enable the Sense Amplifier 116 and related circuitry including switch 128 which connects the Bit Lines 124 to the input of the Sense Amplifier circuitry. In the present example, 50H is loaded into Register Control G thereby causing the Program Latches 136 to be bypassed and the sense amplifier circuitry to be enabled.

Controller 36 will then select Register Control C (FIG. 12H). Bits 7 and 5 of this register are then set to a "1". As previously described, when Bit 7 is a "1", the Low Current Charge Pump circuit 314 (FIG. 24) is enabled. When Bit 5 is a "1", the output of the low current charge pump is connected to the X Decoder circuitry so that charge pump voltage will be applied to the selected word line.

The actual reading of the array is then commenced as indicated by element 192 of FIG. 16. As is well known, some of the address bits will be applied to an X Decoder which will select a predetermined one of the Word Lines of the memory array. As will be explained in greater detail in connection with FIG. 24B, the voltage VPX generated by the low current charge pump circuit will be applied to the selected Word Line. It is possible to use a low current pump since the Word Lines draw little current during read operations. The remaining address bits will be applied to a Y Decoder which will select the eight Bit Lines associated with the eight bits that make up the word to be read. As previously noted, the Bit Line voltage for carrying out read operations is applied by the I/V Converter circuit 130 of FIG. 17. The Source Line of the selected Erase Block is also grounded during the read operation.

At this point in the Read Operation, there is a timeout of a few microseconds as indicated by element 194 of the FIG. 16 flow chart so that the various charge pumps and Word Lines have an opportunity to charge up. The appropriate voltages have been applied to the Word Lines, Bit Lines and the Source Line associated with the eight cells to be read.

Figure 25:
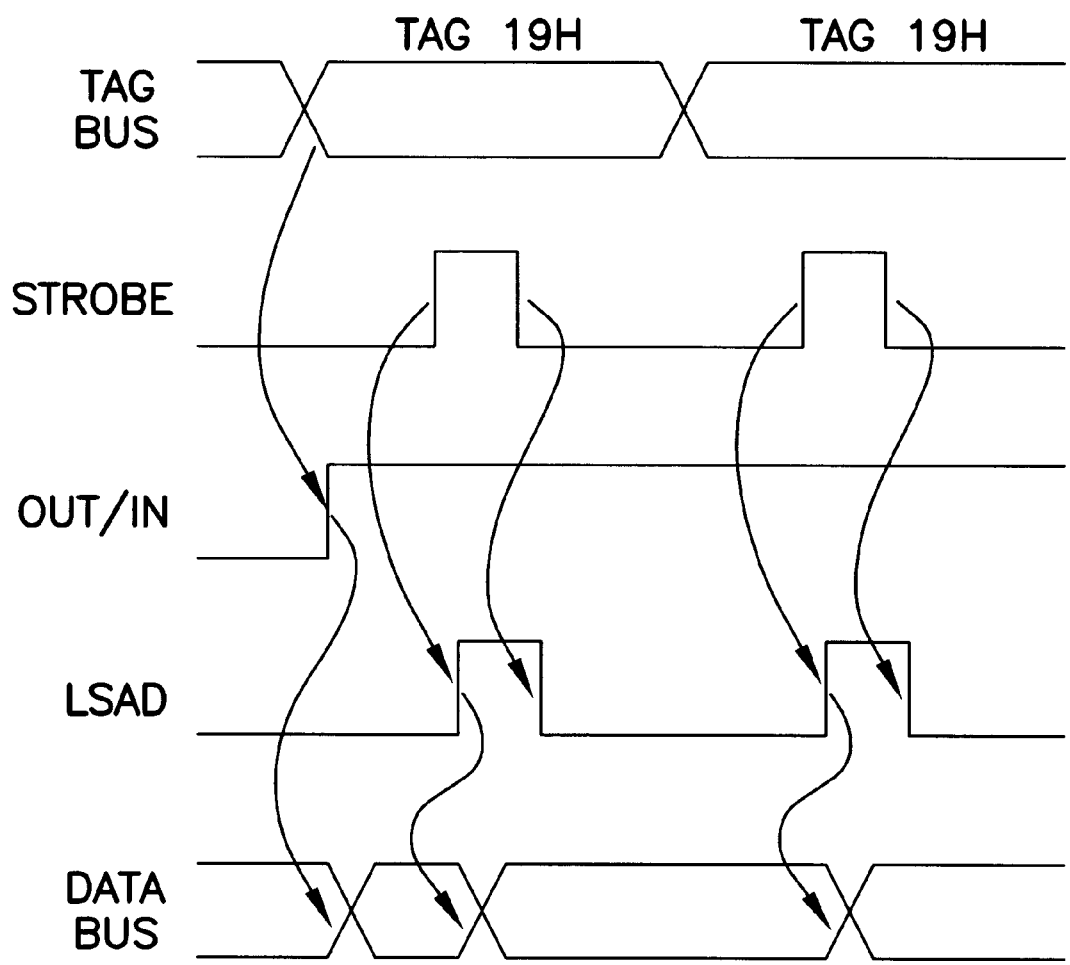
FIG. 25 is a timing diagram illustrating the operation the Memory Device responding to a read command.

The Sense Amplifiers 116 will then sense the presence or absence of current for those eight cells that make up the first Byte of the Sector being read. Controller 36 will issue Tag Command 19H (FIG. 11) with the associated signal Strobe. The timing diagram of FIG. 25 illustrates this aspect of the read operation. Once Tag Command 19H is detected, signal Out/In becomes active so that I/O Buffer 52 (FIG. 4) will be capable of transferring the data being read out of the memory array from DL Bus 55 to the external Data Bus 42. At this time, data held in the Sense Amplifier Latch 132 (FIG. 17) will be placed on the Data Bus 42.

Signal Strobe together with Tag 19H will also cause signal Load Sense Amplifier Data (LSAD) to go active. As previously described, this signal will cause the read data present on the output of the eight Sense Amplifiers 116 (FIG. 17) to be loaded into the associated Sense Amplifier Latch 132. Latch 132 is transparent so that the Sense Amplifier 116 outputs will be present on the external Data Bus 42 at this time. Signal Strobe will then go inactive thereby causing LSAD to go inactive thereby latching the read data. At this point, the reading of the next Byte can commence since any changes in the output of the Sense Amplifiers will not affect the state of the Sense Amplifier Latches 132.

Controller 36 will then issue a second Tag Command 19H and associated Strobe. This will cause signal BA Increment (FIG. 22) to be generated thereby causing Byte Counter 280 ($A_4$ to $A_0$) to increment from all zeros to 00001. A determination is then made, as indicated by element 198 of the FIG. 16 flow chart, whether all of Bytes of data have been read out of the first Packet. There are 32 Bytes of data in each Packet, so if the count is less than 31, the sequence will return to element 196 and the second Byte of data is read out of address 0001.

This sequence will be repeated until thirty-two Bytes have been read thereby indicating that the first Packet of the Sector has been read. At this point, address $A_4$ of the Byte Address Counter will switch from a "1" to a "0" so that the Packet Address Counter 298 (FIG. 23) will incremented by way of gates 304 and 306. As indicated by element 200, a determination is then made as to whether the final Packet of the Sector has been read. There are seventeen Packets of data per Sector so if the count is less than sixteen, the sequence will return to element 196 and the first Byte of the second Packet will proceed to be read out. This sequence will continue until all seventeen Packets of data, 512 Bytes, have been read out. The seventeen Packet of data comprise a Sector which represents an entire row of the memory array.

Once the Sector has been read out, the various circuits used in the memory read operation, including charge pumps, are preferably disabled as indicated by element 202 of the FIG. 16 flow chart. This is accomplished by setting appropriate bits in appropriate Control Registers using various Tag Commands. First, Register Control C (FIG. 12H) is selected using Tag Command 0BH and placing 07H on the Data Bus. Once the register is selected, 80H is written into the register using Tag Command 0CH. This will cause Bit 5 to change from a "1" to a "0" thereby disabling the VPX circuit 320 which applies the output voltage VPX derived from the Low Current Charge Pump 314 to the Word Lines. Next, while Register Control C remains selected, Bit 7 is set to a "0" thereby disabling the Low Current Charge Pump circuit 314. A short delay is introduced at this point to allow the charge pump circuit 314 and the Word Line to discharge. Register Control G (FIG. 12L) is then selected and Bits 4 and 6 are set to "0" thereby disabling the sense amplifier circuitry and turning off switch 126 which bypasses the Program Latch 136. Next, Register Control D (FIG. 12I) is selected and all Bits are set to "0" thereby disabling the reference generator and the sense trims. Register Control F is then selected and Bit 0 is set to "1" thereby disabling the Bit Line float function. In addition, Bit 1 is set to a "1" so that the Bit Line discharge function is enabled so as to discharge the Bit Lines and the DZ Bus. Finally, Bit 1 of Register Control F is set back to a "0" thereby terminating the discharge function. That completes the sector read operation.

Program Operations

Figure 18A:
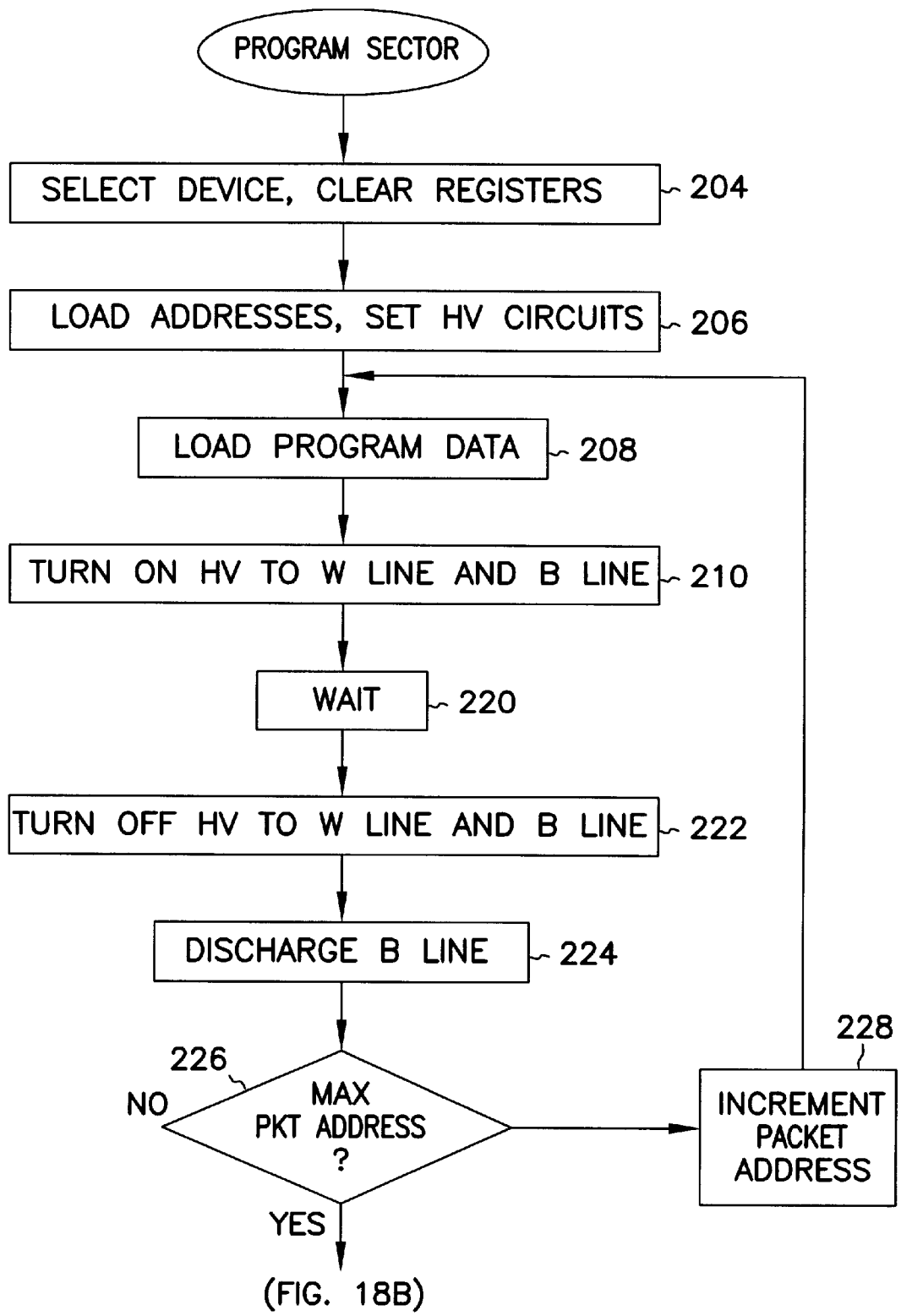
FIGS. 18A and 18B are a flow chart illustrating an exemplary Program Operation for the FIG. 3A and 3B memory systems.
Figure 18B:
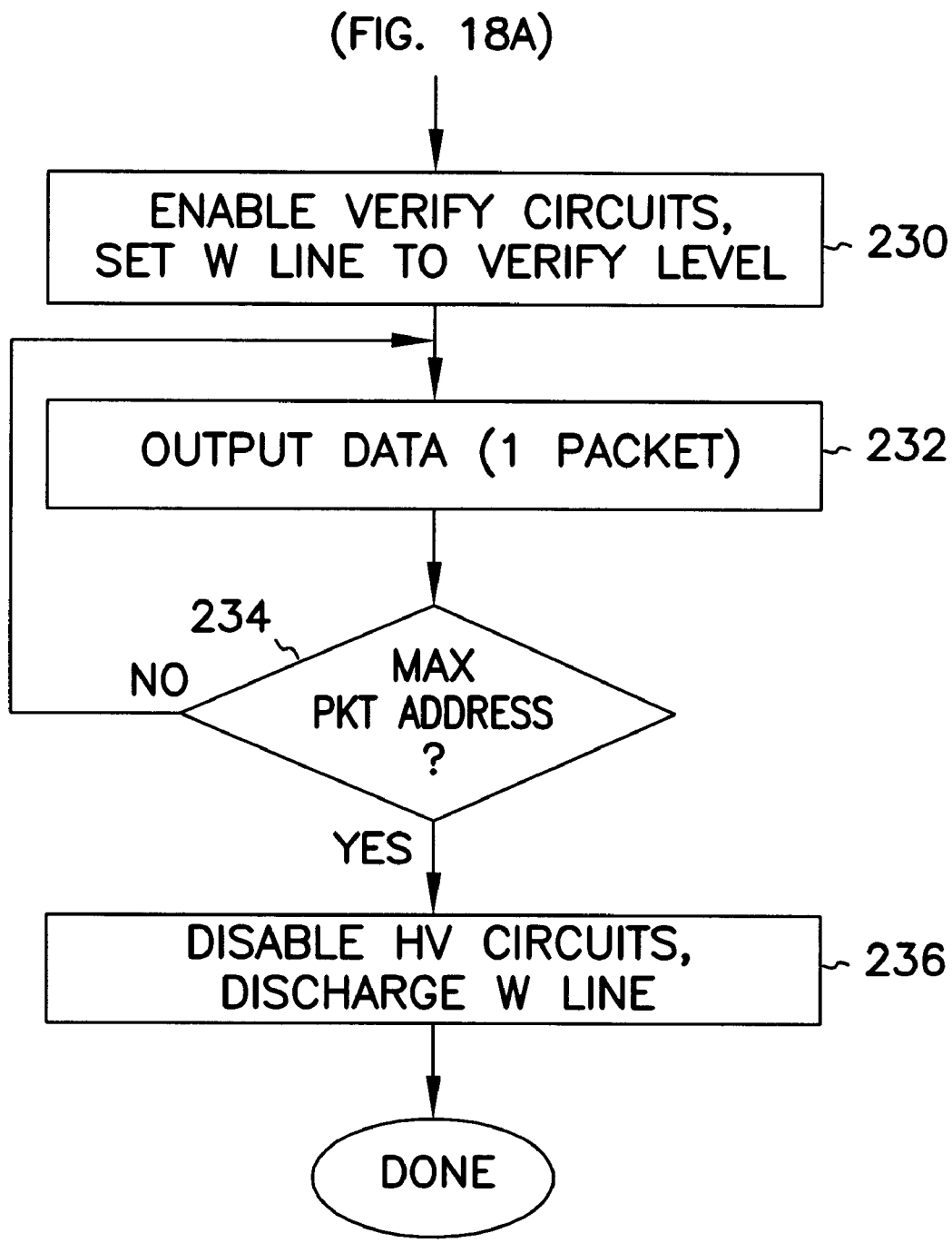
Figure 19:
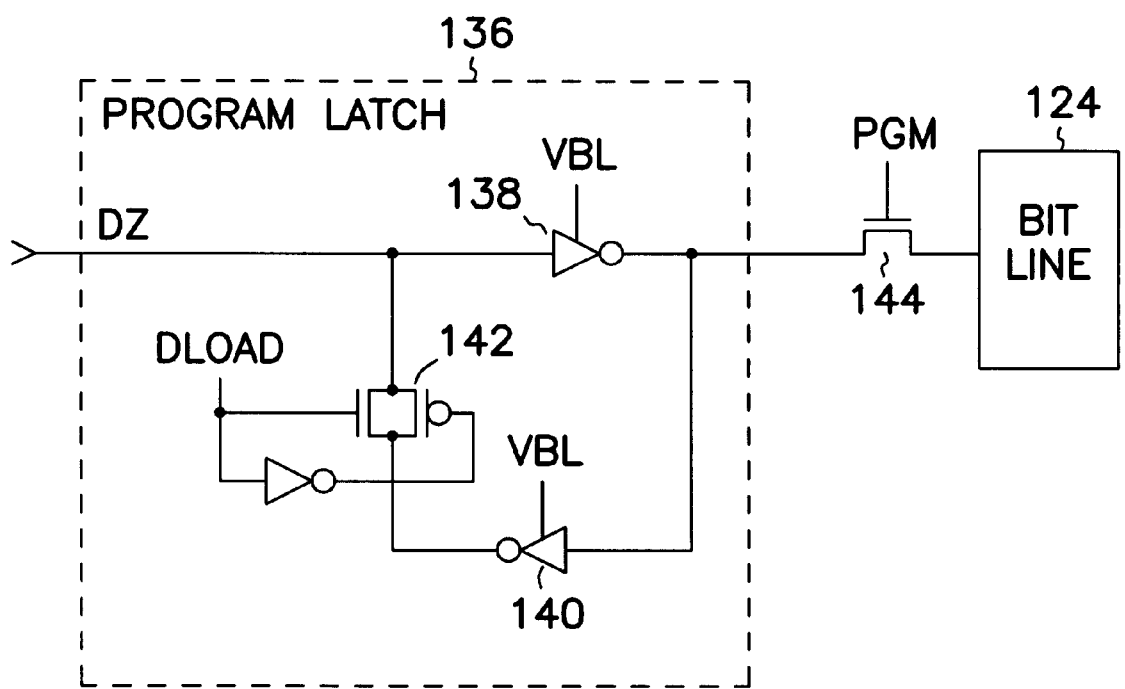
FIG. 19 is a schematic diagram showing additional details of the Program Latch of FIG. 16.

FIGS. 18A and 18B are flow charts illustrating an exemplary Sector Program Operation of the FIG. 3A memory system. FIG. 19 shows additional details regarding the Program Latch 136 of FIG. 17 used in programming operations. Prior to describing the Sector Program Operation, Program Latch 136 will be described. Latch 136 includes a pair of inverters 138 and 140 connected together with a switch 142 to form a loop. When switch 142 is conductive, inverter are connected to provide positive feedback so that the signal applied to the input of inverter 138 will be latched. Switch 142 is controlled by a signal DLOAD and the inverse of that signal.

Inverter 138 and 140 are both powered by voltage VBL so that the output of the Program Latch 136, the output of inverter 138, will be at that voltage when the Latch input is a "0". As previously described, voltage VBL is generated on the Memory Device 38 by a High Current Charge Pump circuit 310 which has a nominal output +6 volts, with the magnitude being adjustable by way of three trim inputs to VBL Switch circuit 316. The output of Latch 136 is connected to the selected Bit Line 124 by way of a pass transistor 144 which can be turned on and off by a signal PGM having a magnitude of +11 volts when active. As will be explained in greater detail, a cell will be programmed when the associated Bit Line is set to VBL (+6 volts), the associated Word Line is set to +11 volts and Source Line is grounded.

An exemplary Sector Program Operation will now be described in connection with FIGS. 18A and 18B. Again, it is assumed that all of the Memory Devices 38 of the memory system have been assigned addresses by Controller 36 so that the Address ID Latch 78 (FIG. 5) of all of the Memory Devices will be set with the address of each associated Device. As indicated by element 204 of FIG. 18A, the Memory Device 38 which is to be programmed is first selected by Controller 36 placing Tag Command 02H on the Tag Bus and certain data on Data Bus 42 (FIG. 6). Bit D7 of the data, the modifier bit, is set to "1" so that a Memory Device is selected rather than deselected. Bits D6 to D0 are set to correspond to address bits $A_{29}$ to $A_{23}$ of the target Memory Device. As can be seen from FIG. 6, this will cause the single selected one of the Memory Devices 38 to be selected (Dev Sel is Set). Once a Memory Device 38 is selected, Tag Command 0FH is issued and placed on Tag Bus 40 for the purpose of resetting those Registers of the selected Device that are capable of being reset. Data is placed the Data Bus at the same time Tag 0FH is issued. The data act as modifier bits to define the function that Tag 0FH will perform. The data is 08H (00001000), which means that only bit D3 is set to a "1". As can be seen in FIG. 11, when only bit D3 is set, Tag 0FH will function to reset the resettable Registers of the selected Memory Device. This is accomplished by issuance of signal Clear Control Register (CCR) by Command Decode Logic 62 (FIG. 10).

In addition, the Reference Voltage Generator is enabled, as previously described in the Read Sector sequence by selecting Register 05H (FIG. 12F) and setting Bit 4 to a "1".

The address of the Sector to be programmed is then provided to the selected Memory Device 38 as indicated by element 206 of FIG. 8A. First, Tag Command 05H is placed on the Tag Bus and the seven address bits $A_{22}$ to $A_{16}$ identifying the particular Erase Block containing the Sector to be programmed are placed on the Data Bus. As previously noted, Tag Command 05H functions to automatically select the Block Address Register (FIG. 12B) so that the Tag Command 02H is not needed. Tag Command 05H will also cause signal BAL to be generated (Table 1) by the Command Decode Logic 62. Signal BAL will cause the data present on the Data Bus to be loaded into the Block Address Register (FIG. 12B). Next, Controller 36 will issue a Tag Command 04H for loading the Sector Address Register (FIG. 12C) with addresses $A_{15}$ to $A_9$. The address bits are placed on the Data Bus at the same time Tag 04H is placed on the Tag Bus. The Tag Command will cause the Command Decoder Logic 62 to issue signal Sector Address Load (SAL) which will cause the Sector Address Register (FIG. 12C) to be loaded with the address bits on the Data Bus. The contents of the Packet Address Register (FIG. 12D) and the Byte Address Register (FIG. 12E) will both be initialized by using Tag Commands 03H and 09H, respectively. Data 80H will be placed on the Data Bus so that the increment feature (Bit 7) will be enabled for the Byte Address Register (FIG. 12E) and so that the initial address bits $A_8$ to $A_0$, $A_x$ will be set to all zeros at this stage of the sequence.

Controller 36 will also cause appropriate ones of the circuitry used for programming to set to the desired state. This is accomplished by issuing a sequence of Tag Commands so that the pertinent bits of various ones of the Control Registers are set to a desired state. First, Tag Command 0BH is issued and 06H is placed on the Data Bus to select Register Control B (FIG. 12G). Next, the Word Line trim voltage is set by loading the appropriate eight bits into Register Control B. These trim bits are applied to the VPX Switch circuit 320 (FIG. 24B) so that the Word Line voltage is at the exact desired level. In addition, the Low Current Charge Pump 314 is enabled by setting Bit 7 of Register Control C (FIG. 12H).

Continuing, Register Control H (FIG. 12M) is selected, with this register containing Bits 3–5 that are used to control the magnitude of voltage VBL, the voltage applied to the Bit Lines by the Y Decoder circuit during programming. As can be seen in FIG. 24B, the three trim bits are applied to the VBL Switch circuit 316. In addition, the High Current Charge Pump circuit 310 is enabled along with enabling the VBL Switch circuit 316 by setting Bits 1 and 2 to a "1".

Next, Register Control F (FIG. 12K) is selected and Bit 2 0 and 1 are set to a "1" thereby disabling the Bit Line float function and causing the Bit Lines and DZ Bus to switch to a discharged state. Bit 1 of the register is then set to a "0" to terminate the discharge function. Register Control F (FIG. 12K) is then selected and Bit 7 is set to a "1" thereby causing signal Sense Block Bypass (FIG. 17) to go active thereby turning on switch 134 and bypassing the sense amplifier circuitry.

Figure 26:
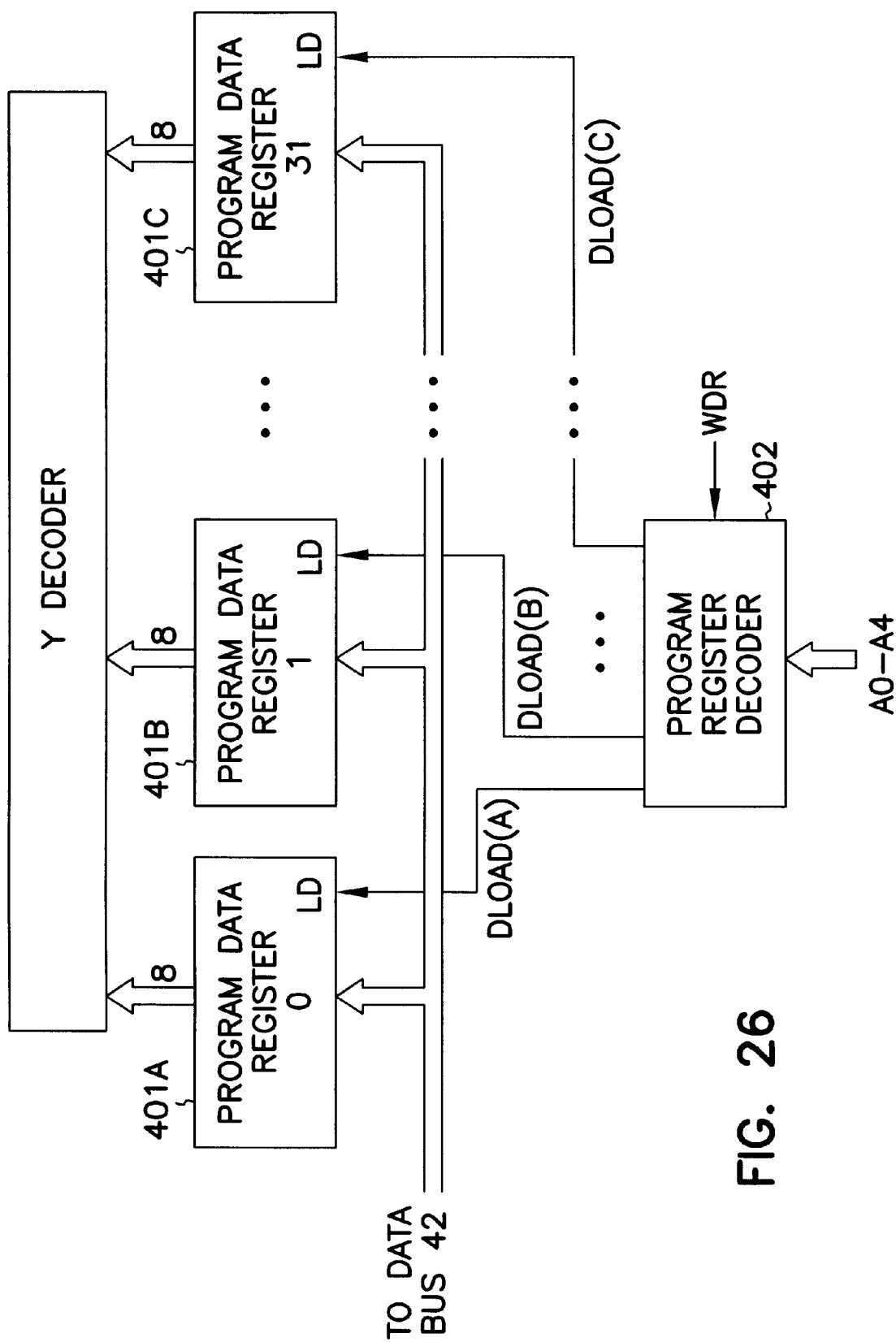
FIG. 26 is a schematic diagram of the Program Data Registers which hold the data to be programmed into the memory and the associated decoder circuitry.

The data to be programmed into the Sector is then loaded into the selected Memory Device 38, as indicated by element 208 of FIG. 18A. The program data are loaded into thirty-two 8 bit Program Data Registers 400 one byte at a time. FIG. 26 shows the Program Data Registers 400, with each one bit stage of the Register corresponding to the Program Data Latch 136 of FIG. 19. The Program Data Registers are selected by a Program Register Decoder circuit 402 that receives the five bits of Byte Address $A_0$–$A_4$ generated by the Byte Address Counter 280 (FIG. 22).

The data for programming a single Packet, 32 Bytes is loaded one Byte at a time. Tag Command 0AH (FIG. 11) is placed on the Tag Bus 40 and the eight bits of the first Byte of data are placed on the Data Bus 42. Among other things, Tag Command 0AH will cause signal Write Data Register (WDR) to be produced thereby causing Decoder 402 to produce signal DLOADA which is forwarded to Program Register 0 based upon initial address $A_0$–$A_4$ of 0000. This will cause the first Byte of program data to be loaded into a Program Register 0. Next, the second Byte of program data is placed on the Data Bus 42 together with Tag Command 0AH. Tag 0AH will cause the Byte Address Counter 280 to increment so that the Program Register Decoder 402 will select Program Data Register 1 to receive the byte of program data. This sequence is repeated until thirty-two Bytes of programming data are loaded into the thirty-two Program Data Registers.

As indicated by element 210, the programming voltages are then applied to the selected Word Lines and Bit Lines so that the first Byte of data is programmed into the array. Register Control C (FIG. 12H) is first selected and Bit 5 is set to a "1" so as to enable VPX Switch circuit 320 (FIG. 24B). This will cause voltage VPX to be applied to the selected Word Line associated with the cells to be programmed. Register Control I (FIG. 12N) is then selected and Bit 2 is set so that VBL Switch circuit 316 will function to connect the High Current Pump 310 output to line VBL. In addition, Bit 6 is set to a "1" so as to connect the output of the VBL Switch circuit 316 to the Program Latches 136 (FIG. 19) so that the voltage will be applied to the Bit Lines 124 for those Bit Lines associated with a cell to be programmed.

As indicated by element 220, the sequence enters a short wait state while the programming voltages are applied to the memory array. At this point, 32 Bytes of data are programmed at the same time.

The Controller then places appropriate Tag Commands on the Data Bus and places appropriate data on the data bus to turn off the programming voltages applied to the Word Lines and Bit Lines (element 222 of FIG. 18A). Register Control H (FIG. 12M) is selected and Bit 2 is set to a "0" thereby disabling VPX Switch circuit 320. There is a short wait at this point to permit the Bit Lines to become discharged. Register Control C (FIG. 12H) is then selected and Bit 6 is set to a "0" thereby disabling VBL Switch circuit 316 so that voltage VBL is no longer applied to the program latches 136. Next, Bit 5 of the register is set to a "0" thereby disconnecting voltage VPX from the Word Lines.

In addition, as indicated by element 224 of the FIG. 18A flow chart, Controller 36 causes the Bit Lines to be discharged. This is accomplished by selecting Register Control F (FIG. 12K) and setting Bits 0 and 1 to a "1". This disables the float function (Bit 0) and enables the discharge function. Once the discharge is completed, Bit 1 is set back to a "0".loading appropriate data into one of the Control Registers as indicated by element 224 of FIG. 18A.

A determination is then made as to whether the last Packet of data for the Sector has been programmed (element 226 of FIG. 18A). Since only the first Packet has been programmed, the Packet Address Counter (FIG. 23) will be incremented (element 228) by issuance of Tag Command 07H. Tag Command 07H together with signal Strobe will cause AND gate 308 to be enabled thereby incrementing the counter by way of OR gate 306. Once the Packet address has been incremented, the sequence will return to element 208 of the FIG. 18A flow chart. The next Packet of data will be programmed, with the process being repeated until the last Packet of the Sector has been programmed.

Once the Sector has been programmed, it is necessary to enter a verification sequence to confirm proper programming. As indicated by element 230, the first step of the verification is to set the various circuits that perform the verify function to an enabled state. The verification sequence is similar to the previously-described read operation, with the voltage applied to the Word Line and the voltage margins used by the Sense Amplifier circuitry being set so that any marginally programmed cells will be detected. Preferably, a Byte of data is read out and loaded into a data buffer followed by 31 further read operations until one Packet or 32 Bytes of data are read, as indicated by element 232 of FIG. 8B.

The 32 Bytes of data are transferred to Controller 36 one Byte at a time so that the data read can be compared with the data programmed. This process is repeated until all Packets of the Sector are verified, as indicated by element 234. Once the verification is completed, circuitry used for programming and verification is turned off and the Word Lines are discharge by grounding (element 236). That completes the Sector Program operation.

Figure 27:
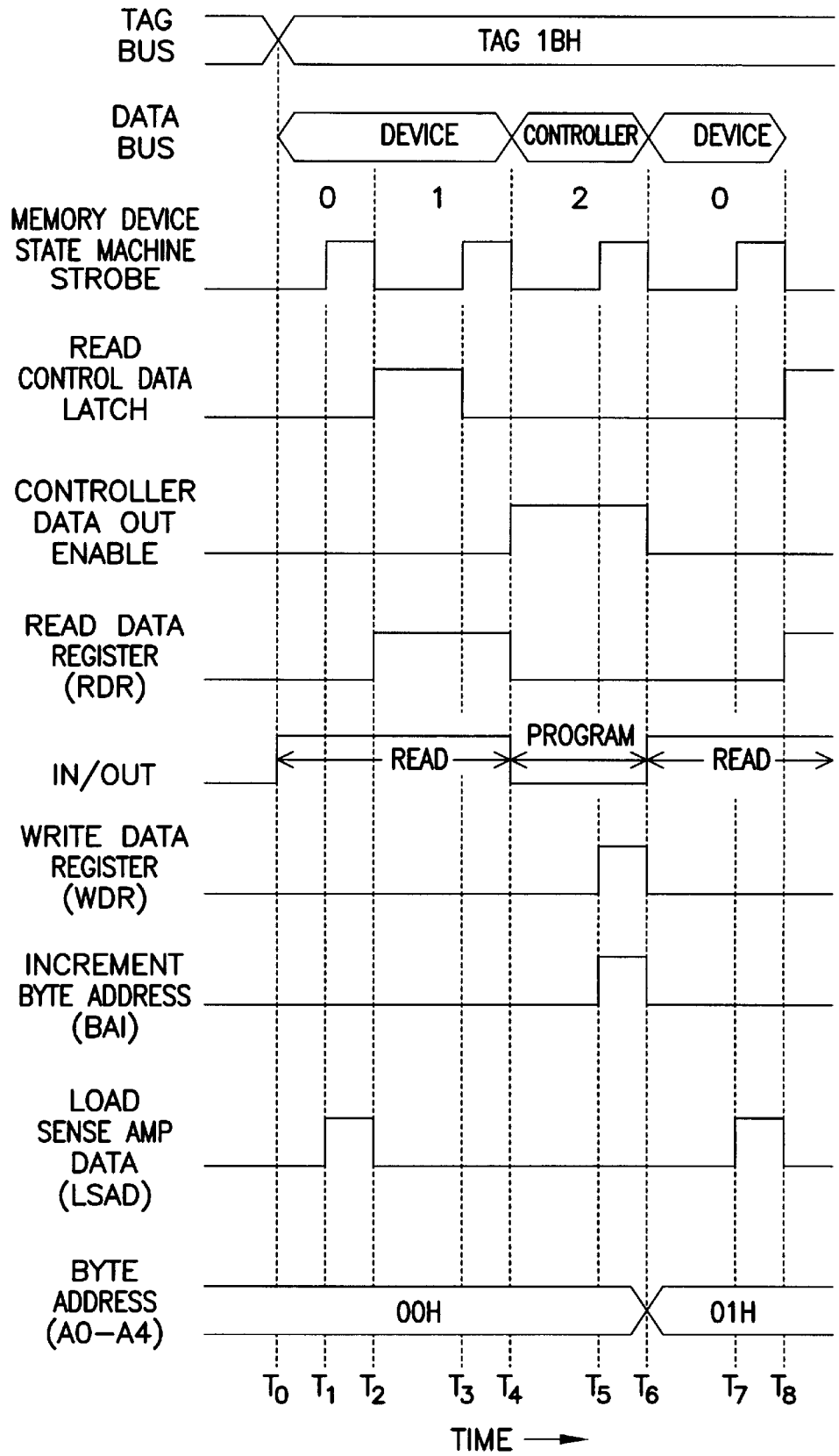
FIG. 27 is a timing diagram illustrating the Read, Modify, Write mode of operation used in verifying memory programming operations in accordance with the present invention.

It is possible to greatly simplify the program verify operation using a Tag Command 1BH. FIG. 27 is a timing diagram illustrating the operation of Tag Command 1BH which causes a read-modify-write function to be carried out. The timing diagram assumes that thirty-two Bytes of data, a Packet, have been programmed with a single programming pulse. The program sequence at the stage (element 230 of FIG. 18B) where the programmed data must be verified.

As an alternative to the previously described verification sequence of FIG. 18B, the Read, Modify, Write operation illustrated in the timing diagram of FIG. 27 will be utilized. As will be explained, this operation is initiated by Controller 36 issuing a special Tag Command 1BH.

Figure 28:
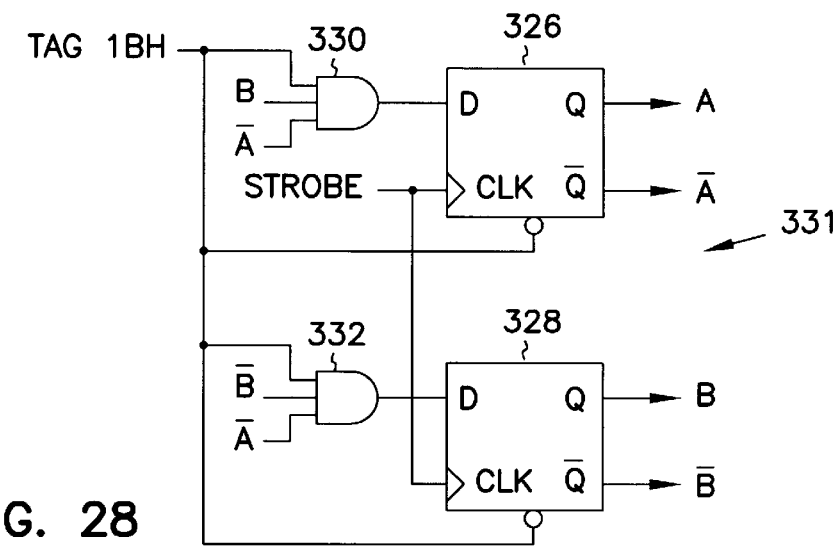
FIG. 28 is a schematic diagram of a state machine in each Memory Device used to generate timing control signals used to carry out the Read, Modify, Write function in accordance with the present invention.

FIG. 28 depicts a two bit State Machine 331 which generates control signals A and B in response to detection of Tag Command 1BH. As will be described, these control signals are used to generate or otherwise control the timing of various signals depicted in the FIG. 27 timing diagram. Table 2 below shows the different

TABLE 2

| State | Control Signals | |
|---|---|---|
| 0 | $\overline{A}$ | $\overline{B}$ |
| 1 | $\overline{A}$ | B |
| 2 | A | $\overline{B}$ |
| 0 | $\overline{A}$ | $\overline{B}$ | states of the FIG. 28 State Machine 331. There are three distinct states, with the states changing in sequential order with the falling edge of each signal Strobe. These states are also shown in the FIG. 27 timing diagram.

The State Machine 331 includes two D type flip-flops 326 and 328, with the flip-flops both being clocked by signal Strobe. An output of an AND gate 330 is connected to the D input of flip-flop 326, gate 330 having one input receiving a signal Tag 1BH when that tag is present on the Tag Bus 40, and with the remaining two inputs receiving control signals $\overline{A}$ and B. Control signals A and B are produced at the Q outputs of flip-flops 326 and 328, respectively. An output of an AND gate 332 is connected to the D input of flip-flop 328, with gate 332 having one input which receives signal Tag 1BH and two inputs that receive inverted control signals $\overline{A}$ and $\overline{B}$. Signals $\overline{A}$ and $\overline{B}$ are produced at the $\overline{Q}$ outputs of flip-flops 326 and 328, respectively. Finally, both flip-flops are in a cleared state, both $\overline{A}$ and $\overline{B}$ active, when signal Tag 1BH is inactive.

Figure 33:
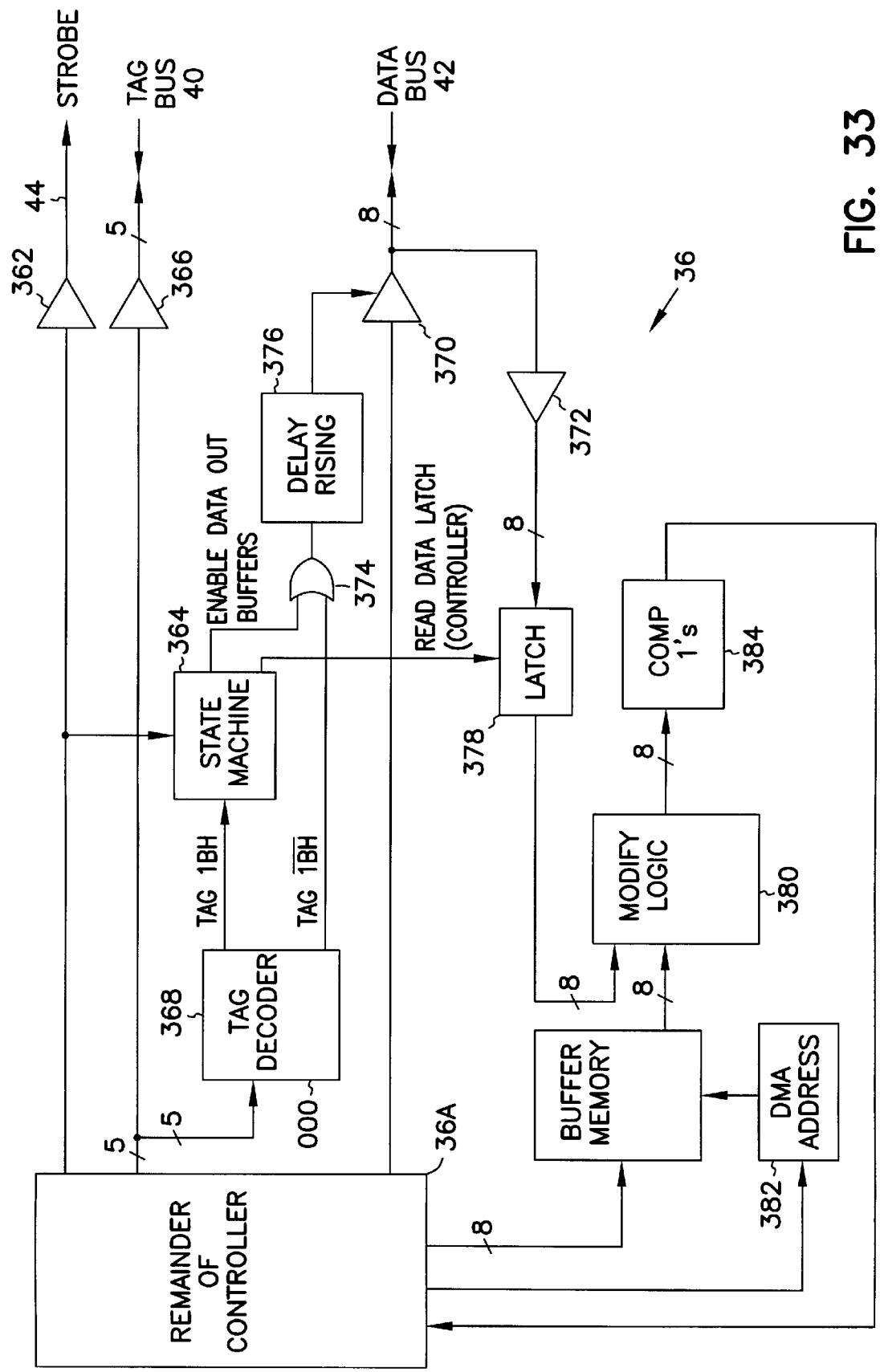
FIG. 33 is a block diagram of a portion of Controller 36 relating to the Read, Modify, Write feature of the present invention.
Figure 34:
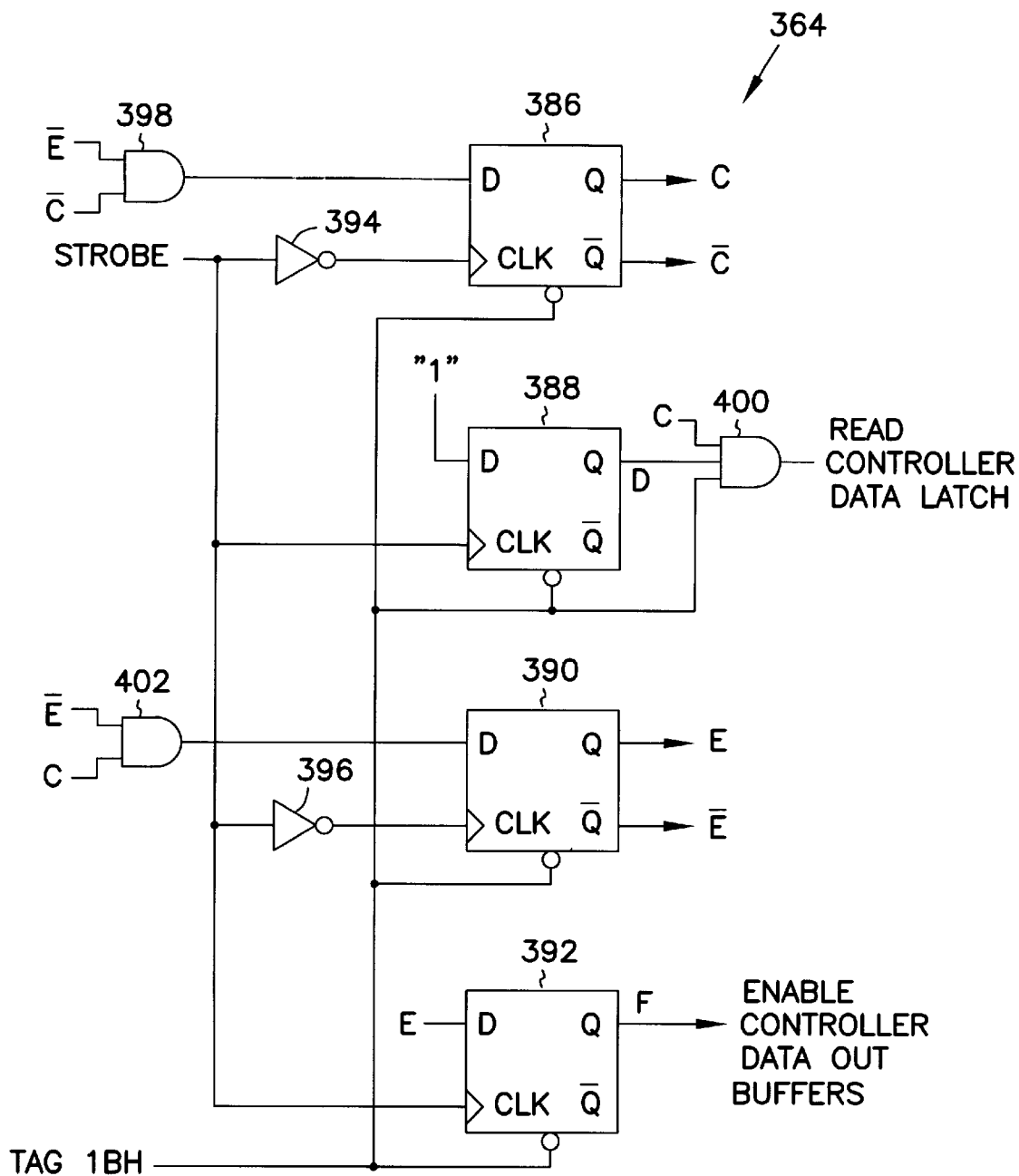
FIG. 34 is a schematic diagram of a state machine used in Controller 36 to carry out part of the Read, Modify, Write function.

FIG. 33 depicts a portion of the Controller 36 that relates to the Read, Modify Write function. Controller 36 generates Signal Strobe on line 44 by way of a buffer circuit 362. The unbuffered signal Strobe is also connected to a State Machine 364, the details of which are shown in FIG. 34. The five bit Tag Bus outputs are provided by way of five buffer circuits 366. In addition, the internal Tag Bus is connected to a Tag Decoder circuit 368 having one output which is active when Controller 36A places Tag 1BH on the internal Tag Bus and a second output when any valid Tag other than Tag 1BH is placed on the Tag Bus and the tag is such that Controller 36 will be controlling the Data Bus 42.

Controller 36 has two sets of buffer circuits for controlling the direction of data flow on the Data Bus 42. When Controller 36 is outputting data on the Data Bus 42, a set of eight output data buffer circuits 370 are provided that are capable of driving the Bus 42. When receiving data on the Data Bus 42, Controller 36A utilizes eight input data buffer circuits 372. Output buffer circuits 370 are switched to a disabled state having a high impedance output when Controller 36 is receiving data on the Data Bus 42. An OR gate 374 is included which will enable the output buffers 370 whenever Controller 36 is placing data on the Data Bus 42. One input of gate 374 receives signal Enable Data Buffers which, as will be explained in greater detail, is generated by State Machine 364 during the course of the Read, Modify, Write sequence. The other input receives signal $\overline{TAG\ 1BH}$ which is generated when a tag other than Tag 1BH is detected and the detected tag is of the type requiring Controller 36 to place data on the Data Bus 42.

In addition, State Machine 364 generates signal Read Data Latch which causes Latch 378 to latch data on the Data Bus 42 originating from one of the Memory Devices 38. The latched data is compared with data held in a Buffer Memory 380, with Buffer Memory 380 being addressed by Direct Memory Access (DMA) Address circuitry 382. Modify Logic circuitry 380 carries out the compare function and certain other functions to be described. A Compare "1" circuit 384 tests the output of the Modify Logic circuitry 380 and forwards the output to the remainder of Controller 36A as will also be explained.

FIG. 34 shows additional details of the State Machine 364. The State Machine 364 comprises four D type flip-flops 386, 388, 390 and 392, all of which are reset by signal Tag 1BH when the signal is inactive. Flip-flops 386 and 392 are clocked by inverted signal Strobe fed to the flip-flops by way of inverters 394 and 396, respectively and flip-flops 388 and 392 are clocked by signal Strobe. Flip-flops 386, 388, 390 and 392 generate control signals C, D, E and F, respectively and the inverse of those signals. The operation of the FIG. 34 State Machine will be described in connection with the description of the FIG. 27.

Returning to the timing diagram of FIG. 27, at some time prior to T0, the Byte Address Counter 280 (FIG. 22) and the Packet Address Counter 298 (FIG. 23) are reset to all zeros by using Tag Command 03H and 09H (FIG. 11). Tags 03H and 09H also operate to enable the increment function of counters 280 and 298. In addition, the Controller 36 will issue the appropriate Tag Commands to cause the selected Memory Device 38 to be in a state for carrying out a read operation as previously described. Among other things, Register Control B (FIG. 12G) is selected and the Word Line Trim bits are set so that the Word Line voltage will be somewhat higher than the voltage used in a conventional read operation. In addition, the inactive Tag 1BH signal will cause flip-flops 326 and 328 of the Memory Device State Machine 331 (FIG. 28) to be in a reset state so that control signals A and B are both "0". Inactive Tag 1BH will also cause flip-flops 386, 388, 390 and 392 of the Controller State Machine 364 (FIG. 34) to be in a reset state so that signals C, D, E and F will be inactive.

Figure 29A:
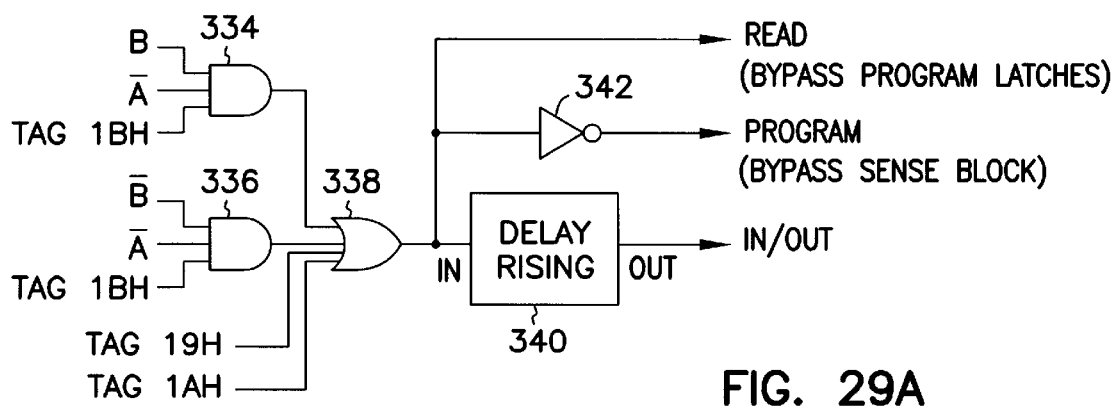
FIG. 29A is a logic diagram illustrating the manner in which signal In/Out is generated by each Memory Device, a signal used to control the direction of the I/O Data Buffer of the Memory Devices.
Figure 29B:
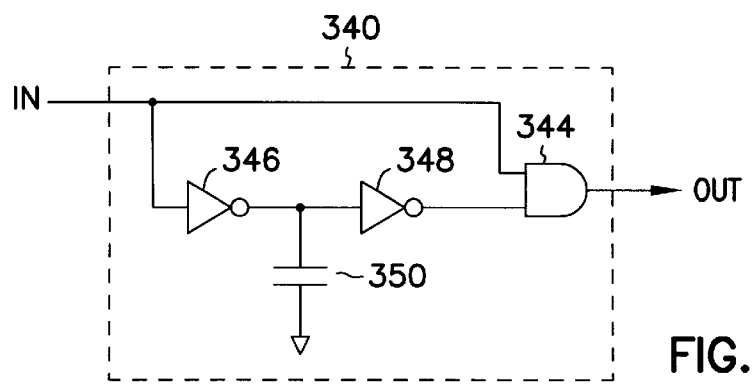
FIG. 29B is a schematic diagram of a delay circuit using in the FIG. 29A logic diagram.

At time T0, Controller 36 is implemented to issue the Tag Command 1BH. The Memory Device State Machine 331 will be in State 0 at this time. When the Local Tag Decoder 84 (FIG. 5) associated with the Memory Device 38 being programmed will detect the presence of Tag 1BH and will cause signal In/Out coupled to I/O Buffer 52 to switch to a state such that Buffer 52 will transfer data read from the Memory Device 38 to the Data Bus 42. FIGS. 29A and 29B show the logic circuitry for generating signal In/Out. An AND gate 334 has respective inputs which receive control signals $\overline{A}$ and B together with signal Tag 1BH. A second AND gate 334 has respective inputs which receive control signals $\overline{A}$ and $\overline{B}$ together with signal Tag 1BH. Gates 334 and 336 function to detect when the state machine of FIG. 28 is in State 1 and 0, respectively. The outputs of gates 334 and 336 are connected to respective inputs of an OR gate 338 along with signals Tag 19H and Tag 1AH. The output of gate 338 is connected to a delay circuit 340 which functions to slightly delay the rising edge of the signal produced by gate 338. The output of delay circuit 340 constitutes signal In/Out used to control the direction of I/O Data Buffer 52 (FIG. 4).

The details of the delay circuit 340 are shown in FIG. 29B. Circuit 340 includes an AND gate 344 having one input connected directly to the input to the circuit and a second input connected to provide a delay introduced by a capacitor 350 disposed intermediate inverters 346 and 348. When the input to circuit 340 goes high, the output of inverter 348 will be delayed thereby delaying the output of gate 344, signal I/O. There is no delay when the input to circuit 340 goes low.

As can be seen from the timing diagram of FIG. 27 and from the circuit of FIG. 29A, at time T0 the output of AND gate 336 will be become active thereby indicating State 0. This will cause signal Bypass Program Latches (FIG. 17) to go active so that the Sense Amplifier circuitry will be connected to the Bit Lines of the memory array. After a short delay introduced by circuit 340 (FIG. 29A), signal In/Out will go high. The purpose of the delay is to avoid contention on the common Data Bus 42 between Controller 36 and the Memory Devices 38.

Figure 30:
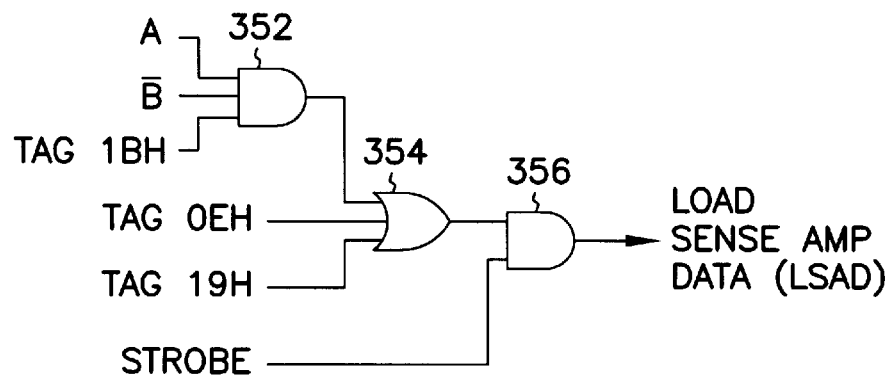
FIG. 30 is a logic diagram illustrating the manner in which signal Load Sense Amplifier Data is generated by each Memory Device, with this signal functioning to latch the output of the Sense Amplifiers during read operations.
Figure 31:
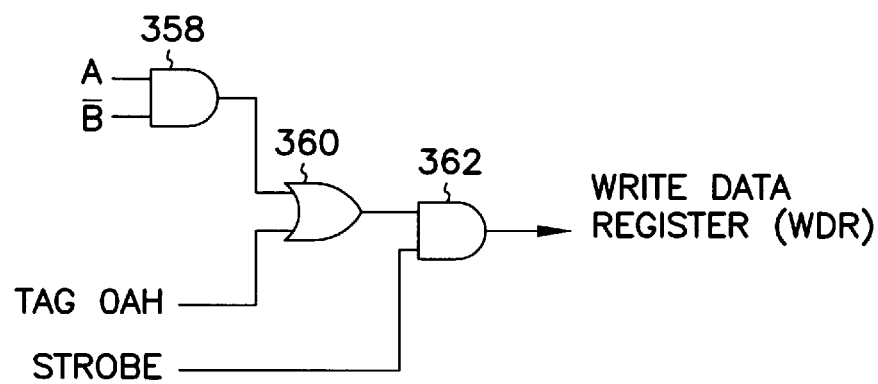
FIG. 31 is a logic diagram illustrating the manner in which signal Write Data Register (WDR) is generated, with this signal functioning to latch data to be programmed.

The first Byte of the first Packet to be verified will then be read from the Memory Device 38 in a manner similar to a normal Read operation. At time T0–T1, Controller 36 will then issue a first signal Strobe, which, as indicated by Table 2, the falling edge of which will cause the FIG. 28 State Machine 331 to switch from State 0 to State 1. Prior to switching to State 1, the Memory Device 38 will generate signal Load Sense Amplifier Data (LSAD). This signal is generated by the circuitry shown in FIG. 30 which comprises AND gate 352, OR gate 354 and AND gate 356. At this time, the output of gate 352 will be active so that signal Load Sense Amplifier (LSAD) will be produced by AND gate 356 having a duration equal to that of signal Strobe.

Signal LSAD will cause the outputs of the eight Sense Amplifiers 116 (FIG. 17) to be latched in the associated Sense Amplifier Latch 132. At time T2, the falling edge of the first signal Strobe will clock the two flip-flops 326 and 328 of the FIG. 28 state machine to cause the machine to enter State 1. Since the D input of flip-flop 328 is high, control signal $\overline{B}$ will become active. Signal $\overline{A}$, produced by flip-flop 328, will remain active. Signal I/O will remain in the same state since the output of gate 334 (FIG. 29A) will become active at the same time the output of gate 336 becomes inactive. In addition, signal LSAD will become inactive since the output of gate 352 (FIG. 30) will be inactive.

Figure 32:
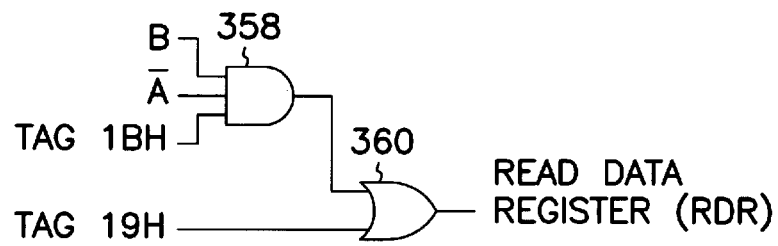
FIG. 32 is a logic diagram illustrating the manner in which signal Read Data Register (RDR) is generated by each Memory Device, with this signal functioning to transfer read data to the Data Bus.

Signal Read Data Register (RDR) becomes active at time T2 and remains active when the Memory Device State Machine 331 is in State 1. Signal RDR is generated by the logic circuitry of FIG. 32 which includes AND gate 358 and OR gate 360. Signal RDR will turn on switch 135 (FIG. 17) thereby causing the loaded Byte of data to be placed on the Data Bus 42 by way of I/O Buffer 52.

Signal Enable Data Output Buffer of Controller 36 will be inactive at this time so that output buffer 370 will be disabled thereby placing Controller 36 in condition to receive data on the Data Bus 42. In addition, the Controller State Machine 364 will cause signal Read Controller Data Latch to go active on the falling edge of signal Strobe. That is because flip-flop 386 would have been previously set on the rising edge of signal Strobe so that signal C is active. Flip-flop 388 would then be set on the falling edge of signal Strobe so that D is active and, since signal Tag 1BH is active AND gate will produce signal Read Controller Data Latch. This signal will permit the data read from the Memory Device 38 to be placed in Latch circuit 378.

At the same time Memory Device 38 is carrying out the read operation, Controller 36, by way of DMA Address circuit 382, will fetch the first Byte of data previously programmed from the Buffer Memory at a location that corresponds to Byte Address 00H. Controller 36 will compare the received data with the fetched Byte of data using the Modify Logic circuitry 380. In the likely event that one or more cells were not programmed (a "1" was not programmed to a "0"), Controller 36 will generate a modified Byte to be used in a subsequent programming operation. The modified Byte is sometimes referred herein as the verify data. Bits of the modified Byte that have been successfully programmed will be set to a "1" so that no further programming pulses will be applied to the associated cell so as to avoid over-programming. The modified data is generated by the Modify Logic circuitry which performs an Exclusive NOR function on the data just read from the Memory Device with the data fetched from the Controller buffer memory. The modified (or compare) data is then passed through a Compare "1" circuit 384 which searches the modified data to determine whether the modified data contains all ones. If all of the thirty-two Bytes of modified data are "1", the Packet of data has been successfully programmed and the verification process is concluded. In that a single programming pulse is probably not sufficient to program a flash cell, it is likely that modified data will contain one or more zeros.

Controller 36 will generate a second signal Strobe having a rising edge at time T3 and a falling edge at time T4. The rising edge will cause flip-flop 386 of the Controller State Machine 364 (FIG. 34) to change state so that signal C goes inactive. This will cause signal Read Controller Data Latch to go inactive thereby latching the data in Latch 378 so that the data will not be affected by changes on the Data Bus 42. The falling edge of signal Strobe at time T4 will cause the Memory Device State Machine of FIG. 28 to enter State 2 with control signals A and $\overline{B}$ being active. This will terminate the read segment of the sequence. Signal RDR will go inactive and signal In/Out will change state so that I/O Buffer 52 will be capable of transferring modified data from Controller 36 into the Memory Device 38.

On the rising edge of signal Strobe at time T3, flip-flop 390 of the Controller State Machine 364 will be clocked. Since control signals $\overline{E}$ and C are both active at this point, the D input to flip-flop 390 will be active so that output control signal E will become active. Thus, on the falling edge of signal Strobe at time T3. flip-flop 392 will change state so that signal Enable Controller Data Out Buffers will become active. The rising edge of this signal is preferably delayed a small amount by Delay Rising circuit 376 (FIG. 33) which is constructed in a manner similar to the Delay Rising circuit of FIG. 29B. Thus, output buffers 370 will be enabled so that Controller 36 will be capable of driving the Data Bus 42.

At time T4, Controller 36 continues to output Tag 1BH on the Tag Bus 40 and places the modified Byte to be programmed on the Data Bus 42. In addition, Controller 36 will issue a signal Strobe having a rising edge at time T5. This rising edge will not affect flip-flop 392 of the Controller State Machine 364 so signal Enable Controller Data Output Buffer will remain active. Memory Device 38 will respond by making signal Write Data Register (WDR) active. Since signals A and $\overline{B}$ of the Memory Device State Machine 331 are also active at this time therefor AND gate 285 (FIG. 22) will cause signal Byte Address Increment (BAI) to be active. At time T6, the falling edge of signal Strobe will cause signal WDR fall thereby causing the modified data from Controller 36 to be loaded into Program Data Register 0 (401A of FIG. 26) which corresponds to Byte Address 00H. The modified data will not be programmed until all thirty-two Program Data Registers have been loaded. In addition, signal BAI will fall thereby causing the Byte Address counter 280 to increment to address 01H in preparation for verification of the data previously programmed at that address.

The falling edge of the third signal Strobe will also cause the Memory Device State Machine 331 to return to State 0. The falling edge will further clock flip-flop 392 of the Controller State Machine 364 thereby causing signal Enable Controller Data Out to go inactive so that the output data buffers 370 (FIG. 33) of Controller 36 are disabled thereby permitting the Controller to receive data from the Memory Devices 38.

At time T6, the Read, Modify, Write sequence will be repeated for Byte Address 01H. The data previously programmed at this address is read from the Memory Device 38 and latched in the Sense Amplifier latch 132 (FIG. 17) at time T8. Signal In/Out was previously set at time T6 so that I/O Buffer 52 of the Memory Device 38 will be capable of placing the read data on the Data Bus 42. The Modify Logic circuitry 380 of Controller 36 will produce the modified Byte of data and will transfer the data to the Memory Device 38. Signal WDR in FIG. 26 will cause the Program Register Decoder circuit 402 to load the modified Byte of data into the first Program Data Register 1 (register 401B) since the Byte Address is 01H.

This sequence will be repeated until all thirty-two Program Data Registers 401 have been loaded with the modified data provided by Controller 36. Controller 36 will then issue appropriate Tag Commands to cause the thirty-two Bytes of data to be programmed a second time. The verify sequence is then repeated until the Compare "1" circuit 384 confirms that the modified data is all ones, thereby indicating that the cells to be programmed from the erase state of "1" to the programmed state of "0" have been programmed. In the event an entire Sector is to be programmed, the next Packet of data (thirty-two Bytes) will be programmed and verified. Note that when a Packet has been confirmed to be properly programmed, confirmation of the next Packet will automatically commence provided that signal Pinc En (FIG. 23), which enables the Packet Address Counter 298 to be incremented by the $A_4$ of the Byte Address Counter 280, has been made active. This will continue until the last Packet of data of the Sector has been programmed and verified.

Note that in a normal Read Operation, data is transferred from the Memory Device 38 to the Controller 36 over the Data Bus 42 and through the eight input data buffer circuits 372. The data is transferred through latch 378, with latch 378 being an transparent latch. The data is then passed through the Modify Logic circuitry 380 and the Compare "1" circuit to the remainder of the Controller 36A without being altered by this circuitry. Controller 36A holds the data read from the Memory Device 38 where it is stored in a buffer memory (not shown).

Erase Operation

Figure 20A:
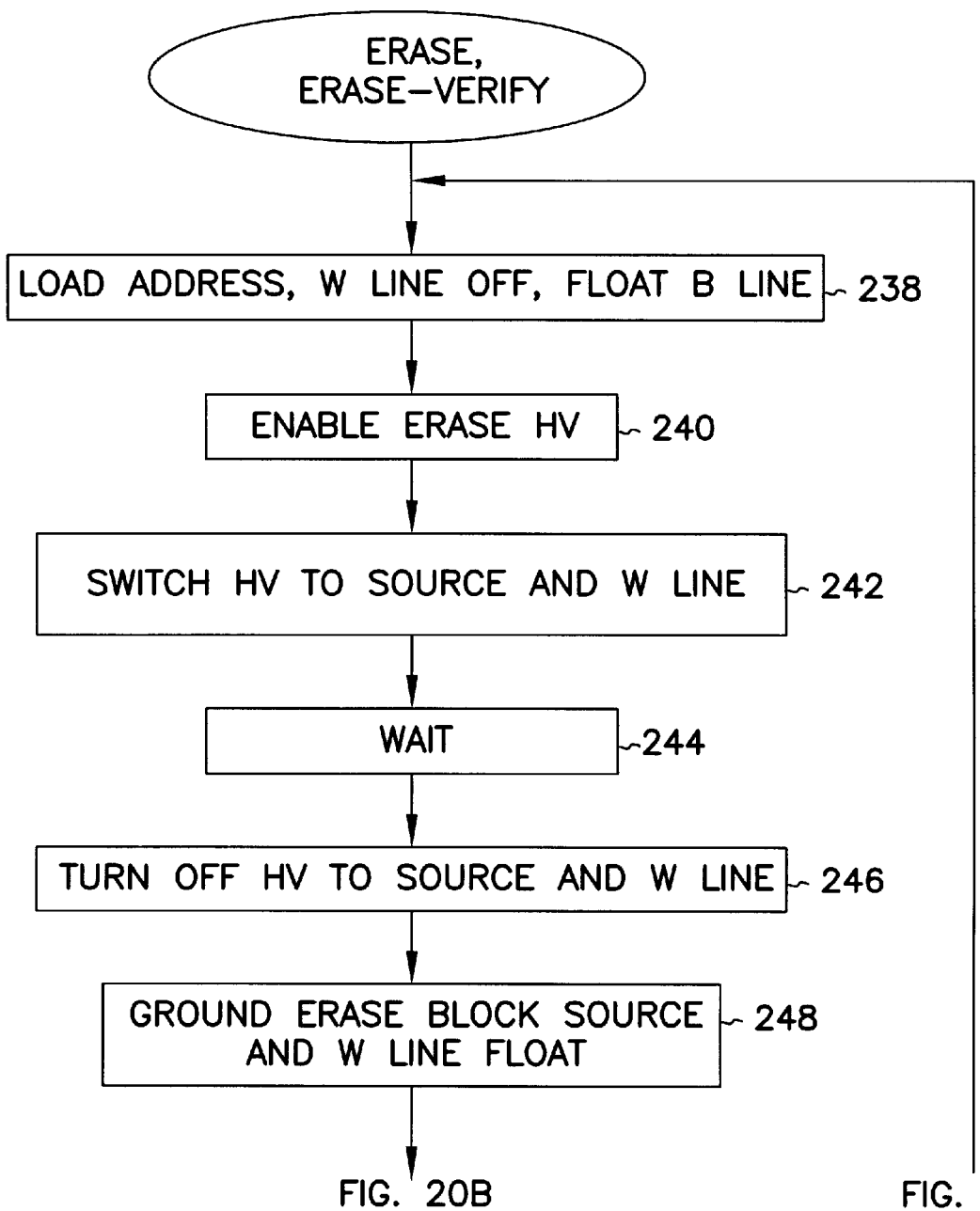
FIGS. 20A and 20B are a flow chart illustrating an exemplary Erase Operation for the FIG. 3A and 3B memory systems.
Figure 20B:
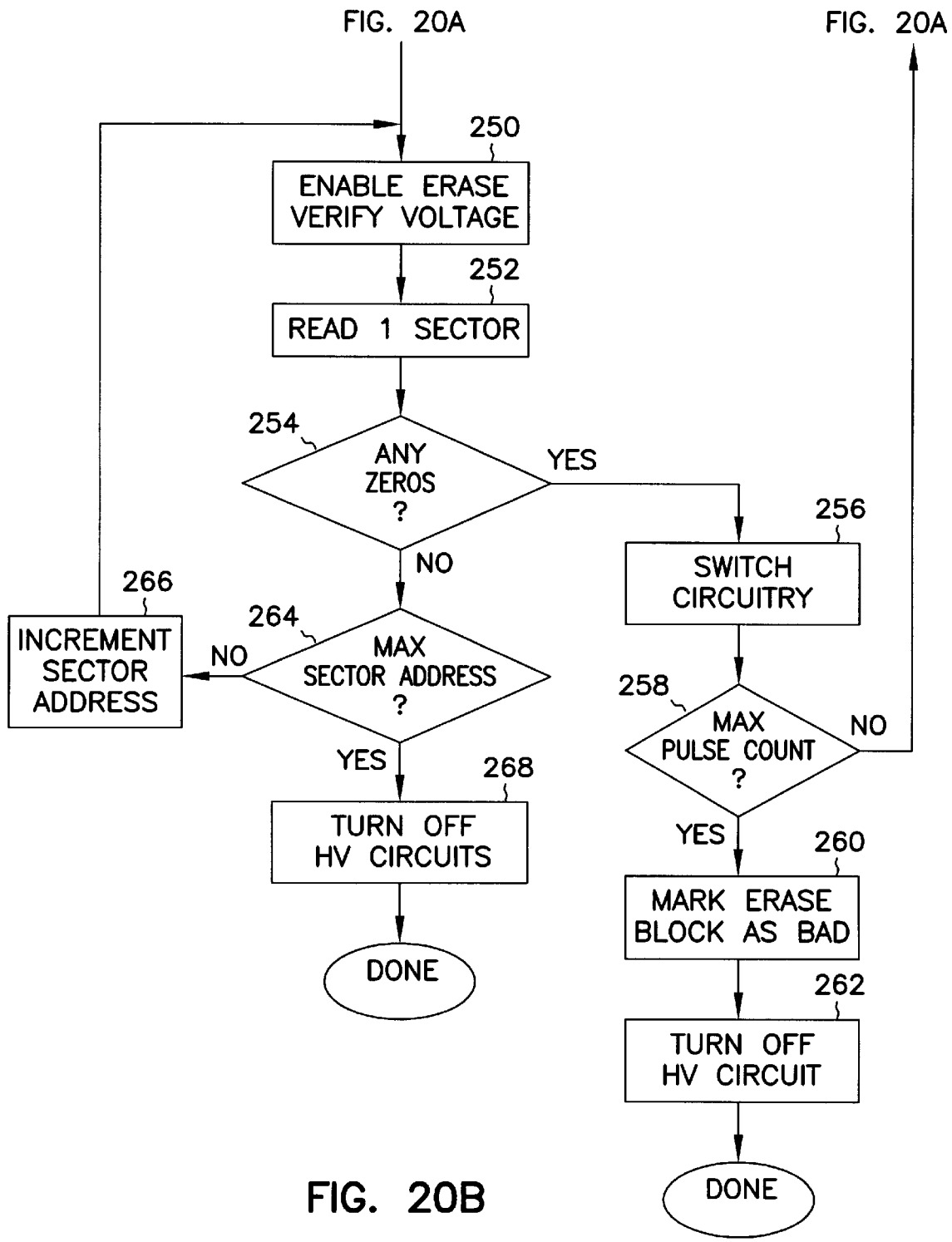

As previously explained, Erase Operations are performed on all cells located in a particular Erase Block. FIGS. 20A and 20B are a flow chart illustrating an exemplary Erase Operation for the FIG. 3A memory system. In the exemplary memory system, cells are erased using a negative gate erase sequence as described more fully in patent application Ser. No. 08/606,215 and filed on Feb. 23, 1996 and entitled SEGMENTED NON-VOLATILE MEMORY ARRAY WITH MULTIPLE SOURCES HAVING IMPROVED SOURCE LINE DECODE CIRCUITRY, now U.S Pat. No. 5,687,117. The contents of such application are hereby fully incorporated into the present application by reference. Erasure is accomplished by setting all of the Word Lines of the selected Erase Block to a large negative voltage, such as −10 volts. The Bit Lines are all left floating (set to a high impedance) and the Source Line of the selected Erase Block is set to a positive voltage, such as +5 volts. This set of conditions will cause any excess electrons present on the floating gate of the cells to be removed thereby causing the cells to become erased. As is conventional, the voltages are applied for a fixed duration, similar to a voltage pulse. The duration is set so that several of such erase pulses need to be applied in order to complete the Erase Operation. After each erase pulse has been applied, Controller 36 will perform an Erase Verification sequence to determine whether all of the cells have been adequately erased. The Erase Verification is a type of read operation which functions to confirm that the threshold voltages of all of the cells have been reduced to the desired level.

Referring to FIG. 20A, the first step of the erase sequence is carried out by Controller 36 first selecting the Memory Device 38 containing the Erase Block to be erased in the manner previously described in connection with the Read and Program operations. Once the Device 38 has been selected, Controller 36 loads the address $A_{22}$ to $A_{16}$ of the Main Block which contains the Erase Block to be erased into the Block Address Register (FIG. 12B) (element 238). This is accomplished when Tag Command 05H (FIG. 11) is issued on the Tag Bus 40 and address $A_{22}$ to $A_{16}$ are placed on the Data Bus 42. In addition, Controller 36 causes the Bit Lines of the array to float and causes the Word Lines of the Erase Block to be disabled by setting the appropriate bits in the appropriate Control Registers to the desired state. First, Register Control F (FIG. 12K) is selected and Bit 0 is set to a "0" thereby enabling the Bit Line float function. Next, Register Control E (FIG. 12J) is selected and all bits are set to a "0" except for Bit 0 which is set to a "1". Since Bit 3 is a "0", all of the Word Line decoders of the selected Erase Block will be disabled.

As indicated by element 240, the various circuits used for carrying out the erase operation are enabled by Controller 36 setting the appropriate bits in the Control Registers which control such circuitry. Register Control B (FIG. 12G) is selected and the appropriate Word Line voltage trim bit values are loaded into the register. Note that the Word Line voltage will be negative, with Bits 0–2 of the register functioning to control the magnitude of the negative voltage applied to Word Line of the selected Erase Block by the Word Line Supply Circuit 324.

Register Control H (FIG. 12H) is then selected and Bit 1 is set to a "1" thereby enabling the High Current Charge Pump circuit 310.

Continuing, Register Control I (FIG. 12N) is selected and Bit 6 is set to a "1" so as to enable the Negative Charge Pump circuit 322 (FIG. 24A). In addition, Bits 2–5 of Register Control I are set, with these bits being trim bits coupled to the Source Switch circuit 318 (FIG. 24B) and used to control the magnitude of the positive voltage applied to the Source Line of the Erase Block being erased. The Source Switch circuit 318 is enabled by setting Bit 2 to a "1".

Bit 1 of Register Control I (FIG. 12N) is used to control signal Erase connected to the Word Line Supply circuit 324 of FIG. 24A. When Bit 1 is a "1", the signal is enabled so that the negative output voltage VPN provided by Negative Pump circuit 322 is connected to the Word Lines of the selected Erase Block by way of the X Decoder circuits. The Word Line Supply circuit 324 functions to connect primary supply voltage VCC to the deselected Blocks. As previously described, when Bit 1 is a "0", thereby indicating that an operation other than an Erase operation is to be carried out. The Word Line Supply circuit 324 applies the positive voltage VPX produced by the Low Current Pump circuit 314 to the Word Lines of the selected Erase Block and voltage Vcc to the deselected Block. In present case, Bit 1 is set to a "1" so that negative voltage VPN will be applied to the Word Lines of the selected Erase Block.

Register Control C (FIG. 12H) is then selected and Bits 5 and 7 are set to a "1" to enable Low Current Pump circuit 314 and to enable the VPX Switch circuit 320. These conditions cause the actual erase operation to commence. As represented by element 244 of the FIG. 19A flow chart, the Controller will then wait a predetermined amount of time while the erase voltages are applied. During this wait period, a single erase pulse is effectively applied to the selected Erase Block.

The duration of the wait period is such that a single erase pulse is insufficient to adequately erase the Erase Block. However, after application of each erase pulse, an erase verify sequence is carried out to determine whether the Block has been properly erased. The erase verify sequence functions to read the cells of the Erase Block to confirm that all of the cells have been erased and are in a logic "1" state. As indicated by element 246, the high voltages applied to the Source and Word Lines of the Erase Block are removed. This is accomplished by selecting Register Control H and setting Bit 1 to a "0" thereby turning off the High Current Charge Pump circuit 310. Next, the Source Line is grounded and the Word Lines are left floating as indicated by element 248.

The circuitry which provides the voltage used in the erase verify sequence is then enabled as shown by element 250 of FIG. 20B. As is well known, the voltages are similar to those used in normal read operations, but are set to values that tend to detect cells that have only been marginally erased. By way of example, Register Control B (FIG. 12G) is selected and the Word Line Trim bits contained in that register are set such that the Word Line voltage used in Erase Verify is about 1 volt less than the value used in a normal read operation.

As shown by element 252, the Erase Block is verified by reading one Sector at a time. If the verify sequence indicates that any cells in the first Sector are still in a programmed state ("0" state), element 254 indicates that it will be necessary to apply a further erase pulse to all sectors in the Erase Block. Thus, the read circuitry is disabled and disconnected and the erase circuitry is enabled as indicated by element 256. A determination is then made as to whether the number of erase pulses applied exceeds a predetermined maximum number (element 258). If that is the case, it is assumed that the Erase Block cannot be properly erased and the erase sequence will be terminated. Typically, Controller 36 will store an indication that the Erase Block in question is defective and will refrain from further use of such Block. Controller 36 will then disable the high voltage circuitry and other circuitry used in the erase operation as indicated by element 262 thereby concluding the erase operation.

In fact, since only a single erase pulse will have been applied to the Erase Block, the sequence will return to element 238 of FIG. 20A and a second erase pulse will be applied to the Erase Block. This sequence will be repeated until the first Sector of the Erase Block passes the erase verify (element 254). If the first Sector passes, a determination is made as to whether all of the Sectors of the Erase Block have been verified to have been properly erased (element 264). Since only the first Sector has been verified to have been properly erased, the Sector address in the Sector Address Register (FIG. 12C) is then incremented (element 266) by loading a new address into the register and a second Sector is erased and verified. This will continue until all 128 Sectors of the Erase Block have been erased and verified. As indicated by element 268 of FIG. 20B, the Erase sequence is concluded when the high voltage and other circuits used in the sequence are turned off.

Thus, a non-volatile memory system adapted to carrying out an efficient sequence of verifying memory programming operations has been described. Although a preferred embodiment has been described in some detail, it is to be understood that certain changes can be made by those skilled in the art without departing from the spirit and scope of the invention as defined by the appended claims.

We claim:

1. A non-volatile memory system comprising:
    a system bus;
    an array of memory cells;
    a memory controller configured to initiate a memory read operation on the array by issuing a memory read command set, which comprises at least one individual command, over the system bus, to initiate a memory program operation on the array by issuing a memory program command set which comprises at least one individual command, over the system bus, to initiate a memory erase operation on the array by issuing a memory erase command set, which comprises at least one individual command, over the system bus and to initiate a memory program verify operation on the array by issuing a single memory verify command over the system bus, with said memory controller including a data comparator configured to compare data received on the system bus with stored data and to place verify data based upon the comparison on the system bus; and a memory operation manager, operably coupled to the array and to the system bus, with the memory operation manager including a command decoder and a program data register block which holds data to be programmed into the array, with said memory operation manager being configured to carry out the memory read operation in response to detection of the memory read command set on the system bus by the command decoder, the memory erase operation in response to detection of the memory erase command set on the system bus by the command decoder, the memory program operation in response to detection of the memory program command set on the system bus by the command decoder and the memory program verify operation in response to detection of the memory verify command on the system bus by the command decoder, with the memory program verify operation including a transfer of data read at an address of the array to be verified to the memory controller over the system bus followed by a transfer of the verify data received on the system bus to the program register block.

2. The memory system of claim 1 wherein the program command set includes at least one address command, with the memory operation manager including an address register block and wherein the memory operation manager is configured to transfer an address present on the system bus into the address register block in response to detection of the address command by the command decoder and to program the array at an address which corresponds to an address stored in the address register block.

3. The memory system of claim 2 wherein the memory program verify operation is carried out independent of the address command.

4. The memory system of claim 1 wherein the memory program command set includes a load program data command and wherein the memory operation manager is configured to transfer program data received on the system bus into the program data register block in response to detection of the load program data command by the command decoder and to program the array with data stored in the program data register block during the memory program operation.

5. The memory system of claim 4 wherein the memory program verify operation is carried out independent of the load program data command.

6. The memory system of claim 1 wherein the read memory command set includes a load read data command and wherein the memory operation manager further comprises a read data register block and wherein the memory operation manager is configured to transfer data read from the array into the read data register block in response to detection of the load read data command by the command decoder during the memory read operation.

7. The memory system of claim 6 wherein the memory program verify operation includes a transfer of data read from the array at the address to be verified into the read data register block.

8. The memory system of claim 7 wherein the memory operation manager comprises at least one sense amplifier configured to sense current in the array and a sense amplifier latch circuit, operably coupled to an output of the sense amplifier, with the read memory register block comprising the sense amplifier latch circuit.

9. The memory system of claim 8 wherein the load read data command causes the sense amplifier latch circuit to latch data read from the array.

10. The memory system of claim 7 wherein the memory program verify operation is carried out independent of the load read data command.

11. The memory system of claim 1 wherein the read memory command set includes a transfer read data command and wherein the memory operation manager is configured to transfer data in the read data register block to the system bus in response to detection of the transfer read data command by the command decoder during the memory read operation.

12. The memory system of claim 11 wherein the memory program verify operation is carried out independent of the transfer read data command.

13. A non-volatile memory system comprising:
a system bus;
an array of memory cells;
a memory controller configured to initiate a memory read operation on the array by issuing a memory read command set, which comprises at least one individual command, over the system bus, to initiate a memory program operation on the array by issuing a memory program command set, which comprises at least one individual command, including a load program data command, over the system bus, to initiate a memory erase operation on the array by issuing a memory erase command set, which comprises at least one individual command, over the system bus and to initiate a memory program verify operation on the array by issuing a single memory verify command over the system bus, with said memory controller including a data comparator configured to compare data received on the system bus with stored data and to place verify data based upon the comparison on the system bus; and a memory operation manager, operably coupled to the array and to the system bus, with the memory operation manager including a command decoder and a program data register block which holds data to be programmed into the array, with said memory operation manager being configured to carry out the memory read operation in response to detection of the memory read command set on the system bus by the command decoder, the memory erase operation in response to detection of the memory erase command set on the system bus by the command decoder, the memory program operation in response to detection of the memory program command set on the system bus by the command decoder, with the memory program operation including a transfer of program data on the system bus to the program data register block in response to detection of the load program data command, and the memory program verify operation in response to detection of the memory verify command on the system bus by the command decoder, with the memory program verify operation including a transfer of data read at an address of the array to be verified over the system bus followed by a transfer of the verify data received on the system bus to the program data register block, with the memory program verify operation being carried out with the memory verify command being present on the system bus.

14. The memory system of claim 13 wherein the read memory command set includes a load read data command and wherein the memory operation manager further comprises a read data register block and wherein the memory operation manager is configured to transfer data read from the array into the read data register block in response to detection of the load read data command by the command decoder during the memory read operation.

15. The memory system of claim 14 wherein the memory program verify operation includes a transfer of data read from the array at the address to be verified into the read data register block.

16. The memory system of claim 15 wherein the memory operation manager comprises at least one sense amplifier configured to sense current in the array and a sense amplifier latch circuit, operably coupled to an output of the sense amplifier, with the read memory register block comprising the sense amplifier latch circuit.

17. The memory system of claim 16 wherein the load read data command causes the sense amplifier latch circuit to latch data read from the array.

18. The memory system of claim 15 wherein the memory program verify operation is carried out independent of the load read data command.

19. The memory system of claim 18 wherein the read memory command set includes a transfer read data command and wherein the memory operation manager is configured to transfer data in the read data register block to the system bus in response to detection of the transfer read data command by the command decoder during the memory read operation.

20. The memory system of claim 19 wherein the memory program verify operation is carried out independent of the transfer read data command.

21. A non-volatile memory system comprising:
a system bus which includes a tag bus and a data bus;
an array of memory cells;
a memory controller configured to initiate a memory read operation on the array by issuing a memory read command set, which comprises at least one individual command, over the system bus, to initiate a memory program operation on the array by issuing a memory program command set which comprises at least one individual command, over the system bus, to initiate a memory erase operation on the array by issuing a memory erase command set, which comprises at least one individual command, over the system bus and to initiate a memory program verify operation on the array by issuing a memory verify command set over the tag bus, with said memory controller including a data comparator configured to compare data received on the data bus with stored data and to place verify data based upon the comparison on the data bus; and
a memory operation manager, operably coupled to the array and to the system bus, with the memory operation manager including a command decoder, a program data register block which holds data to be programmed into the array and a read data register block which hold data read from the array, with said memory operation manager being configured to carry out the memory read operation in response to detection of the memory read command set on the system bus by the command decoder, the memory erase operation in response to detection of the memory erase command set on the system bus by the command decoder, the memory program operation in response to detection of the memory program command set on the system bus by the command decoder and the memory program verify operation in response to detection of the memory verify command set on the tag bus by the command decoder, with the memory program verify operation including a transfer of data read at an address of the array to be verified to the read data register block followed by a transfer of data from the read data block to the data bus followed by a transfer of the verify data received on the data bus to the program register block.

22. The memory system of claim 21 wherein a command of the memory verify command set is present on the tag bus during the memory program verify operation when the verify data is transferred over the data bus to the memory operation manager.

23. The memory system of claim 22 wherein a command of the memory verify command set is present on the tag bus when the data in the read data register block is transferred to the data bus during the memory program verify operation.

24. The memory system of claim 23 wherein a command of the memory verify command set is present on the tag bus when data read at the address to be verified is transferred to the read data register block.

25. The memory system of claim 24 wherein the memory verify command set comprises a single command and wherein the memory read command set comprises a plurality of commands, the memory program command set comprises a plurality of commands and the memory erase command set comprises a plurality of commands.

26. The memory system of claim 21 wherein the program command set includes at least one address command, with the memory operation manager including an address register block and wherein the memory operation manager is configured to transfer an address present on the data bus into the address register block in response to detection of the address command on the tag bus by the command decoder and to program the array at an address which corresponds to an address stored in the address register block.

27. The memory system of claim 26 wherein the memory program command set includes a load program data command and wherein the memory operation manager is configured to transfer program data received on the data bus into the program data register block in response to detection of the load program data command on the tag bus by the command decoder and to program the array with data stored in the program data register block during the memory program operation.

28. The memory system of claim 21 wherein the system bus includes a strobe signal bus and wherein the memory controller is further configured to place a periodic strobe signal on the strobe signal bus which defines a duration of a memory operation cycle and wherein the memory operation manager is configured to carry out the transfer of data read at an address to be verified to the read data register block in a first one of the memory operation cycles, to carry out the transfer of data from the read data block to the data bus in a second one of the memory operation cycles and to carry out the transfer of the verify data on the data bus to the program register block in a third one of the memory operation cycles, with the first, second and third memory operation cycles being consecutive memory operation cycles.

29. A non-volatile memory system comprising:
a system bus which includes a tag bus;
an array of memory cells;
a memory controller, operably coupled to the system bus, said memory controller being configured to transfer memory operation commands on the system bus together with a strobe signal on the system bus, with the strobe signal defining memory operation cycles, said memory controller being configured to initiate a memory read operation on the array by issuing a memory read command set on the system bus, to initiate a memory program operation on the array by issuing a memory program command set on the system bus, to initiate a memory erase program operation by issuing a memory erase command set on the system bus and a memory program verify operation on the array by issuing a memory verify command set on the system bus, with said memory controller including a data comparator configured to compare data on the system bus with stored data and to place verify data based upon the comparison on the system bus; and a memory operation manager, operably coupled to the array and to the system bus, with the memory operation manager including a command decoder configured to detect the commands placed on the system bus, with a single one of the commands being detectable within one of the memory operation cycles, a program data register block which holds data to be programmed into the array, with said memory operation manager being configured to carry out the memory read operation in response to detection of the memory read command set on the system bus by the command decoder, the memory erase operation in response to detection of the memory erase command set on the system bus by the command decoder, the memory program operation in response to detection of the memory program command set on the system bus by the command decoder and the memory program verify operation in response to detection of the memory verify command on the tag bus by the command decoder, with the memory program verify operation including a transfer of data read at an address of the array to be verified to the system bus during a first one of the memory operation cycles, followed by a transfer of the verify data from the memory controller over the system bus to the memory operation manager during a second one of the memory operation cycles, with the first and second memory operation cycles being consecutive memory operation cycles.

30. The memory system of claim 29 wherein the memory operation manager comprises a read data register block and the memory program verify operation includes a transfer of data read at an address of the array to be verified to the read data register block during a third one of the memory operation cycles and wherein the third, first and second memory operation cycles being consecutive memory operation cycles.

31. The memory system of claim 30 wherein the read memory command set includes a load read data command and wherein the memory operation manager is configured to transfer data read from the array into the read data register block in response to detection of the load read data command by the command decoder during the memory read operation, with the memory program verify operation being carried out independent of the load read data command.

32. A memory system comprising:

a system bus;

a first integrated circuit which includes a memory controller operably coupled to the system bus and configured to issue a memory read command set, a memory program command set which includes a load program data command, a memory erase command set and a memory verify command set over the system bus, with said memory controller further comprising a data comparator configured to compare data received on the system bus with data stored in the memory controller and to place verify data on the system bus based upon the comparison; and a second integrated circuit separate from the first integrated circuit and operably coupled to the system bus, with said second integrated circuit comprising an array of memory cells and a memory operation manager, with the memory operation manager including a command decoder and a program data register block which holds data to be programmed into the array, with the memory operation manager being configured to carry out a memory read operation on the array in response to detection of the memory read command set on the system bus by the command decoder, a memory erase operation on the array in response to detection of the memory erase command set on the system bus by the command decoder, a memory program operation on the array in response to detection of the memory program command set on the system bus by the command decoder including a transfer of program data from the system bus to the program data register block in response to detection of the load program data command and a memory program verify operation on the array in response to detection of the memory verify command on the system bus by the command decoder, with the memory program verify operation including a transfer of data read at an address of the array to be verified to the memory controller over the system bus followed by a transfer of the verify data received on the system bus to the program register block, with the transfer of the verify data being performed independent of the load program data command.

33. The memory system of claim 32 wherein the memory verify command set comprises a single command and wherein the memory program command set, the memory erase command set and the memory read command set each comprise a plurality of commands.

34. The memory system of claim 32 wherein the memory controller is configured to issue each of the commands over the system bus within a memory operation cycle and wherein the memory program verify operation is carried out during three consecutive ones of the memory operation cycles.

35. The memory system of claim 34 wherein the memory controller is configured to place a strobe signal on the system bus, with the strobe signal defining the memory operation cycles.

36. A non-volatile memory system comprising:

a system bus;

a memory controller operably coupled to the system bus and configured to issue a memory read command set, a memory program command set, a memory erase command set and a memory verify command over the system bus, with said memory controller further comprising a data comparator configured to compare data received on the system bus with data stored in the memory controller and to place verify data on the system bus based upon the comparison; and an array of memory cells;

a memory operation manager operably coupled to the system bus and to the array of memory cells and comprising a command decoder, a read data register block and a program data register block, said memory operation manager being configured to carry out a memory read operation on the array in response to detection of the memory read command set on the system bus by the command decoder, a memory program operation on the array in response to detection of the memory program command set on the system bus by the command decoder and a memory erase operation in response to detection of the memory erase command set on the system bus and a memory program verify operation on a plurality of addresses of the array in response to detection of a single one of the memory verify commands on the system bus by the command decoder, with the memory program verify operation for each address to be verified including a transfer of data read at the address to be verified to the read data register block, a transfer of data from the read data register block to the system bus and a transfer of the verify data on the system bus to the program data register block.

37. The memory system of claim 36 wherein the memory controller is configured to issue commands on the system bus at a rate no greater than a memory operation cycle and wherein the transfer of data read at a first address to be verified is carried out in a first memory operation cycle, the transfer of data from the read data register block for the first address to be verified is carried out in a second memory operation cycle, the transfer of the verify data over the system bus for the first address to be verified is carried out in a third memory operation cycle, the transfer of data read from the second address to be verified is carried out in a fourth memory operation cycle, the transfer of data from the read data register block for the second address to be verified is carried out in a fifth memory operation cycle and the transfer of the verify data over the system bus for the second address to be verified is carried out in a sixth memory operation cycle, with the first, second, third, fourth, fifth and sixth memory operation cycles being consecutive cycles.

38. The memory system of claim 37 wherein the memory controller is configured to place a strobe signal on the system bus, with the strobe signal defining the memory operation cycles.

39. A memory device for use in a memory system which includes a system bus and a memory controller configured to issue a memory read command set, a memory program command set, a memory erase command set and a memory verify command over the system bus, with said memory controller further comprising a data comparator configured to compare data received on the system bus with data stored in the memory controller and to place verify data on the system bus based upon the comparison, said memory device comprising:

an array of memory cells;

a memory operation manager operably coupled to the system bus and to the array of memory cells and comprising a command decoder, a read data register block and a program data register block, said memory operation manager being configured to carry out a memory read operation on the array in response to detection of the memory read command set on the system bus by the command decoder, a memory program operation on the array in response to detection of the memory program command set on the system bus by the command decoder and a memory erase operation in response to detection of the memory erase command set on the system bus and a memory program verify operation on a plurality of addresses of the array in response to detection of a single one of the memory verify commands on the system bus by the command decoder, with the memory program verify operation for each address to be verified including a transfer of data read at the address to be verified to the read data register block, a transfer of data from the read data register block to the system bus and a transfer of the verify data on the system bus to the program data register block.

40. The memory device of claim 39 wherein the memory controller is configured to issue commands on the system bus at a rate no greater than a memory operation cycle and wherein the transfer of data read at a first address to be verified is carried out in a first memory operation cycle, the transfer of data from the read data register block for the first address to be verified is carried out in a second memory operation cycle, the transfer of the verify data over the system bus for the first address to be verified is carried out in a third memory operation cycle, the transfer of data read from the second address to be verified is carried out in a fourth memory operation cycle, the transfer of data from the read data register block for the second address to be verified is carried out in a fifth memory operation cycle and the transfer of the verify data over the system bus for the second address to be verified is carried out in a sixth memory operation cycle, with the first, second, third, fourth, fifth and sixth memory operation cycles being consecutive cycles.

41. A memory device for use in a memory system which includes a system bus and a memory controller configured to issue a memory read command set, a memory program command set, with the memory program set including load program data command, a memory erase command set and a memory verify command set over the system bus, with said memory controller further comprising a data comparator configured to compare data received on the system bus with data stored in the memory controller and to place verify data on the system bus based upon the comparison, said memory device comprising:

an array of memory cells;

a memory operation manager operably coupled to the system bus and to the array of memory cells and comprising a command decoder, a read data register block and a program data register block, said memory operation manager being configured to carry out a memory read operation on the array in response to detection of the memory read command set on the system bus by the command decoder, a memory program operation on the array in response to detection of the memory program command set on the system bus by the command decoder, with the memory program operation including a transfer of program data on the system bus to the program data register block in response to detection of the load program data command by the command decoder and a memory erase operation in response to detection of the memory erase command set on the system bus and a memory program verify operation on an addresses of the array to be verified in response to detection of the memory verify command on the system bus by the command decoder, with the memory program verify operation including a transfer of data read at the address to be verified to the read data register block, a transfer of data from the read data register block to the system bus and a transfer of the verify data on the system bus to the program data register block, with the transfer of the verify data to the program data register block being carried out independent of the load program data command.

42. The memory device of claim 41 wherein the read data command set includes a load read data command and wherein the memory read operation includes a transfer of data read out of the array to the read data register block in response to detection of the load read data command by the command decoder and wherein the transfer of data read at the address to be verified during the memory program verify operation is carried out independent of the load read data command.

43. A method of controlling operation of a memory device coupled to a system bus, with the memory device comprising an array of memory cells, a memory program data register block, and a read data register block, said method comprising the following steps:

issuing a program command set over the system bus, with the program command set including a load program data command, an array address to be programmed and program data to be programmed;

transferring the program data from the system bus to the memory program data register block in response to receipt of the load program data command;

programming the memory array at the array address received over the system bus with data held in the memory program data register;

issuing a memory verify command set over the system bus;

transferring data read at the array address to the read data register block in response to receipt of the memory verify command set;

transferring data in the read data register block to the system bus in response to receipt of the memory verify command set;

comparing data on the system bus with the program data and placing verify data on the system bus;

transferring the verify data to the program data register block in response to receipt of the memory verify command set and independent of the load program data command.

44. The method of claim 43 wherein, subsequent to the step of transferring the verify data to the program data register, further comprising the step of programming the verify data in the program data register block into the array at the array address.

45. The method of claim 43 wherein the program command set comprises a plurality of individual commands and the memory verify command set comprises a single individual command.

46. The method of claim 43 wherein the system bus includes a tag bus and a data bus and wherein the memory verify command is issued over the tag bus and the data in the read data register block is transferred to the data bus and the verify data is transferred to the program data register block over the data bus.

47. The method of claim 43 wherein the step of transferring the verify data is carried out only in the event the step of comparing indicates that there is a difference between the data on the system bus and the program data.

48. A method of controlling operation of a memory device coupled to a system bus, with the memory device comprising an array of memory cells, a memory program data register block, and a read data register block, said method comprising the following steps:

issuing a program command set over the system bus, with the program command set including a load program data command, an array address to be programmed and program data to be programmed, with each command of the program command set being issued during a separate memory operation cycle;

transferring the program data from the system bus to the memory program data register block in response to receipt of the load program data command;

programming the memory array at the array address received over the system bus with data held in the memory program data register;

issuing a memory verify command set over the system bus;

transferring data read at the array address to the read data register block in response to receipt of the memory verify command set during a first one of the memory operation cycles;

transferring data in the read data register block to the system bus in response to receipt of the memory verify command set during a second one of the memory operation cycles;

comparing data on the system bus with the program data and placing verify data on the system bus;

transferring the verify data on the system bus to the program data register block in response to receipt of the memory verify command during a third one of the memory operation cycles, with the first, second and third memory operation cycles being consecutive operation cycles.

49. The method of claim 48 further comprising the step of issuing a strobe signal over the system bus, with the strobe signal defining the memory operation cycles.

50. The method of claim 48 wherein the system bus includes a tag bus and a data bus and wherein the step of issuing a memory verify command set over the system bus includes the step of issuing a single memory verify command over the tag bus and wherein the step of transferring data in the read data register block in response to receipt of the memory verify command set includes the step of transferring the data in the read data register block over the data bus, the step of transferring the verify data in response to the program data register block includes the step of transferring the control data over the data bus.

51. The method of claim 50 wherein the single memory verify command is present on the tag bus when the data in the read data register block is transferred over the data bus and when the verify data is transferred over the data bus.

52. A method of controlling operation of a memory device coupled to a system bus, with the memory device comprising an array of memory cells, a program data register block and a read data register block, said method comprising the following steps:

placing a strobe signal on the system bus, with the strobe signal defining memory operation cycles;

issuing a program command set over the system bus, with the program command set including a plurality of commands and an array address to be programmed and program data to be programmed;

programming the memory array at the array address received over the system bus with program data received over the system bus;

issuing a single memory verify command over the system bus;

transferring data read at the array address to the read data register block in response to receipt of the memory verify command during a first one of the memory operation cycles;

transferring data in the read data register block to the system bus in response to receipt of the memory verify command during a second one of the memory operation cycles;

comparing data on the system bus with the program data and placing verify data, based upon the step of comparing, on the system bus;

transferring the verify data on the system bus to the program data register block in response to receipt of the memory verify command during a third one of the memory operation cycles, with the first, second and third memory operation cycles being consecutive operation cycles.

53. The method of claim 52 wherein the step of placing the verify data on the system bus is carried out only if there is a no compare between the data on the system bus and the program data.

54. The method of claim 52 wherein the program command set includes a load program data command and wherein the step of programming the memory array includes the step of transferring the program data from the system bus to the program data register block in response to receipt of the load program data command.

55. The method of claim 54 wherein the step of transferring the verify data on the system bus to the program data register block is carried out independent of the load program data command.

56. A non-volatile memory system comprising:
a system bus which includes a bi-directional data bus;
an array of memory cells;
a memory controller configured to initiate a memory read operation on the array, to initiate a memory program operation on the array, to initiate a memory erase operation on the array and to initiate a memory program verify operation on the array, with the memory program verify operation being initiated by issuance of a memory verify command over the system bus, with said memory controller including a data comparator configured to compare data received on the data bus with stored data and to place verify data based upon the comparison on the data bus; and
a memory operation manager, operably coupled to the array, with the memory operation manager including a command decoder, a program data register block which holds data to be programmed into the array and a bus interface operably coupled to the system bus and which includes data bus direction control circuitry, with said memory operation manager being configured to carry out the memory read operation, the memory erase operation, the memory program operation and the memory program verify operation, with the memory program verify operation being carried out in response to detection of the memory verify command on the system bus by the command decoder and with the memory program verify operation including switching the data bus direction control circuitry for transfer on the data bus from the memory operation manager to the memory controller, a transfer of data read at an address of the array to be verified to the memory controller over the data bus followed by switching the data bus direction control circuitry for transfer on the data bus from the memory controller to the memory operation manager and a transfer of the verify data from the memory controller to the memory operation manager over the data bus and a transfer of the verify data received on the data bus to the program register block.

57. The memory system of claim 56 wherein the memory controller comprises a bus interface operably coupled to the system bus, with the bus interface including data bus direction control circuitry, with the memory controller being configured to switch the memory controller data bus direction control circuitry for transfer from the memory operation manager to the memory controller followed by the transfer of the data read at the address to be verified to the memory controller over the data bus.

58. The memory system of claim 57 wherein the memory controller is further configured to switch the memory controller data bus direction circuitry for transfer from the memory controller to the memory operation manager followed by the transfer of the verify data from the memory operation manager to the memory controller over the data bus.

59. The memory system of claim 58 wherein the system bus includes a tag bus and wherein the memory verify command is transferred over the tag bus to the memory operation manager.

60. The memory system of claim 59 wherein the memory verify command is present on the tag bus when the data read at an address to be verified is transferred over the data bus.

61. The memory system of claim 60 wherein the memory verify command is present on the tag bus when the verify data is transferred over the data bus.

62. The memory system of claim 56 wherein the system bus further includes a strobe bus and wherein the memory controller is further configured to issue a strobe signal on the strobe bus, with the memory operation manager data bus direction control circuitry being switched for transfer on the data bus from the memory operation manager to the memory controller and being switched for transfer on the data bus from the memory controller to the memory operation manager in response to a change in state of the strobe signal, with the memory operation manager further comprising a delay circuit for providing a time delay between the change in state in the strobe signal and a time at which the memory operation manager data bus direction control circuitry is switched to for the transfer on the data bus from the memory operation manager to the memory controller.

63. The memory system of claim 58 wherein the system bus further includes a strobe bus and wherein the memory controller is further configured to issue a strobe signal on the strobe bus, with the memory operation manager data bus direction control circuitry being switched for transfer on the data bus from the memory operation manager to the memory controller and being switched for transfer on the data bus from the memory controller to the memory operation manager in response to a change in state of the strobe signal and with the memory controller data bus direction control circuitry being switched for transfer on the data bus from the memory operation manager to the memory controller and being switched for transfer on the data bus from the memory controller to the memory operation manager in response to a change in state of the strobe signal, with the memory operation manager further comprising a delay circuit configured to provide a time delay between the change in state in the strobe signal and a time at which the memory operation manager data bus direction control circuitry is switched for the transfer on the data bus from the memory operation manager to the memory controller and with memory controller further comprising a delay circuit configured to provide a time delay between the change in state in the strobe signal and a time at which the memory controller is switched for transfer on the data bus from the memory controller to the memory operation manager.

64. The memory system of claim 58 further comprising data bus contention control circuitry configured to prevent the memory operation manager data bus direction control circuitry from switching for transfer on the data bus from the memory operation manager to the memory controller until after the memory controller data bus direction control circuitry is switched for transfer on the data bus from the memory operation manager to the memory controller.

65. The memory system of claim 64 wherein the data bus contention control circuitry is further configured to prevent the memory controller data bus direction control circuitry from switching for transfer on the data bus from the memory controller to the memory operation manager until after the memory operation manager data bus direction control circuitry is switched for transfer on the data bus from the memory controller to the memory operation manager.

66. The memory system of claim 64 wherein the data bus contention control circuitry includes a first delay circuit configured to control operation of the manager data bus control circuitry and a second delay circuit configured to control operation of the memory controller data bus control circuitry.

67. A non-volatile memory system comprising:

a system bus which includes a bi-directional data bus;

an array of memory cells;

a memory controller, operably coupled to the system bus and configured to initiate a memory read operation on the array, to initiate a memory program operation on the array, to initiate a memory erase operation on the array and to initiate a memory program verify operation on the array, with the memory controller comprising data bus direction control circuitry switchable for transfer on the data bus into the memory controller and for transfer on the data bus out of the memory controller;

a memory operation manager, operably coupled to the array and to the system bus, with the memory operation manager being configured to carry out the memory read, program, erase and program verify operations on the array, said memory operation manager comprising data bus direction control circuitry switchable for transfer on the data bus into the memory operation manager and for transfer on the data bus for transfer out of the memory operation manager; and bus contention control circuitry configured to control the memory controller and the memory operation manager bus direction control circuitry so that the memory operation manager bus direction control circuitry does not switch for transfer out of the memory operation manager at a time when the memory controller opera- tion manager bus direction control circuitry is switched for transfer out of the memory controller, with the bus contention control circuitry including a delay circuit operably coupled to the memory operation manager bus direction control circuit.

68. The memory system of claim 67 wherein the bus contention control circuitry includes a delay circuit operably coupled to the memory controller bus direction control circuit.

69. The memory system of claim 68 wherein the delay circuits are responsive to a common timing signal.

70. The memory system of claim 69 wherein system bus includes a strobe signal bus and wherein the memory controller is configured to place a strobe signal on the strobe signal bus and wherein the strobe signal is the common timing signal.

71. A non-volatile memory system comprising:

a system bus which includes a bi-directional data bus;

an array of memory cells;

a memory controller configured to initiate a memory read operation on the array, to initiate a memory program operation on the array, to initiate a memory erase operation on the array and to initiate a memory pro- gram verify operation on the array, with the memory program verify operation being initiated by issuance of a memory verify command over the system bus, with said memory controller including a data comparator configured to compare data received on the data bus with stored data and to place verify data based upon the comparison on the data bus and a verify terminator configured to terminate one of the memory program verify operations in the event the stored data compares with the data received on the data bus; and a memory operation manager, operably coupled to the array, with the memory operation manager including a command decoder, a program data register block which holds data to be programmed into the array and a bus interface operably coupled to the system bus and which includes data bus direction control circuitry, with said memory operation manager being configured to carry out the memory read operation, the memory erase operation, the memory program operation and the memory program verify operation, with the memory program verify operation being carried out in response to detection of the memory verify command on the system bus by the command decoder and with the memory program verify operation including switching the data bus direction control circuitry for transfer on the data bus from the memory operation manager to the memory controller, a transfer of data read at an address of the array to be verified to the memory controller over the data bus followed by switching the data bus direc- tion control circuitry for transfer on the data bus from the memory controller to the memory operation man- ager and a transfer of the verify data from the memory controller to the memory operation manager over the data bus and a transfer of the verify data received on the data bus to the program register block.

72. The memory system of claim 71 wherein the memory controller is configured to initiate one of the memory program operations subsequent to the transfer of the verify data to the program register block.

73. The memory system of claim 72 wherein the memory controller and the memory operation manager are configured to perform the memory program operation on a plurality of addresses of the array of memory cells and wherein the program register block is configured to hold verify data associated with the plurality of array addresses.

74. The memory system of claim 73 wherein the memory program operation initiated subsequent to the transfer of the verify data to the program register block is initiated subse- quent to the transfer of the verify data associated with the plurality of array addresses.

75. A non-volatile memory system comprising:

a system bus;

an array of memory cells;

a memory controller configured to initiate a memory read operation on the array by issuing a memory read command set, which comprises at least one individual command, over the system bus, to initiate a memory program operation on the array by issuing a memory program command set which comprises at least one individual command, over the system bus, to initiate a memory erase operation on the array by issuing a memory erase command set, which comprises at least one individual command, over the system bus and to initiate a memory program verify operation on the array by issuing a single memory verify command over the system bus, with said memory controller including a data comparator configured to compare data received on the system bus with stored data and to place verify data based upon the comparison on the system bus and including a verify terminator configured to terminate one of the memory program verify operations in the event the stored data compares with the data received on the data bus; and a memory operation manager, operably coupled to the array and to the system bus, with the memory operation manager including a command decoder and a program data register block which holds data to be programmed into the array, with said memory operation manager being configured to carry out the memory read operation in response to detection of the memory read command set on the system bus by the command decoder, the memory erase operation in response to detection of the memory erase command set on the system bus by the command decoder, the memory program operation in response to detection of the memory program command set on the system bus by the command decoder and the memory program verify operation in response to detection of the memory verify command on the system bus by the command decoder, with the memory program verify operation including a transfer of data read at an address of the array to be verified to the memory controller over the system bus followed by a transfer of the verify data received on the system bus to the program register block.

76. The memory system of claim 75 wherein the memory controller is configured to initiate one of the memory program operations subsequent to the transfer of the verify data to the program register block.

77. The memory system of claim 76 wherein the memory controller and the memory operation manager are configured to perform the memory program operation on a plurality of addresses of the array of memory cells and wherein the program register block is configured to hold verify data associated with the plurality of array addresses.

78. The memory system of claim 77 wherein the memory program operation initiated subsequent to the transfer of the verify data to the program register block is initiated subsequent to the transfer of the verify data associated with the plurality of array addresses.

79. A non-volatile memory system comprising:

a system bus;

an array of memory cells;

a memory controller configured to initiate a memory read operation on the array by issuing a memory read command set, which comprises at least one individual command, over the system bus, to initiate a memory program operation on the array by issuing a memory program command set which comprises at least one individual command, over the system bus, to initiate a memory erase operation on the array by issuing a memory erase command set, which comprises at least one individual command, over the system bus and to initiate a memory program verify operation on the array of a plurality of groups of array addresses by issuing a single memory verify command over the system bus, with said memory controller including a data comparator configured to compare data received on the system bus with stored data and to place verify data based upon the comparison on the system bus and including a verify terminator configured to terminate the memory program verify operation on one of the groups of array addresses in the event the stored data compares with the data received on the data bus for the one group and to then commence one of the memory program verify operations on a further one of the address groups; and a memory operation manager, operably coupled to the array and to the system bus, with the memory operation manager including a command decoder and a program data register block which holds data to be programmed into the array, with said memory operation manager being configured to carry out the memory read operation in response to detection of the memory read command set on the system bus by the command decoder, the memory erase operation in response to detection of the memory erase command set on the system bus by the command decoder, the memory program operation in response to detection of the memory program command set on the system bus by the command decoder and the memory program verify operation in response to detection of the memory verify command on the system bus by the command decoder, with the memory program verify operation including a transfer of data read at an address of the array to be verified to the memory controller over the system bus followed by a transfer of the verify data received on the system bus to the program register block.

80. The memory system of claim 79 wherein the memory controller is configured to initiate one of the memory program operations once the verify data for one of the groups of array addresses has been transferred to the program register block and to then commence a further program verify operation on the one group of array addresses by issuance of a further one of the memory verify commands.

* * * * *